(12) United States Patent
Bechhoefer et al.

(10) Patent No.: US 7,512,503 B2
(45) Date of Patent: Mar. 31, 2009

(54) WIRE FAULT DETECTION

(75) Inventors: Eric Robert Bechhoefer, New Haven, VT (US); Mokhtar Sadok, Williston, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 652 days.

(21) Appl. No.: 10/435,926

(22) Filed: May 12, 2003

(65) Prior Publication Data

US 2004/0230383 A1    Nov. 18, 2004

(51) Int. Cl.
*G01R 31/00*    (2006.01)
(52) U.S. Cl. ........................................................ 702/58
(58) Field of Classification Search ............. 702/57–59, 702/64–66, 69–71, 75, 106, 107, 124, 126, 702/128, 183–185, 189, 190, 193, 194, 196; 324/527, 533, 534, 642, 522, 543, 43; 703/14
See application file for complete search history.

(56) References Cited

U.S. PATENT DOCUMENTS

| | | | | |
|---|---|---|---|---|
| 5,128,619 | A | * | 7/1992 | Bjork et al. ................. 324/533 |
| 5,134,377 | A | * | 7/1992 | Reddy et al. ................ 324/533 |
| 5,321,365 | A | * | 6/1994 | Diamond et al. ............ 324/603 |
| 5,448,222 | A | * | 9/1995 | Harman ....................... 340/566 |
| 5,479,610 | A |  | 12/1995 | Roll-Mecak et al. |
| 5,600,248 | A | * | 2/1997 | Westrom et al. ............ 324/522 |
| 5,717,337 | A | * | 2/1998 | Kelly .......................... 324/534 |
| 5,870,451 | A |  | 2/1999 | Winkler et al. |
| 5,949,236 | A | * | 9/1999 | Franchville ................. 324/533 |
| 5,977,773 | A |  | 11/1999 | Medelius et al. |
| 5,983,162 | A | * | 11/1999 | Huang ........................... 702/4 |
| 6,000,616 | A | * | 12/1999 | Spitz ..................... 235/462.16 |

(Continued)

FOREIGN PATENT DOCUMENTS

WO    WO 02/068968 A2    9/2002

(Continued)

OTHER PUBLICATIONS

Oelze et al., Frequency-dependent attenuation-compensation functions for ultrasonic signals backscattered from random media, May 2002, Acoustic Society of America, pp. 2308-1319.*

(Continued)

*Primary Examiner*—Edward Raymond
*Assistant Examiner*—Mohamed Charioui
(74) *Attorney, Agent, or Firm*—Muirhead and Saturnelli, LLC

(57) ABSTRACT

Described are techniques used in a wire diagnostics system to detect events, such as defects, that may occur within a wire or cable under test. An incident voltage signal is sent out on the wire and a measured voltage signal is obtained which includes the incident voltage and the reflected voltage. Compensation processing is performed on the measured waveform to remove unwanted reflective components. Additionally, the waveform is then subject to attenuation processing and event detection processing. Detected events, such as defects, are classified and output as results. Events are classified by parametric classification using a library of known events or faults. The library of known events or faults is previously generated using empirical analysis and modeling techniques. Additionally, joint time-frequency domain reflectometry (TFDR) techniques are described for event identification and classification for a wire under test.

98 Claims, 47 Drawing Sheets

U.S. PATENT DOCUMENTS

| | | | |
|---|---|---|---|
| 6,097,755 A * | 8/2000 | Guenther et al. | 375/228 |
| 6,100,829 A * | 8/2000 | Fredrickson et al. | 341/132 |
| 6,195,614 B1 * | 2/2001 | Kochan | 702/66 |
| 6,311,130 B1 * | 10/2001 | Huang | 702/2 |
| 6,442,498 B1 | 8/2002 | Krigel | |
| 6,538,451 B1 | 3/2003 | Galli et al. | |
| 6,653,844 B2 * | 11/2003 | Wyar | 324/533 |
| 6,674,518 B1 * | 1/2004 | Asher et al. | 356/73.1 |
| 6,675,328 B1 * | 1/2004 | Krishnamachari et al. | 714/704 |
| 6,687,289 B1 * | 2/2004 | Bohley | 375/224 |
| 6,724,859 B1 * | 4/2004 | Galli | 379/1.04 |
| 6,745,137 B2 * | 6/2004 | Krishnamachari et al. | 702/57 |
| 6,798,211 B1 * | 9/2004 | Rockwell et al. | 324/527 |
| 6,950,034 B2 * | 9/2005 | Pacault et al. | 340/855.2 |
| 2001/0050629 A1 | 12/2001 | Benway et al. | |
| 2002/0038199 A1 | 3/2002 | Blemel | |
| 2002/0067171 A1 * | 6/2002 | Lanan | 324/642 |
| 2002/0067802 A1 * | 6/2002 | Smith et al. | 379/1.04 |
| 2003/0001586 A1 | 1/2003 | Warke | |
| 2004/0046570 A1 | 3/2004 | Teich | 324/541 |

FOREIGN PATENT DOCUMENTS

| | | |
|---|---|---|
| WO | WO 2004/005947 | 1/2004 |
| WO | WO 2004/005947 A1 | 1/2004 |

OTHER PUBLICATIONS

Goodrich Wire Diagnostics by Don Aiken and Eric Bechhoefer, presented on May 21, 2002.

The Interconnect Analysis Company™, IConnect®.

Advanced Signal Processing Algorithms, Architectures, and Implementations XII by Franklin T. Luk, Proceedings of SPIE, vol. 4791, Jul. 9-11, 2002, Seattle, Washington.

Yong-June Shin, et al.—Time-Frequency Domain Reflectometry for Smart Wiring Systems; Proceedings of SPIE, vol. 4791; 2002.

Phillip L. Ainsleigh—Segmented Chirp Features and Hidden Gauss-Markov Models for Classification of Wandering-Tone Signals; Proceedings of SPIE, vol. 4791; 2002.

* cited by examiner

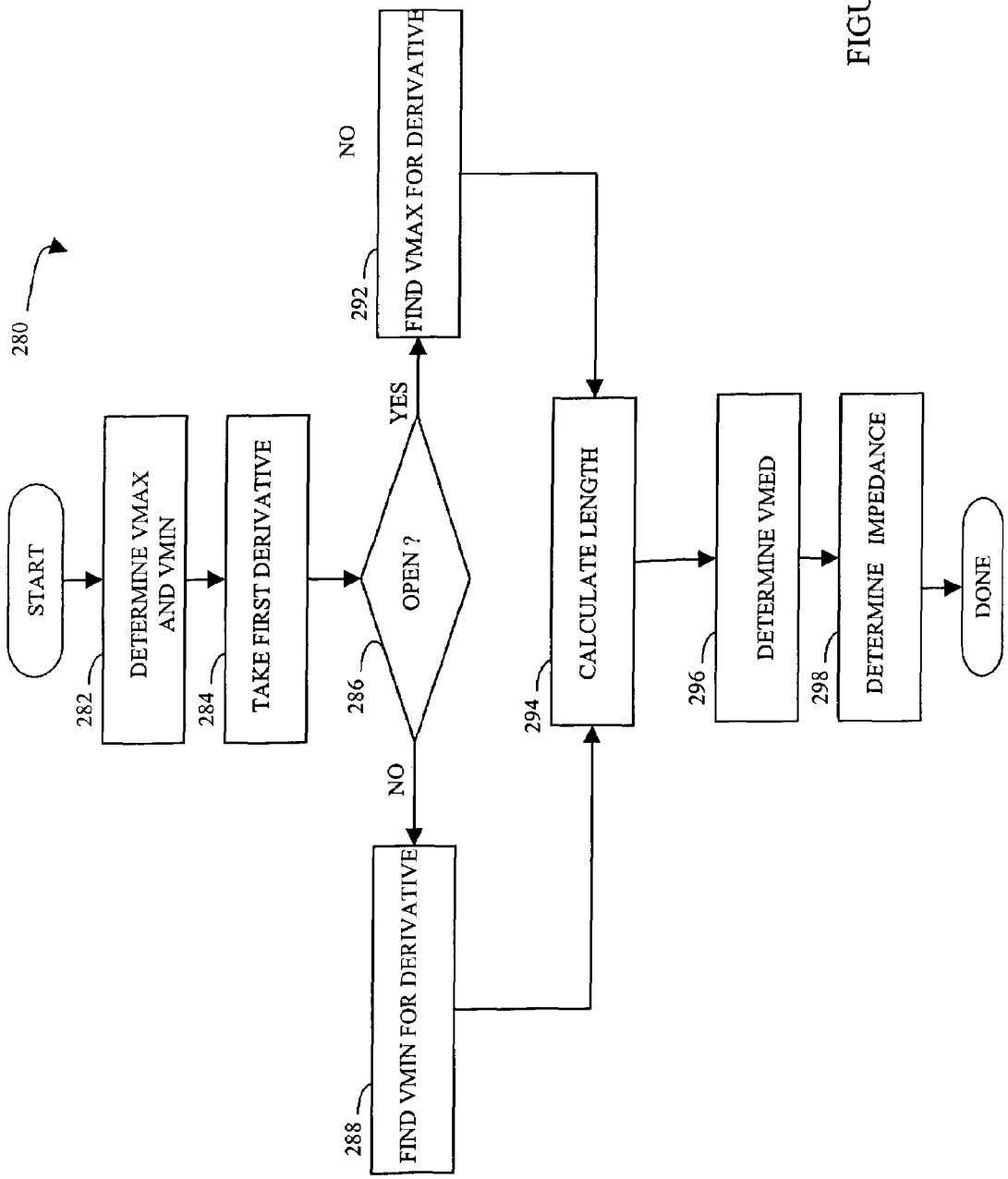

1070

5) PERPENDICULAR CUT AT END OF CUT #4 — OPEN CABLE TO CENTER CONDUCTOR LIKE A BOOK.

WIRE FAULT DETECTION

BACKGROUND OF THE INVENTION

1. Technical Field

This application relates to the field of diagnostics, and more particularly to the field of diagnostics that determine the condition of cables and wires.

2. Description of Related Art

Wiring systems may be used in a variety of industries, such as the aviation and aircraft industry. Different devices and components may be controlled, monitored and/or enabled using the wiring systems. Existing wiring systems may experience problems that are difficult to detect and diagnose.

One existing technique is detection of problems through visual inspections, for example, as in connection with general procedures and inspections of aircraft wiring systems. However, defects may go undetected and may only be detected after a system failure or after a more noticeable amount of damage has occurred.

It may be desirable for a variety of different reasons, including safety considerations, to provide an efficient and effective technique that may be used in wire diagnostics. It may be desirable that this technique provides for diagnosing and detecting faults that may not be detected using visual inspection. It may also be desirable that this technique provides for detection as early as possible and perform the diagnostics in a non-destructive manner that may be included in a routine maintenance plan.

SUMMARY OF THE INVENTION

According to the present invention, determining an event on a wire includes receiving a signal on the wire, performing compensation processing of the signal producing a compensated signal, performing event identification processing of the compensated signal to identify at least one event, and classifying the at least one event. Determining events on a wire may also include compensating the signal to remove unwanted reflective components due to inverse scattering producing a first adjusted signal, and performing attenuation compensation on the first adjusted signal. The attenuation compensation may be a function of frequency and an amount of time the signal has traveled in the wire or may be a function of frequency. Determining events on a wire may also include associating event data with at least one predetermined event prior to the classifying, where the classifying uses the event data. The at least one predetermined event may include at least one of: a connector, a cut, a nick, a crimp, damage to wire insulation due to age, damage to wire insulation due to coupling of the wire with another element. Determining events on a wire may also include determining the event data by empirical analysis. Determining events on a wire may also include determining the event data using a model. Determining events on a wire may also include storing the event data in a library. Determining events on a wire may also include determining a first derivative of the signal and identifying at least one peak of the first derivative exceeding a predetermined threshold as an event. Determining events on a wire may also include determining a plurality of polynomials, each of the polynomials locally fitted to a portion of data points defining a portion of the signal, each of the portion of data points being including a kernel point, determining a plurality of first derivatives of the first polynomials, evaluating each of the plurality of first derivatives at a corresponding kernel point producing a plurality of evaluated first derivatives, and determining the at least one event using the plurality of evaluated first derivatives. The signal may be a reflective signal and determining events on a wire may also include analyzing the reflective signal in accordance with at least one joint time-frequency domain reflectometry technique. Determining events on a wire may also include sending a signal on the wire where the signal is one of: an impulse signal and a predetermined wavelet. Determining events on a wire may also include determining at least one characteristic of the reflective signal in accordance with a predetermined wavelet, and using the at least one characteristic in the event identification and the classifying.

According further to the present invention, a device that determines an event on a wire includes a receiver that receives a signal on the wire and a processor that performs compensation processing of the signal producing a compensated signal, performs event identification processing of the compensated signal to identify at least one event, and that classifies the at least one event. The processor may compensate the signal to remove unwanted reflective components due to inverse scattering producing a first adjusted signal and performs attenuation compensation on the first adjusted signal. The attenuation compensation may be a function of frequency and an amount of time the signal has traveled in the wire or a function of frequency. The device that determines an event on a wire may also include a data storage element containing event data, where the processor associates the event data with at least one predetermined event prior to the classifying, where the classifying uses the event data. At least one predetermined event may include at least one of: a connector, a cut, a nick, a crimp, damage to wire insulation due to age, damage to wire insulation due to coupling of the wire with another element. The processor may determine the event data by empirical analysis or by using a model. The processor may determine a first derivative of the signal and may identify at least one peak of the first derivative exceeding a predetermined threshold as an event. The processor may determine a plurality of polynomials, each of the polynomials locally fitted to a portion of data points defining a portion of the signal, each of the portion of data points being including a kernel point, the processor may determine a plurality of first derivatives of the first polynomials, the processor may evaluate each of the plurality of first derivatives at a corresponding kernel point producing a plurality of evaluated first derivatives, and the processor may determine the at least one event using the plurality of evaluated first derivatives. The signal may be a reflective signal and the processor may analyze the reflective signal in accordance with at least one joint time-frequency domain reflectometry technique. The device that determines an event on a wire may also include a signal generator that generates at least one of: an impulse signal and a predetermined wavelet. The processor may determine at least one characteristic of the reflective signal in accordance with a predetermined wavelet where the at least one characteristic may be used in the event identification and the classifying.

According further to the present invention, a computer program product that determines an event on a wire, includes executable code that receives a signal on the wire, executable code that performs compensation processing of the signal producing a compensated signal, executable code that performs event identification processing of the compensated signal to identify at least one event, and executable code that classifies the at least one event. The computer program product may also include executable code that compensates the signal to remove unwanted reflective components due to inverse scattering producing a first adjusted signal and executable code that performs attenuation compensation on the first adjusted signal. The attenuation compensation may be a function of frequency and an amount of time the signal has traveled in the wire or may be a function of frequency. The computer program product may also include executable code that associates event data with at least one predetermined event prior to classifying, where classifying uses the event data. The at least one predetermined event may include at least one of: a connector, a cut, a nick, a crimp, damage to wire insulation due to age, damage to wire insulation due to coupling of the wire with another element. The computer program product may also include executable code that determines the event data by empirical analysis. The computer program product may also include executable code that determines the event data using a model. The computer program product may also include executable code stores the event data in a library. The computer program product may also include executable code that determines a first derivative of the signal and executable code that identifies at least one peak of the first derivative exceeding a predetermined threshold as an event. The computer program product may also include executable code that determines a plurality of polynomials, each of the polynomials locally fitted to a portion of data points defining a portion of the signal, each of the portion of data points being including a kernel point, executable code that determines a plurality of first derivatives of the first polynomials, executable code that evaluates each of the plurality of first derivatives at a corresponding kernel point producing a plurality of evaluated first derivatives, and executable code that determines the at least one event using the plurality of evaluated first derivatives. The signal may be a reflective signal and the computer program product may also include executable code that analyzes the reflective signal in accordance with at least one joint time-frequency domain reflectometry technique. The computer program product may also include executable code that sends a signal on the wire where the signal is one of: an impulse signal and a predetermined wavelet. The computer program product may also include executable code that determines at least one characteristic of the reflective signal in accordance with a predetermined wavelet, and executable code that uses the at least one characteristic in the event identification and the classifying.

According further to the present invention, identifying an event of interest in a cable includes receiving a voltage waveform signal, taking a first derivative of the voltage waveform signal with respect to time, calculating a standard deviation of a first derivative of system noise, establishing an event detection threshold corresponding to the standard deviation of the first derivative of system noise, and identifying a portion of the voltage waveform signal having a differential voltage peak with an absolute value that exceeds the event detection threshold. Identifying an event of interest in a cable may also include converting the portion of the voltage waveform signal to a reflection waveform pattern. The system noise may follow a Gaussian distribution. Identifying an event of interest in a cable may also include storing the portion of the voltage waveform signal. Identifying an event of interest in a cable may also include establishing a new event detection threshold. The voltage waveform signal received may be corrected for attenuation loss and/or corrected to remove inverse scattering reflections.

According further to the present invention, a device that identifies an event of interest in a cable includes a receiver that receives a voltage waveform signal and a processor that processes the voltage waveform signal, establishes an event detection threshold corresponding to a standard deviation of a first derivative of system noise, and identifies a portion of the voltage waveform signal having a differential voltage peak with an absolute value exceeding the event detection threshold. The processor may convert the portion of the voltage waveform signal into a reflection waveform pattern. The device that identifies an event of interest in a cable may also include a storage component that stores the portion of the voltage waveform signal.

According further to the present invention, a computer program product that identifies an event of interest in a cable includes executable code that receives a voltage waveform signal, executable code that takes a first derivative of the voltage waveform signal with respect to time, executable code that calculates a standard deviation of a first derivative of system noise, executable code that establishes an event detection threshold corresponding to the standard deviation of the first derivative of system noise, and executable code that identifies a portion of the voltage waveform signal having a differential voltage peak with an absolute value that exceeds the event detection threshold. The computer program product may also include executable code that converts the portion of the voltage waveform signal to a reflection waveform pattern. The system noise may follow a Gaussian distribution. The computer program product may also include executable code that stores the portion of the voltage waveform signal. The computer program product may also include executable code that establishes a new event detection threshold. The voltage waveform signal may be corrected for attenuation loss. The voltage waveform signal may be corrected to remove inverse scattering reflections.

According further to the present invention, creating a classification library for cable analysis includes generating a reflection waveform pattern of an event, processing the reflection waveform pattern to produce a classification reflection waveform pattern, and storing the classification reflection waveform pattern. The event may be selected from the group consisting of: a fault, a connector, and a termination. Generating a reflection waveform pattern may include creating a specified type of fault in a cable of a specified type, producing a voltage waveform signal in the cable, identifying a reflected voltage waveform signal portion for the specified type of fault, and converting the reflected voltage waveform signal portion into a reflection waveform pattern. Generating a reflection waveform pattern may also include simulating the event utilizing an analytical model and generating a reflection waveform pattern from the analytical model. Processing the reflection waveform pattern may includes normalizing and correcting the reflection waveform pattern to produce the classification reflection waveform pattern. Creating a classification library for cable analysis may also include providing a plurality of voltage waveform signals, calculating a mean value reflection waveform pattern from at least two normalized and corrected reflection waveform patterns, calculating a variance array that includes variance information of the least two normalized reflection waveform patterns compared with the mean value reflection waveform pattern, and storing the variance array so as to be accessible with the classification reflection waveform pattern. Creating a classification library for cable analysis may also include generating a covariance matrix using information in the variance array and storing the covariance matrix so as to be accessible with the classification reflection waveform pattern. Creating a classification library for cable analysis may also include adjusting component values of the analytical model prior to resimulating the event utilizing an analytical model and regenerating a reflection waveform pattern from the analytical model, generating a variance array corresponding to the adjustment of the component values in the analytical model, and storing the variance array so as to be accessible with the classification reflection waveform pattern.

According further to the present invention, a computer program product that creates a classification library for cable analysis includes executable code that generates a reflection waveform pattern of an event, executable code that processes the reflection waveform pattern to produce a classification reflection waveform pattern, and executable code that stores the classification reflection waveform pattern. The event may be selected from the group consisting of: a fault, a connector, and a termination. The executable code that generates a reflection waveform pattern of an event may include executable code that produces a voltage waveform signal in the cable, executable code that identifies a reflected voltage waveform signal portion for a specified type of fault, and executable code that converts the reflected voltage waveform signal portion into a reflection waveform pattern. The executable code that generates a reflection waveform pattern of an event may include executable code that simulates the event utilizing an analytical model and executable code that generates a reflection waveform pattern from the analytical model. The executable code that processes the reflection waveform pattern to produce a classification reflection waveform pattern may include executable code that normalizes and corrects the reflection waveform pattern to produce the classification reflection waveform pattern. The computer program product may also include executable code that calculates a mean value reflection waveform pattern from at least two normalized and corrected reflection waveform patterns, executable code that calculates a variance array that includes variance information of the least two normalized reflection waveform patterns compared with the mean value reflection waveform pattern, and executable code that stores the variance array so as to be accessible with the classification reflection waveform pattern. The computer program product may also include executable code that generates a covariance matrix using information in the variance array, and executable code that stores the covariance matrix so as to be accessible with the classification reflection waveform pattern. The computer program product may also include executable code that adjusts component values of the analytical model, executable code that generates a variance array corresponding to the adjustment of the component values in the analytical model, and executable code that stores the variance array so as to be accessible with the classification reflection waveform pattern.

According further to the present invention, compensating an electrical signal includes digitizing the electrical signal to provide a digitized signal, determining attenuation as a function of signal frequency, constructing a digital filter that approximates an inverse of the attenuation, and applying the digital filter to the digitized signal. Determining attenuation as a function of frequency may include using the equation: $A(f, L)=e^{-(R\ (f)*L/Z0)}$, where Z0 is the characteristic impedance of a conductor on which the electrical signal propagates, L is the length of the conductor, and R(f) is the frequency dependent resistance of the conductor. R(f) may be proportional to the square root of the frequency. R(f) may be determined using the equation: $R(f)=(1/2r)*(\mu f/\pi\sigma)^{1/2}$, where r is the radius of the conductor, $\mu$ is the permeability of free space in henries per meter, and $\sigma$ is the conductivity of material of the conductor. The value of $\sigma$ may be $5.8\times10^7$ ohms/meter. Compensating an electrical signal may also include determining length of the conductor. Determining the length of the conductor may also include taking a derivative of the digitized signal, determining if the conductor terminates in one of: an open and a short, if the conductor terminates in an open, finding the maximum value for the derivative and calculating the length based thereon, and if the conductor terminates in a short, finding a minimum value for the derivative and calculating the length based thereon. Compensating an electrical signal may also include determining a median voltage between a first one of the digitized signals and a digitized signal corresponding to the length of the conductor. Compensating an electrical signal may also include determining the impedance of the conductor based on the median voltage. The attenuation may also be a function of a length traveled by each portion of the signal and varies as a function of time. Determining attenuation as a function of frequency may include using the equation: $A(f, L)=e^{-(R\ (f)*L/Z0)}$, where Z0 is the characteristic impedance of a conductor on which the electrical signal propagates, L is proportional to a time of sampling of the digitized signal, and R(f) is the frequency dependent resistance of the conductor. Coefficients of the digital filter may vary according to the time of sampling of the digitized signal. Compensating an electrical signal may also include determining length of the conductor. Determining the length of the conductor may also include taking a derivative of the digitized signal, determining if the conductor terminates in one of: an open and a short, if the conductor terminates in an open, finding the maximum value for the derivative and calculating the length based thereon, and if the conductor terminates in a short, finding a minimum value for the derivative and calculating the length based thereon. Compensating an electrical signal may also include determining a median voltage between a first one of the digitized signals and a digitized signal corresponding to the length of the conductor. Compensating an electrical signal may also include determining the impedance of the conductor based on the median voltage. The digital filter may be an FIR filter.

According further to the present invention, a computer program product that compensates an electrical signal includes executable code that digitizes the electrical signal to provide a digitized signal, executable code that determines attenuation as a function of signal frequency, constructing a digital filter that approximates an inverse of the attenuation, and applying the digital filter to the digitized signal. Executable code that determines attenuation as a function of frequency may use the equation: $A(f, L)=e^{-(R\ (f)*L/Z0)}$, where Z0 is the characteristic impedance of a conductor on which the electrical signal propagates, L is the length of the conductor, and R(f) is the frequency dependent resistance of the conductor. R(f) may be proportional to the square root of the frequency. R(f) may be determined using the equation: $R(f)=(1/2r)*(\mu f/\pi\sigma)^{1/2}$, where r is the radius of the conductor, $\mu$ is the permeability of free space in henries per meter, and $\sigma$ is the conductivity of material of the conductor. The value of $\sigma$ may be $5.8\times10^7$ ohms/meter. The computer program product may also include executable code that determines length of the conductor. Executable code that determines the length of the conductor may also include executable code that takes a derivative of the digitized signal, executable code that determines if the conductor terminates in one of: an open and a short, executable code that finds the maximum value for the derivative and calculates the length based thereon if the conductor terminates in an open, and executable code that finds a minimum value for the derivative and calculates the length based thereon if the conductor terminates in a short. The computer program product may also include executable code that determines a median voltage between a first one of the digitized signals and a digitized signal corresponding to the length of the conductor. The computer program product may also include executable code that determines the impedance of the conductor based on the median voltage. The attenuation may also be a function of a length traveled by each portion of the signal and varies as a function of time. Executable code that determines attenuation as a function of frequency may use the equation: $A(f, L) = e^{-(R(f) \ast L/Z0)}$, where Z0 is the characteristic impedance of a conductor on which the electrical signal propagates, L is proportional to a time of sampling of the digitized signal, and R(f) is the frequency dependent resistance of the conductor. Coefficients of the digital filter may vary according to the time of sampling of the digitized signal. The computer program product may also include executable code that determines length of the conductor. Executable code that determines the length of the conductor may include executable code that takes a derivative of the digitized signal, executable code that determines if the conductor terminates in one of: an open and a short, executable code that finds the maximum value for the derivative and calculates the length based thereon if the conductor terminates in an open, and executable code that finds a minimum value for the derivative and calculates the length based thereon if the conductor terminates in a short. The computer program product may also include executable code that determines a median voltage between a first one of the digitized signals and a digitized signal corresponding to the length of the conductor. The computer program product may also include executable code that determines the impedance of the conductor based on the median voltage. The digital filter may be an FIR filter.

According further to the present invention, classifying a portion of an electrical signal propagating through a conductor, includes digitizing the electrical signal to provide a digitized signal, providing a plurality of stored digitized signals, where each stored digitized signal corresponds to a type of fault for the conductor, determining a plurality of scores by comparing the digitized signal with each of the plurality of stored signals, selecting a highest one of the scores, classifying the portion of the signal according to a type of fault corresponding to the highest one of the scores if the highest one of the scores is greater than a predetermined value, and classifying the portion of the electrical signal as noise if the highest one of the scores is not greater than the predetermined value. Classifying a portion of an electrical signal may also include converting the digitized signal to reflection coefficients. The reflection coefficients may correspond to values of the digitized signal divided by an input signal magnitude. Determining a plurality of scores may include obtaining variance values for each of the stored digitized signals, obtaining a stored digitized signal corresponding to noise, and calculating each of the scores using the digitized signal, the variance values, the stored digitized signal corresponding to noise, and each of the stored digitized signals corresponding to each type of fault. Determining a plurality of scores may include obtaining variance values for each of the stored digitized signals, obtaining covariance values for each of the stored digitized signals, obtaining a stored digitized signal corresponding to noise, and calculating each of the scores using the digitized signal, the variance values, the covariance values, the stored digitized signal corresponding to noise, and each of the stored digitized signals corresponding to each type of fault. The variance and covariance values may be provided in a matrix.

According further to the present invention, a computer program product that classifies a portion of an electrical signal propagating through a conductor, includes executable code that digitizes the electrical signal to provide a digitized signal, executable code that provides a plurality of stored digitized signals, where each stored digitized signal corresponds to a type of fault for the conductor, executable code that determines a plurality of scores by comparing the digitized signal with each of the plurality of stored signals, executable code that selects a highest one of the scores, executable code that classifies the portion of the signal according to a type of fault corresponding to the highest one of the scores if the highest one of the scores is greater than a predetermined value, and executable code that classifies the portion of the electrical signal as noise if the highest one of the scores is not greater than the predetermined value. The computer program may also include executable code that converts the digitized signal to reflection coefficients. The reflection coefficients may correspond to values of the digitized signal divided by an input signal magnitude. Executable code that determines a plurality of scores may include executable code that obtains variance values for each of the stored digitized signals, executable code that obtains a stored digitized signal corresponding to noise, and executable code that calculates each of the scores using the digitized signal, the variance values, the stored digitized signal corresponding to noise, and each of the stored digitized signals corresponding to each type of fault. Executable code that determines a plurality of scores may include executable code that obtains variance values for each of the stored digitized signals, executable code that obtains covariance values for each of the stored digitized signals, executable code that obtains a stored digitized signal corresponding to noise, and executable code that calculates each of the scores using the digitized signal, the variance values, the covariance values, the stored digitized signal corresponding to noise, and each of the stored digitized signals corresponding to each type of fault. The variance and covariance values may be provided in a matrix.

According further to the present invention, detecting an event on a wire includes determining a plurality of polynomials, each of the polynomials fitting a portion of data points representing a received waveform, determining a first derivative for each of the plurality of polynomials, evaluating the first derivative of each of the plurality of polynomials at data points representing the received waveform, and detecting an event using the first derivative of each of the plurality of polynomials. Detecting an event on a wire may also include compensating the received waveform prior to the determining a plurality of polynomials. The event may be one of: a connector, a cut, a nick, a crimp, damage to wire insulation due to age, damage to wire insulation due to coupling of the wire with another element. Detecting an event on a wire may also include storing data of the waveform in accordance with the event detected. Detecting an event on a wire may also include classifying the event. The portion of data points may have N+M+1 data points, N representing a number of data points prior to a first one of the data points included in the portion, M representing a number of data points prior to the first one of the data points included in the portion, and detecting an event on a wire may also include determining a first of the plurality of polynomials in accordance with the N+M+1 data points. Detecting an event on a wire may also include determining a first derivative of the first polynomial and evaluating the first derivative at the first one of the data points included in the portion. Detecting an event on a wire may also include determining an event detection threshold. Detecting an event on a wire may also include determining at least one peak using the first derivatives that exceeds the event detection threshold, storing data corresponding to the at least one peak, and classifying the data as one of a plurality of events.

According further to the present invention, a computer program product for detecting an event on a wire includes executable code that determines a plurality of polynomials, each of the polynomials fitting a portion of data points representing a received waveform, executable code that determines a first derivative for each of the plurality of polynomials, executable code that evaluates the first derivative of each of the plurality of polynomials at data points representing the received waveform, and executable code that detects an event using the first derivative of each of the plurality of polynomials. The computer program product may also include executable code that compensates the received waveform prior to the determining a plurality of polynomials. The event may be one of: a connector, a cut, a nick, a crimp, damage to wire insulation due to age, damage to wire insulation due to coupling of the wire with another element. The computer program product may also include executable code that stores data of the waveform in accordance with the event detected. The computer program product may also include executable code that classifies the event. The portion of data points may have N+M+1 data points, N representing a number of data points prior to a first one of the data points included in the portion, M representing a number of data points prior to the first one of the data points included in the portion, and the computer program product further including executable code that determines a first of the plurality of polynomials in accordance with the N+M+1 data points. The computer program product may also include executable code that determines a first derivative of the first polynomial and executable code that evaluates the first derivative at the first one of the data points included in the portion. The computer program product may also include executable code that determines an event detection threshold. The computer program product may also include executable code that determines at least one peak using the first derivatives evaluated that exceed the event detection threshold, executable code that stores data corresponding to the at least one peak, and executable code that classifies the data as one of a plurality of events.

According further to the present invention, processing a signal received on a wire includes receiving the signal, compensating the signal to remove unwanted reflections caused by a defect in the wire producing a compensated signal, and analyzing the compensated signal to determine information about the defect. Processing a signal received on a wire may also include receiving a plurality of reflective voltages and a plurality of incident voltages, where at a measured voltage at a time is equal to a sum of a reflective voltage and an incident voltage at a the time and adjusting each of the plurality of reflective voltages and the plurality of incident voltages determined at a point to remove unwanted reflections from the point to the end of the wire. There may be N incident voltages and N corresponding reflective voltages, and processing a signal received on a wire may also include initializing a first row of an N×N matrix, D, with the N incident voltages, initializing a first row of an N×N matrix, U, with the N reflective voltages, determining reflection coefficients corresponding to the N incident and N reflective voltages, determining transmission coefficients corresponding to the reflection coefficients, for each element of row ii of matrix D, ii=2 to N, determining $D(ii,jj)=(D(i,j)-r(ii)*U(i, jj))/s(ii)$, where i=1 to N-1, j=i to N-1, jj=j+1, s(ii) is a transmission coefficient at time ii, r(ii) is a reflection coefficient at a time ii, and for each element of row ii of matrix U, determining $U(ii,jj)=(-r(ii)*D(i,j)+U(i,jj))/s(ii)$, where diagonals of matrix D, D[t,t], t=1 to N, are N adjusted incident voltages at each time t, Vinc,adj(t). Processing a signal received on a wire may also include determining adjusted reflective voltages at each time t, Vrefl,adj(t), as: $Vrefl,adj(t)=(Z(t+1)-Z_0)/(Z_0+Z(t+1))*Vinc,adj(t)+Vinc,adj(t)$, where $Z_0$ is a characteristic impedance of the wire, $Z(t+1)=Z(t)*(1+r(t))/(1-r(t))$. Processing a signal received on a wire may also include performing error correction by assigning each of the reflection coefficients to zero if the each reflection coefficient is less than a predetermined threshold. The predetermined threshold may be a value equal to a product of three times a standard deviation of a noise level.

According further to the present invention, a computer program product that processes a signal received on a wire includes executable code that receives the signal, executable code that compensates the signal to remove unwanted reflections caused by a defect in the wire producing a compensated signal, and executable code that analyzes the compensated signal to determine information about the defect. The computer program product may also include executable code that receives a plurality of reflective voltages and a plurality of incident voltages, where at a measured voltage at a time is equal to a sum of a reflective voltage and an incident voltage at a the time and executable code that adjusts each of the plurality of reflective voltages and the plurality of incident voltages determined at a point to remove unwanted reflections from the point to the end of the wire. There may be N incident voltages and N corresponding reflective voltages, and the computer program product may further executable code that initializes a first row of an N×N matrix, D, with the N incident voltages, executable code that initializes a first row of an N×N matrix, U, with the N reflective voltages, executable code that determines reflection coefficients corresponding to the N incident and N reflective voltages, executable code that determines transmission coefficients corresponding to the reflection coefficients, executable code that, for each element of row ii of matrix D, ii=2 to N, determines $D(ii,jj)=(D(i,j)-r(ii)*U(i, jj))/s(ii)$, where i=1 to N-1,j=i to N-1, jj=j+1, s(ii) is a transmission coefficient at time ii, r(ii) is a reflection coefficient at a time ii; and executable code that, for each element of row ii of matrix U, determines $U(ii,jj)=(-r(ii)*D(i,j)+U(i,jj))/s(ii)$, where diagonals of matrix D, D[t,t], t=1 to N, are N adjusted incident voltages at each time t, Vinc,adj(t). The computer program product may also include executable code that determines adjusted reflective voltages at each time t, Vrefl,adj(t), as: $Vrefl,adj(t)=(Z(t+1)-Z_0)/(Z_0+Z(t+1))*Vinc,adj(t)+Vinc,adj(t)$, where $Z_0$ is a characteristic impedance of the wire, $Z(t+1)=Z(t)*(1+r(t))/(1-r(t))$. The computer program product may also include executable code that performs error correction by assigning each of the reflection coefficients to zero if the each reflection coefficient is less than a predetermined threshold. The predetermined threshold may be a value equal to a product of three times a standard deviation of a noise level.

According further to the present invention, detecting events on a wire includes determining at least one set of reference data indicating a wire event, sending an impulse signal on the wire, obtaining a reflective return signal corresponding to the impulse signal, and analyzing the reflective signal in accordance with at least one joint time-frequency domain reflectometry technique. The impulse signal may be generated in accordance with a predetermined wavelet. Detecting events on a wire may also include determining at least one characteristic of the reflective signal in accordance with a predetermined wavelet. Detecting events on a wire may also include performing wavelet analysis using a continuous wavelet transform. Detecting events on a wire may also include determining $\rho$ as a feature of the reflective signal where $\rho$ is a differential wavelet energy ratio $\rho$ proportional to the deviation of a signature energy with respect to a baseline of a the wire in a healthy condition for a given time-frequency span. Increasing values of $\rho$, may be associated with increas ing severity of wire events detected. The value of ρ may be represented as:

$$\rho = \sqrt{\frac{\sum_{k=1}^{N}\sum_{s=1}^{S}|C_{sk} - C_{sk}^{Baseline}|^2}{\sum_{k=1}^{N}\sum_{s=1}^{S}|C_{sk}^{Baseline}|^2}}$$

in which $C_{sk}$ represents continuous wavelet coefficients of a signal under test collected over a time-span of N samples and a time-scale span of S scales, where the scales are parameters used in performing the wavelet analysis and $C_{sk}^{Baseline}$ represents a set of wavelet coefficients of a baseline signal associated with a healthy signature. Detecting events on a wire may also include determining δ as a feature of the reflective signal, where δ is a local wavelet energy ratio of a signature of interest with respect to a baseline of a healthy signature, the local nature of the signatures relating to a partial derivative of signal energy with respect to a time-scale corresponding to an inverse frequency of the signal energy. The value of δ may be represented as:

$$\delta = \sqrt{\frac{\sum_{k=1}^{N}\sum_{s=1}^{S}\left|\frac{\partial C_{sk}}{\partial s} - \frac{\partial C_{sk}^{Baseline}}{\partial s}\right|^2}{\sum_{k=1}^{N}\sum_{s=1}^{S}\left|\frac{\partial C_{sk}^{Baseline}}{\partial s}\right|^2}}$$

in which ∂ represents a partial derivative. Detecting events on a wire may also include decomposing the reflective signal. The reflective signal may be decomposed into at least one intrinsic mode function. Detecting events on a wire may also include applying a Hilbert transform to each of the at least one intrinsic mode function.

According further to the present invention, detecting events on a wire includes determining at least one set of reference data indicating a wire event, sending an impulse signal on the wire, obtaining a reflective return signal corresponding to the impulse signal, and analyzing the reflective signal producing at least one joint time-frequency parameter. Detecting events on a wire may also include determining an occurrence of a wire event by comparing values of the at least one joint time-frequency parameter of the wire to known parameter values associated with the wire event. Detecting events on a wire may also include performing at least one of: a wavelet analysis and a Hilbert-Huang transform when analyzing the reflective signal.

According further to the present invention, a computer program product for detecting events on a wire includes executable code that determines at least one set of reference data indicating a wire event, executable code that sends an impulse signal on the wire, executable code that obtains a reflective return signal corresponding to the impulse signal, and executable code that analyzes the reflective signal in accordance with at least one joint time-frequency domain reflectometry technique. The impulse signal may be generated in accordance with a predetermined wavelet. The computer program product may include executable code that determines at least one characteristic of the reflective signal in accordance with a predetermined wavelet. The computer program product may include executable code that performs wavelet analysis using a continuous wavelet transform. The computer program product may include executable code that determines ρ as a feature of the reflective signal where ρ is a differential wavelet energy ratio ρ proportional to the deviation of a signature energy with respect to a baseline of a the wire in a healthy condition for a given time-frequency span. Increasing values of ρ, may be associated with increasing severity of wire events detected. The value of ρ may be represented as:

$$\rho = \sqrt{\frac{\sum_{k=1}^{N}\sum_{s=1}^{S}|C_{sk} - C_{sk}^{Baseline}|^2}{\sum_{k=1}^{N}\sum_{s=1}^{S}|C_{sk}^{Baseline}|^2}}$$

in which $C_{sk}$ represents continuous wavelet coefficients of a signal under test collected over a time-span of N samples and a time-scale span of S scales, where the scales are parameters used in performing the wavelet analysis and $C_{sk}^{Baseline}$ represents a set of wavelet coefficients of a baseline signal associated with a healthy signature. The computer program product may include executable code that determines δ as a feature of the reflective signal, where δ is a local wavelet energy ratio of a signature of interest with respect to a baseline of a healthy signature, the local nature of the signatures relating to a partial derivative of signal energy with respect to a time-scale corresponding to an inverse frequency of the signal energy. The value of δ may be represented as:

$$\delta = \sqrt{\frac{\sum_{k=1}^{N}\sum_{s=1}^{S}\left|\frac{\partial C_{sk}}{\partial s} - \frac{\partial C_{sk}^{Baseline}}{\partial s}\right|^2}{\sum_{k=1}^{N}\sum_{s=1}^{S}\left|\frac{\partial C_{sk}^{Baseline}}{\partial s}\right|^2}}$$

in which ∂ represents a partial derivative. The computer program product may include machine executable code that decomposes the reflective signal. The reflective signal may be decomposed into at least one intrinsic mode function. The computer program product may include machine executable code that applies a Hilbert transform to each of the at least one intrinsic mode function.

According further to the present invention, a computer program product for detecting events on a wire includes executable code that determines at least one set of reference data indicating a wire event, executable code that sends an impulse signal on the wire, executable code that obtains a reflective return signal corresponding to the impulse signal, and executable code that analyzes the reflective signal producing at least one joint time-frequency parameter. The computer program product may include executable code that determines an occurrence of a wire event by comparing values of the at least one joint time-frequency parameter of the wire to known parameter values associated with the wire event. The computer program product may include machine executable code that performs at least one of: a wavelet analysis and a Hilbert-Huang transform when analyzing the reflective signal.

BRIEF DESCRIPTION OF DRAWINGS

Features and advantages of the present invention will become more apparent from the following detailed description of exemplary embodiments thereof taken in conjunction with the accompanying drawings in which:

FIG. 8 is a flowchart showing steps for determining the length and characteristic impedance of a cable.

DETAILED DESCRIPTION OF VARIOUS EMBODIMENTS

Figure 1:
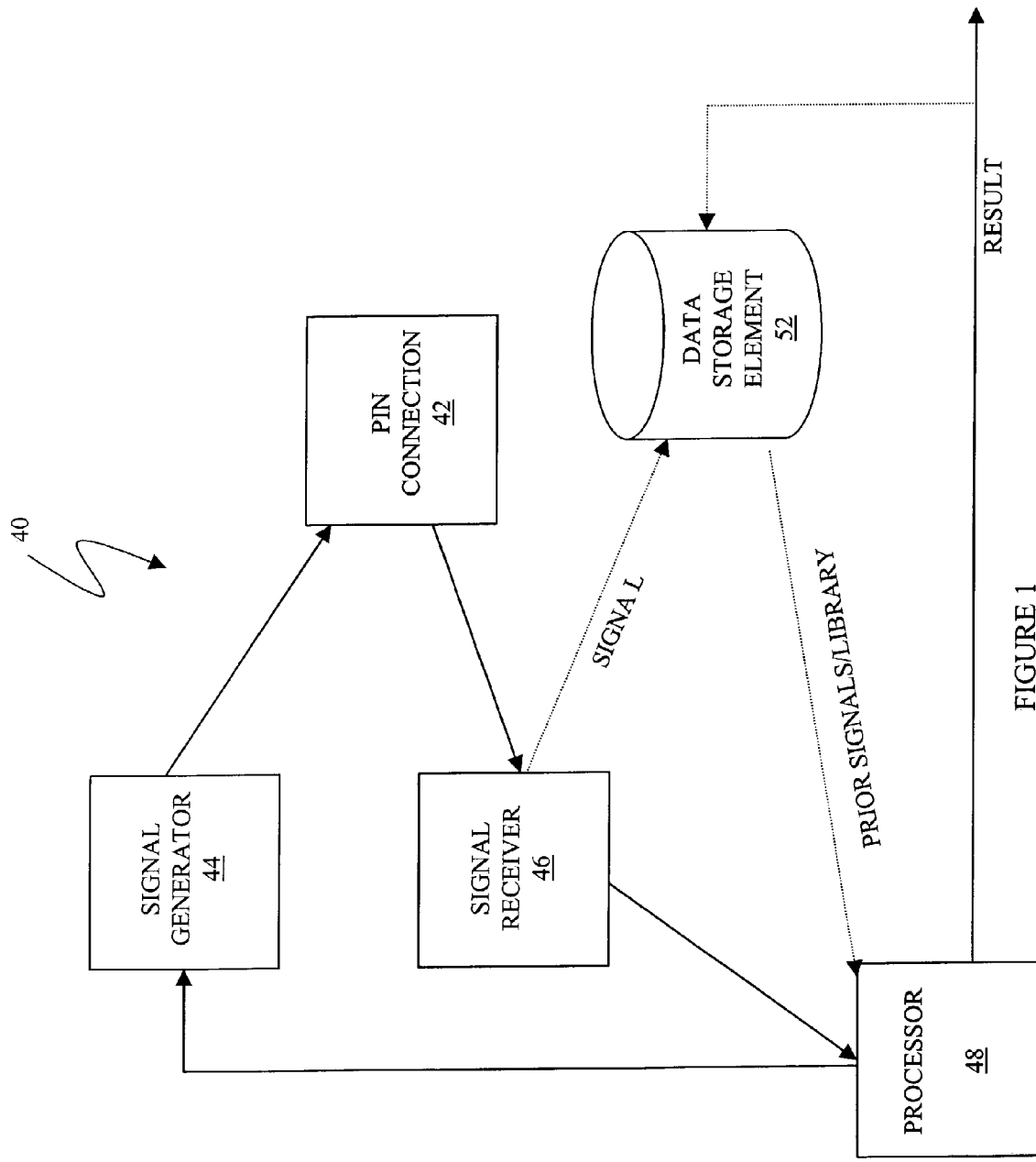
FIG. 1 is an example of an embodiment of a system according to the present invention.

Referring to FIG. 1, shown is a system 40 that performs wire diagnostics. The system 40 includes a pin connection 42 that couples to one or more pins of a wire that may be part of a wiring harness. The pin connection 42 may connect to a single pin or may connect to multiple pins. In some instances (described elsewhere herein), a signal is generated and provided on a first pin and signal is received on a second, different pin. In other embodiments, a signal is generated on a pin and a signal is measured on the same pin. The sent and received signals are provided through the pin connection 42.

A signal generator 44 is coupled to the pin connection 42 and provides a signal thereto. In some embodiments, the signal generator 44 may provide a square pulse or step function pulse. In other embodiments, the signal generator 44 may provide a swept frequency signal or may provide a sine wave at a particular frequency or at a particular set of frequencies. Much, if not all, of the analysis described herein can be extended to be applicable to any type of excitation signal beside a square or step pulse.

Signals sensed at the pin connection 44 are provided to a signal receiver 46. The signal receiver 46 may digitize the signal and/or may otherwise condition the received signal to facilitate further on processing.

The output of the signal receiver 46 is provided to a processor 48 which may be any commercially available processor suitable for providing the functionality described herein including, without limitation, any one of a variety of handheld, notebook, or desktop computers. The processor 48 may also provide an input to the signal generator 44. In some embodiments, the processor 48 may trigger the single generator 44. In other embodiments, the processor 48 may indicate to the signal generator 44 one of a plurality of signals to be generated. Alternatively still, the processor 48 may provide a digital signal to be generated and the signal generator 44 may convert the digital signal to an analog signal prior to providing the signal to the pin connection 42.

A data storage element 52 may contain data that is used by the processor 48 for processing the signals. Data stored in the data storage element 52 may include prior signals (i.e., signals from previous iterations) as well as a library of particular signals that are used to analyze the signals received by the signal receiver 46, as described elsewhere herein. In some embodiments, the signal receiver 46 may store the current signal in the data storage data element 52 so that the storage data element 52 contains the current signal as well as signals from previous iterations that may be provided to the processor 48.

As described herein, the processor 48 processes the received signal, possibly the prior signals, and possibly the library of signals (and possibly other data) to identify events and output results in accordance with the detected event. As described elsewhere herein, an event may be a connector, or some type of fault. There can be different types of faults such as hard faults and soft faults. Hard faults include, for example, shorts and incorrect types of terminations within the wire. Soft faults include, for example, opens, inductive faults and capacitive faults. A soft fault may not require maintenance. However, maintenance may be required if and when a soft fault changes in one or more different aspects. For example, a soft fault may progress over time and become more serious or may move. The data storage element 52, as also described herein in more detail, may include information used in detecting the occurrence of the event and how it may also change over time. The foregoing allows for an embodiment to use a condition-based approach in which not only can events be detected, but changes in events over time may be examined. Such changes may be useful, for example, in scheduling maintenance.

Results may indicate, for example, if a wire being tested has a fault and the type/location of the fault. The possible options for the result are described elsewhere herein. Note that the result may be provided to a user display to display the result to the user and/or may be provided to storage that is accessed later and/or may be provided to some other type of indicator (such as an LED) that indicates, for example, that a wire fault has been detected.

The functionality of the system 40 may be provided using any one of a variety of commercially-available measurement/generation systems alone or in combination with components provided by a user. For example, high performance oscilloscopes marketed by Tektronix, Agilent Technologies, and Hewlett Packard might be suitable when used in combination with high frequency step generators used for the signal generator 44 in connection with embodiments where. the signal generator 44 provides a step or pulse wave form. For example, the Tektronix TDS 8000 sampling oscilloscope might be used to provide at least part of the functionality of the system 40. Other companies such a Raser Bond Instrument, Bicotest Limited, and Eclipse Industries provide portable test units for testing wires and cables. The signal generator 44 may be provided using a step recovery diode (SRD) that is commercially provided by the Hewlett Packard Company. Other SRD's include a Metelics MMD 830-E28X Step Recovery Diodes. The SRD's may be used with MHS-40,02-G2sX hybrid shotkey high conductance diodes. These components may be used to construct the signal generator 44 to provide a very fast rise time pulse signal.

A Compaq PocketPC 400 MHz Processor with 64 MBytes of RAM may be used for the processor 48. The PocketPC may be used in connection with a CM Technologies Company PCMCIA TDR Card for sending/receiving signals. The algorithms used by the processor 48 (described elsewhere herein) may be implemented with Matlab and/or with C++ using the Microsoft Visual C++ library with target platform being the Microsoft Windows CE operating system. In one embodiment, machine executable code, as may be produced using compilers, linkers, and other tools, may be executed by the processor 48. The machine executable code may be stored on the data storage element 52, such as a disk, in read-only-memory, and/or other component of the system 40. It should be noted that other embodiments may utilize different hardware and/or software to implement the techniques described herein and the particulars described herein should not be construed as a limitation.

The system described herein may utilize Time Domain Reflectometry (TDR). TDR may generally be described as the analysis of a conductor, such as a wire, cable or fiber optic line, that is performed by sending a pulsed signal into the conductor and then subsequently examining the reflected pulse or signal. Wiring and insulation anomalies cause different capacitance and inductance to occur in the wire than the nominal wires which further causes a change in the local characteristic impedance. The change in the characteristic impedance will scatter in the pulsed signal reflecting some part of the signal energy. By measuring the time delay, the precise location of the anomaly may be determined while the polarity of the anomaly may be used to determine the particular type of fault within the conductor. TDR measures voltage vs. time.

The system described herein may also utilize Frequency Domain Reflectometry (FDR). FDR may generally be characterized as another technique for wire analysis that comprises splitting an input signal to a cable under test and to a mixer and subsequently sending a reflected input signal back to the mixer to generate a mixed signal in which the high frequency components are removed. The remaining DC components contain information regarding the impedance and length of the cable under test. This operation may be performed a number of times at varying frequencies, for example, and the digitized signal may be used to determine the impedance and length of the cable under test. As described herein, FDR may be used as an alternative technique to TDR. FDR measures real and imaginary parts of a signal vs. frequency.

Impedance may be defined as a relationship of voltage to current and may be represented as V=ZI where Z is called the impedance of the element. Wires and cables have characteristic impedances relating to the wire's capacitance per unit length, inductance per unit length and the velocity of signal propagation within the wire. When a defect occurs within a wire, for example, the particular wire having the anomaly has a different capacitance and inductance than a normal wire which causes a change in the local characteristic impedance. It has been shown that when there is a mismatch in characteristic impedance of a particular wire, some small amount of energy is reflected from the discontinuity. Where there are a number of these mismatches in the characteristic impedance close to each other on the transmission pass, their reflections may interact and generate a number of reflective artifacts.

Referring back to FIG. 1, these various reflections may distort a measured wave form received by the pin connection 42 which is then sent to the signal receiver 46 making analysis of the true impedance of the transmission path difficult. This particular problem will be referred to herein as the inverse scattering problem. The process of determining the true transmission line impedance from a measured wave form, such as in the form of a received signal, may be accomplished by adjusting or compensating a received signal value to account for this inverse scattering and other noise or interferences. It should be noted that while the inverse scattering phenomena as described herein has been solved and applied in other fields, such as seismology, as described herein, the inverse scattering problem is integrated into a wire diagnostic tool for use with techniques described herein.

As applied to the wire diagnostics problem, multiple reflections may occur due to one or more faults within a wire. What will be described herein is a technique that may be used to compensate for these additional inverse scattering reflections. By removing this component from the received signals of a measured wave form, the measured wave form may be adjusted and analyzed to a greater degree of accuracy in connection with determining a particular type and location of a fault within a wire.

Figure 2:
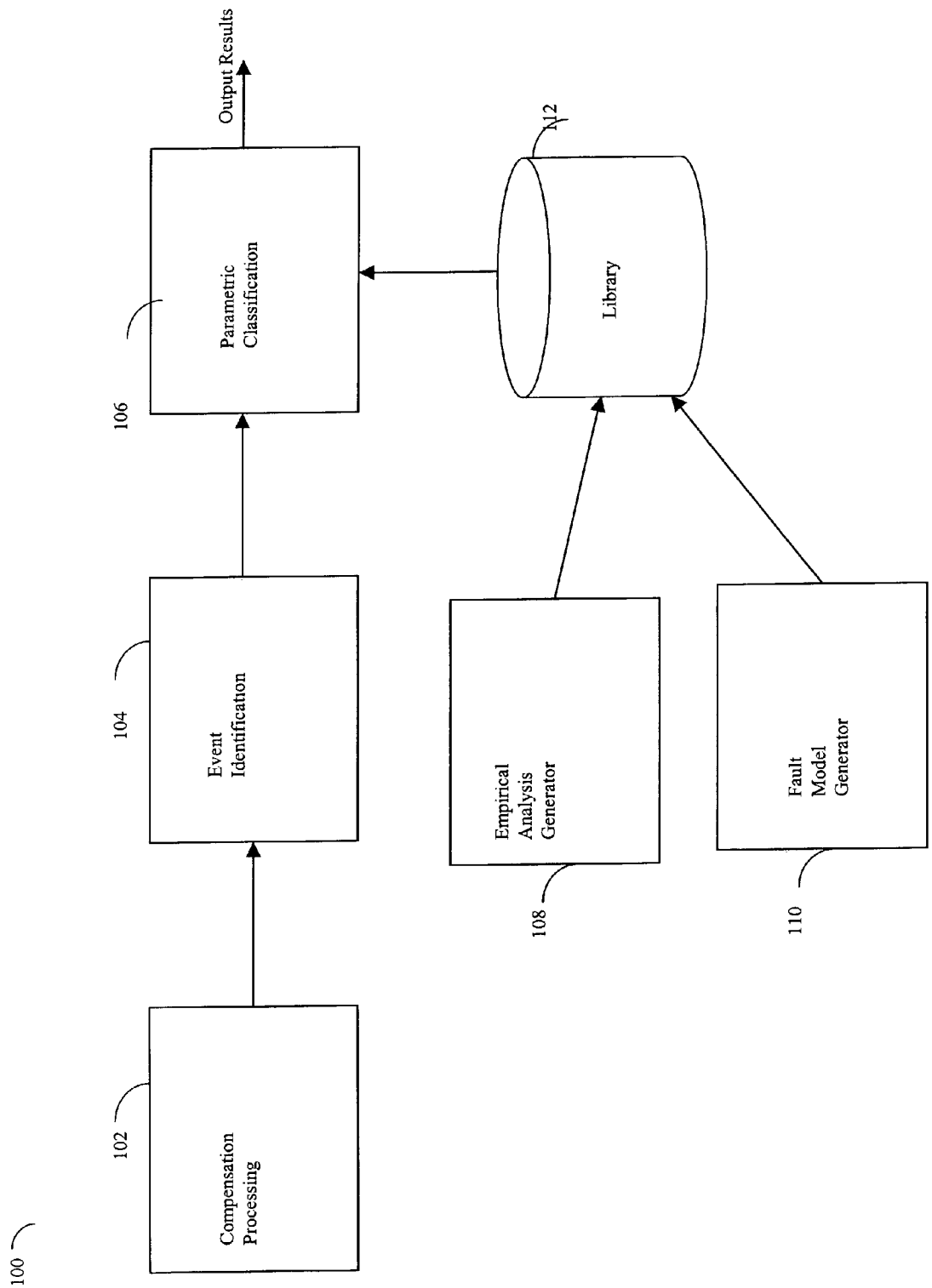
FIG. 2 is an example of a dataflow diagram of the various processing components that may be used in the system of FIG. 1.

Referring now to FIG. 2, shown is an example 100 of a dataflow diagram of the various processing components that may be included within the system 40 previously described in connection with FIG. 1. The example 100 includes a compensation processing component 102, an event identification component 104, a parametric classification component 106, an empirical analysis generator component 108, and a fault model generator component 110. Additionally, included is a library 112, which may be stored, for example, in the data storage element 52, previously described in connection with the system 40 of FIG. 1.

In one embodiment, each of the components 102, 104, 106, 108 and 110 may be implemented, for example, utilizing software as described elsewhere here in more detail to produce machine executable instructions executed by the processor 48. The machine executable instructions may perform the various processing steps as described elsewhere herein in more detail for each of the components included in the example 100 of FIG. 2.

The compensation processing component 102 includes processing steps to compensate or remove unwanted interference from the received signal, such as a received reflective signal. Compensation may include, for example, adjusting a received signal to take into account multiple reflections as encountered with the inverse scattering problem. Compensation processing may also include attenuation compensation, described elsewhere herein in more detail, and other types of compensation. Once the signal has been compensated, the compensated signal is used as input to event identification component processing 104. Event identification component processing detects points or events of interest. In connection with wire diagnostics system, for example, an event may be any change in characteristic impedance such as, for example, a connector, a cut, a nick, a crimp, damage to wire insulation due to age or coupling with other structures or wires, and the like.

Once an event has been detected by event identification component processing 104, the event or point of interest is then input to a classification component, such as the parametric classification component 106. The parametric classification component 106 may use library 112 that includes a set of potential events, such as connectors, terminations, faults such as inductive faults and capacitive faults, and the like. The parametric classification component 106 examines various parameters of an input and compares those parameters to values associated with known events as may be stored, for example, in the library 112. Through this comparison, the event may be identified as indicated in output results from the parametric classification component 106.

In one embodiment, the library 112 may include sets of potential events such as different types of faults. An inductive fault, for example, may relate to damage of wire insulation due to cuts, nicks, and breaks. They may be generally characterized as inductive faults because local wire inductance may be larger than the nominal wire resulting in the increase in characteristic impedance. Capacitive faults, for example, may relate to damage characteristics of crimps or bends within a wire where the insulation is thinned and local capacitance increases. This may cause a drop in the wire characteristic impedance. An event type of a termination may be classified as one of the four basic categories: open, short, inductive short, and capacitive short. An open termination may reflect a switch or a cut within the wire. A short may reflect a termination to ground and may be immediately characterized as a fault. Inductive shorts and capacitive shorts may reflect various hardware terminations such as a fuel probe and may be used for fault classification. In other words, inductive shorts and capacitive shorts may or may not indicate a problem. For example, for a wire supplying a fuel probe, any termination other than a capacitive short may indicate a fault.

It should be noted that other types of events may be included and characterized in accordance with different known parameter values within the library 112. The library 112 may include data that has been stored prior to using the system 40 of FIG. 1 to perform wire diagnostic troubleshooting. At some time prior to executing, for example, processing steps associated with components 102, 104 and 106, the library 112 may be constructed using any one or more of a variety of techniques. As described herein in more detail, embodiment may use an empirical analysis generator component 108 and a fault model generator component 110 in order to produce library 112 that includes sets of potential events. Components 108 and 110 may be executed to populate the library 112 prior to executing the processing steps of components 102, 104 and 106.

The empirical analysis generator component 108 may use actual data obtained by measuring values in accordance with different types of fault conditions or events. This data may be recorded and stored within the library 112. As an alternative for additional techniques for populating the library 112, the fault model generator component 110 may also be utilized. The fault model generator component 110 utilizes modeling techniques in order to model or simulate conditions to generate data for populating the library 112 in accordance with different types of events, such as the foregoing wire events.

It should be noted that an embodiment may utilize other techniques in connection with populating the library 112 with particular data associated with the events to be determined by the parametric classification or other type of classification system included in an embodiment.

Figure 3:
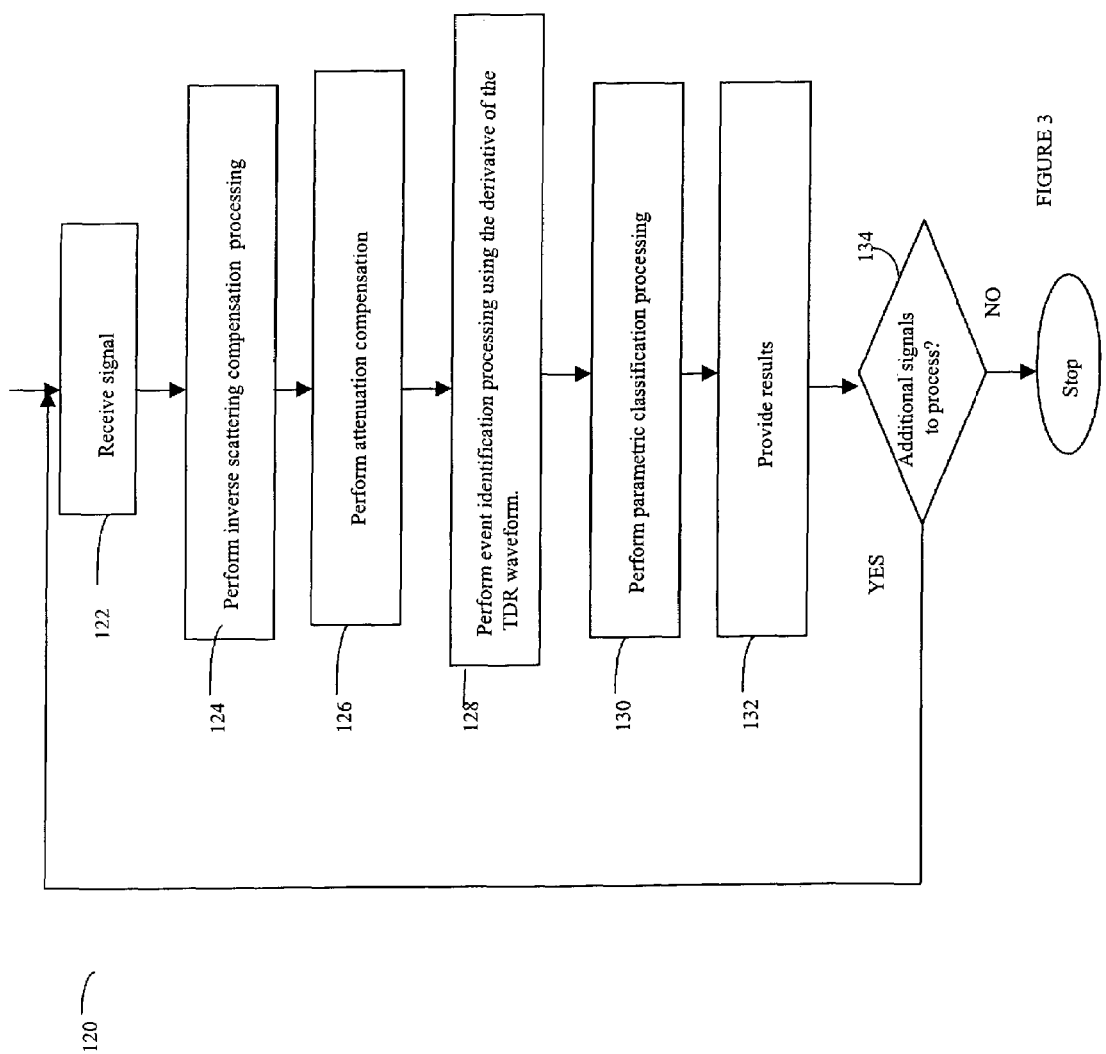
FIG. 3 is a flowchart of steps of an embodiment for processing received signals within the system of FIG. 1.

Referring now to FIG. 3, shown is a flowchart 120 of steps of an embodiment for processing received signals within the system 40 of FIG. 1. At step 122, a signal is received. At step 124, a first type of signal compensation processing is performed. As described elsewhere herein in more detail, this is described as the inverse scattering compensation processing. Control proceeds to step 126 where a second type of compensation processing is performed in connection with attenuation compensation. Processing steps 124 and 126 may be included within compensation processing module 102 in an embodiment. Control proceeds to step 128 where event identification processing may be performed. In one technique that is described in paragraphs elsewhere herein, event identification processing is performed by utilizing the derivative of the TDR wave form. At step 130, classification processing is performed which in this embodiment is parametric classification processing. An embodiment may utilize this or one or more other types of classification processing techniques to produces results in accordance with the identified events. At step 132, the results are provided as an output of the classification processing, for example, to a user. The particular result output may vary in each embodiment. Different types of results are described elsewhere herein in more detail. Control proceeds to step 134 where a determination is made as to whether additional signals are to be processed. If there are no additional signals, processing stops. Otherwise, control proceeds to the top of the loop at step 122 where the next subsequent signal is received and processed.

It should be noted that in connection with the foregoing processing steps of flowchart 120, an embodiment may optionally omit one or more of the foregoing steps. Additionally, an embodiment may use one or more alternative techniques in place of, or in conjunction with, those techniques described herein. For example, an embodiment may use an alternative technique to perform event identification processing such as matched filters, wavelets, neural networks or a pattern recognition technique different than as described elsewhere herein.

The inverse scattering problem, as may be applied for use with the system described herein for wire diagnostics, involves a one-dimensional system of layered media in which current and voltage are the two state variables that may be represented by two coupled first-order partial differential equations referred to herein as the Upward and Downward Evolution equation (the Evolution equation) and the Discontinuity equation described in more detail elsewhere herein.

The Evolution equation is based on downward and upward moving waves in which the upward moving wave (U) represents the reflected voltage (Vrefl), and the downward moving wave (D) represents the incident voltage (Vinc) of the signal sent out, such as by the signal generator 44. The measured voltage (Vmeas), such as at the pin connection 42 for a wire, may be represented as:

$$V\text{meas} = V\text{inc} + V\text{refl} \qquad \text{EQUATION 1}$$

When the impedance Z is constant, the D and U waves do not interact and do not change shape. When Z changes, D and U interact causing multiple reflections, such as in the presence of wire faults. D and U are disturbed or change their shape where they cross a discontinuity as may be represented by the Discontinuity Equation. This interaction between D and U complicates transmission and reflection and it is this interaction that is de-convolved in the inverse scattering problem.

The D and U waves travel without change of shape when the characteristic impedance does not change and such behavior may be represented in the following Evolution equation of matrices:

$$\begin{bmatrix} D(id-,t) \\ U(id-,t) \end{bmatrix} = \begin{bmatrix} d & 0 \\ 0 & d^{-1} \end{bmatrix} \begin{bmatrix} D[(i-1)d+,t] \\ U[(i-1)d+,t] \end{bmatrix} \quad \text{EVOLUTION EQUATION}$$

The D wave is just before a discontinuity at id (the ith delay operator) at any given time t and departed from (i−1)d at the instant t−d. The wave has traveled without any change in shape such that $$D(id-,t) = D[(i-1)d+,t-d] \qquad \text{EQUATION 2}$$

The value of the right hand side of the above equations, $D[(i-1)d+,t-d]$, at the instant prior to t−d is obtained from $D[(i-1)d+,t]$ by executing the delay operator d which changes any function of time f(t) into its value at the instant t−d such that $df(t)=f(t-d)$. EQUATION 2 above may be rewritten as:

$$D(id-,t) = dD[(i-1)d+,t)] \qquad \text{EQUATION 3}$$

Similarly, the equation for the U wave may be represented as:

$$U[(i-1)d+,t] = U(id-,t-d) = dU(id-,t)$$

which can be inverted to give $$U(id-,t) = d^{-1}U[(i-1)d+,t)] \qquad \text{EQUATION 4}$$

The foregoing EQUATION 3 and EQUATION 4 may be combined to produce the Evolution Equation set forth above.

The following equation describes how the U and D waves interact as they pass through a discontinuity between Zi and $Z_{i-1}$.

$$\begin{bmatrix} D(id+,t) \\ U(id+,t) \end{bmatrix} = H_i H_{i-1}^{-1} \begin{bmatrix} w(id-,t) \\ p(id-,t) \end{bmatrix} \quad \text{DISCONTINUITY EQUATION}$$

where H is the evolution transfer function. In contrast to D and U, w and p are waves that changes their shape while traveling the medium and are unchanged as they cross a discontinuity at point id. The pressure, p of the downward moving wave D, is equal to the characteristic impedance multiplied by the elastic velocity w, while the pressure of the upward moving wave U is the negative of this. When modeling transmission lines, pressure p is analogous to voltage and elastic velocity w is analogous to current. The notation id− represents a point in time just before the discontinuity id and similarly the notation id+ represents a point in time just after the discontinuity id such that:

$$D(id+,jd) = D_{i,j} \quad U(id+,jd) = U_{i,j}$$

$$D(id-,jd) = D_{i-1,j-1} \quad U(id-,jd) = U_{i-1,j-1}$$

The Evolution Equation and the Discontinuity Equation may be combined into a single matrix equation that represents the behavior of U and D:

$$\begin{bmatrix} D_{i,j} \\ U_{i,j} \end{bmatrix} = \frac{1}{\sigma i} \begin{bmatrix} 1 & -\gamma i \\ \gamma i & 1 \end{bmatrix} \begin{bmatrix} D_{i-1,j-1} \\ U_{i-1,j+1} \end{bmatrix} \quad \text{COMBINED EQUATION}$$

for a series of voltage measurements in accordance with the notation described above.

Additionally, γi represents the current reflection coefficient at a time, i, which is the ratio of the reflected voltage, Vrefl, over the incident voltage, Vinc, at this time and may be represented as:

$$\gamma i = U_{i-1,i}/D_{i-1,i-1}$$

and σi represents the transmission coefficient at a time, i, which may be represented as: $\sqrt{1-(\gamma i)^2}$.

In embodiments using a wire or line that has a high level of process noise or the Analog to digital converter has small number of bits (e.g. 8 bits vs. 14 bit), the noise will introduce process errors into the inverse scattering algorithm. This error grows, potentially exponentially, with the length of wire under test. In this instance, an embodiment may include an error correcting strategy. In one error correcting strategy, the reflection coefficient $\gamma_i$ is set to zero if the absolute value of $\gamma_i$ is less than a predetermined threshold that may vary in accordance with each embodiment. For a noisy system, for example, a threshold of 3 times the standard deviation of the noise may be used. For a low bit rate analog to digital converter, for example, a threshold of $0.5*$ Voltage$/2^{number\ of\ bits}$ may be used. As an example, for a 0.5 volt pulse system, the threshold using the foregoing is: $t=0.5/2^7=0.002$ $_{\gamma i}$.

Below is a pseudo-code like description of one implementation of the foregoing Combined Equation. Note that this utilizes array notation which has index=1 as its first element.

```
Vrefl: Reflected Voltage;
Vmes: Measured voltage;
Vinc: Incident Voltage
N = length (Vmes);    % This is the number of sample points
Vref = Vmes −Vin;
Z(1) = Zo;            % Initialize based on wire characteristic
                        impedance of nominal wire without faults
For i = 1:N,
        D(1,i) = vinc(i);    %Initialize Upward and downward
                                Wave matrices
        U(1,i) = vrefl(i);
end
for i = 1:N−1,
    ii = i+1;
    r(ii) = U(i,ii)/D(i,i);   %Determine the reflective coefficient γi
    if r(ii) > 1,             %Avoid possible divide by zero errors
        r(ii) = .999;
    end
    if r(ii) < −1,
        r(ii) = −.999;
    end
    s(ii) = sqrt(1−r(ii)^2);  %Determine transmission coefficient σi
    for j = i:(N−1),          %Inner loop --- adjust values in upper
                                triangular portion with respect to "i"
        jj = j+1;             %    THIS IS THE
                                   COMBINED EQUATION ABOVE
        D(ii,jj) = (D(i,j) − r(ii)*U(i,jj))/s(ii);
        U(ii,jj) = (−r(ii)*D(i,j) + U(i,jj))/s(ii);
    end
end
```

Using the foregoing values as estimated and included in the diagonals of the matrices U and D above, corrected voltages can be calculated from the relationship between characteristic impedance, voltage and reflection coefficient:

$$Z1 = Zo*(1+\gamma_0))/(1-\gamma_0))\quad\text{EQUATION 5}$$

and $$V\text{refl}(1) = (Z1-Zo)/(Z1+Zo)*V\text{inc}(1)+V\text{inc}(1)\quad\text{EQUATION 6}$$

Below is the corresponding pseudocode-like representation which uses EQUATION 5 and EQUATION 6 to determine the adjusted impedances and reflected voltages:

```
for i = 1:N        % Adjust to determine final values
    Z(i + 1) = Z(i) * (1 + r(i))/(1 − r(i));
    Vrefl (i) = (Z(i + 1) − Zo)/(Zo + Z(i + 1)) * Vinc(i) + Vinc(i)
end
```

In the foregoing, it should be noted that Zo is the known characteristic impedance of the wire without any faults that may be determined empirically and may vary in accordance with each embodiment. The output of the foregoing is the corrected impedance Z and the corrected reflected voltage Vrefl for each point in time. Matrices D and U in this embodiment may be characterized as triangular. At each point in time, "i", the voltages in the upper triangular portion of the matrix are corrected with respect to the current point in time being examined. The foregoing Combined Equation incorporates a scattering matrix representing the transmission and reflection of energy based on the characteristic impedance at that point. The left hand side of the Combined Equation represents corrected matrices of D and U voltage values up to a point in time. At a time "i", a reflective voltage value is measured and, based on this, additional entries in the matrices based on subscript "j" (which ranges from "i" to the maximum dimension "n") are corrected. In connection with the D and U matrices, for a value on the diagonal of an entry x,x, the remaining values in the xth row of the D and U matrices are adjusted such that the entry x,y, y>x, for each y, is corrected. The voltage at a point "i" is adjusted based on the reflections from this point to the end of the wire.

Prior to executing the steps to adjust voltages to account for the reflections due to the inverse scattering problem, N reflective voltages are measured. The foregoing embodiment uses an N×N matrix for D and U. The reflected voltages measured are an input to this technique and are stored as the $1^{st}$ row of the U matrix. Similarly, the N measured incident voltages are an input and stored in the $1^{st}$ row of the D matrix. After the foregoing processing steps are executed, the diagonals of the U and D matrices include the adjusted or corrected voltages with the reflective components due to the inverse scattering problem removed. In connection with both the D and U matrices, the columns represent forward (e.g. causal) time steps. The diagonals of each matrix, where the row and column indices are the same, represent the causal effect of time, e.g. no voltage can be reflected at point i+1 until time after time i. For example, no reflected voltage can be measured for time index 3 until time index 2 has happened.

Note that using the foregoing technique to remove the unwanted reflective components, voltage is measured where the voltage is a function of true changes in impedance and artifacts from the multiple reflective components. As described elsewhere herein, the reflection coefficient is the ratio of Vrefl(i)/Vinc(i), and the measured voltage Vmeas(i) =Vrefl(i)+Vinc(i). The foregoing technique uses the reflection coefficients because of the application of conservation of energy principles. The pseudo-code above uses "r" to indicate the amount of energy reflected, reflection coefficient, and the transmitted energy is t=sqrt(1−r^2), which is the transmission coefficient. The incident voltage (Vinc) after a transition at point "i" may be represented as Vinc(i+1)=Vinc(i) t, while the reflected voltage is just Vinc(i)* r(i). At each point where there is a transition from one characteristic impedance to another, the reflection coefficient is r(i+1)=(Z(i+1)−Z(i))/(Z(i+1)+Z(i)). Therefore if the true reflection coefficient is determined at each point, the adjusted or true Z at each point may also be determined. Each of the D and U matrices are keeping track, respectively, of the incident and reflected voltages based on the updated reflection coefficients determined using the measured voltage, inferred reflection coefficients and calculated transmitted voltage.

It should be noted that an embodiment may use other data structures and arrangements in implementing the foregoing techniques to compensate the reflected and incident voltages. For example, another embodiment may utilize a single matrix to store the foregoing U and D matrices which is an N×1, N×1 matrix combining the two upper right triangular U and D matrices into a single matrix.

Figure 4:
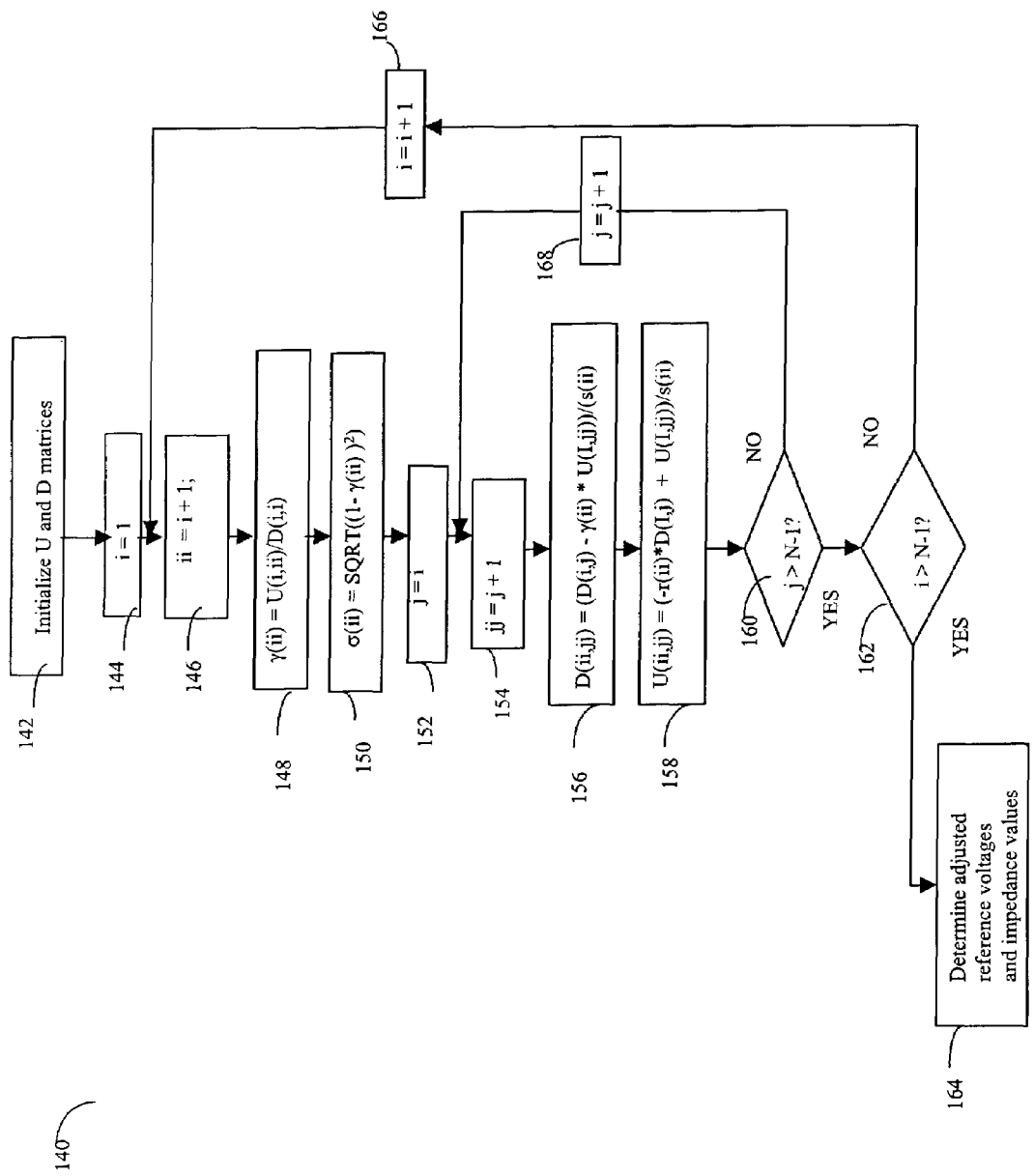
FIG. 4 is a flowchart of steps of an embodiment for compensating received signals to remove unwanted reflective components due to the inverse scattering phenomena.

Referring now to FIG. 4, shown is a flowchart 140 of processing steps of one embodiment for compensating or adjusting the incident and reflective voltages to account for the inverse scattering. The flowchart 140 generally describes the steps set forth above and is one embodiment of more detailed processing of step 124 of FIG. 3. At step 142, the U and D matrices are initialized. The U matrix corresponds to the reflected voltage values measured which are known inputs, and the D matrix corresponds to the incident or transmission voltage values which are known inputs. As described above, these values may be placed in the first rows of the D and U matrices. At step 144, index variable i is initialized to 1 and at step 146, the index variable ii is initialized to be the quantity i+1. At step 148, the reflective coefficient of ii is determined. At step 150, the transmission coefficient of ii is determined. At step 152, the index variable j is initialized to i and at step 154, the index variable jj is initialized to be the quantity j+1. At step 156, the value of the D matrix at entry D(ii,jj) is adjusted and at step 158, the value of the matrix U at entry U(ii,jj) is adjusted. At step 160, a determination is made as to whether the value of j is greater than the quantity N−1, where N is the number of sample points. If not, control proceeds to step 168 where j is incremented and control proceeds to step 154 where the next iteration of the inner loop is performed until the quantity of j at step 160 reaches the final value of N. At step 160, when it is determined that j is greater than the quantity N−1, control proceeds to step 162 where a determination is made as to whether the value if i is greater than the quantity N−1. If not, control proceeds to step 168 where the value of i is incremented. Control then proceeds to the top of the outer loop where the next outer loop iteration is performed. At step 162, if it is determined that the value of i is greater than the quantity N−1, then control proceeds to step 164 where the adjusted reference voltages and impedance values are determined such that they are compensated in accordance with the inverse scattering values determined.

Figure 5A:
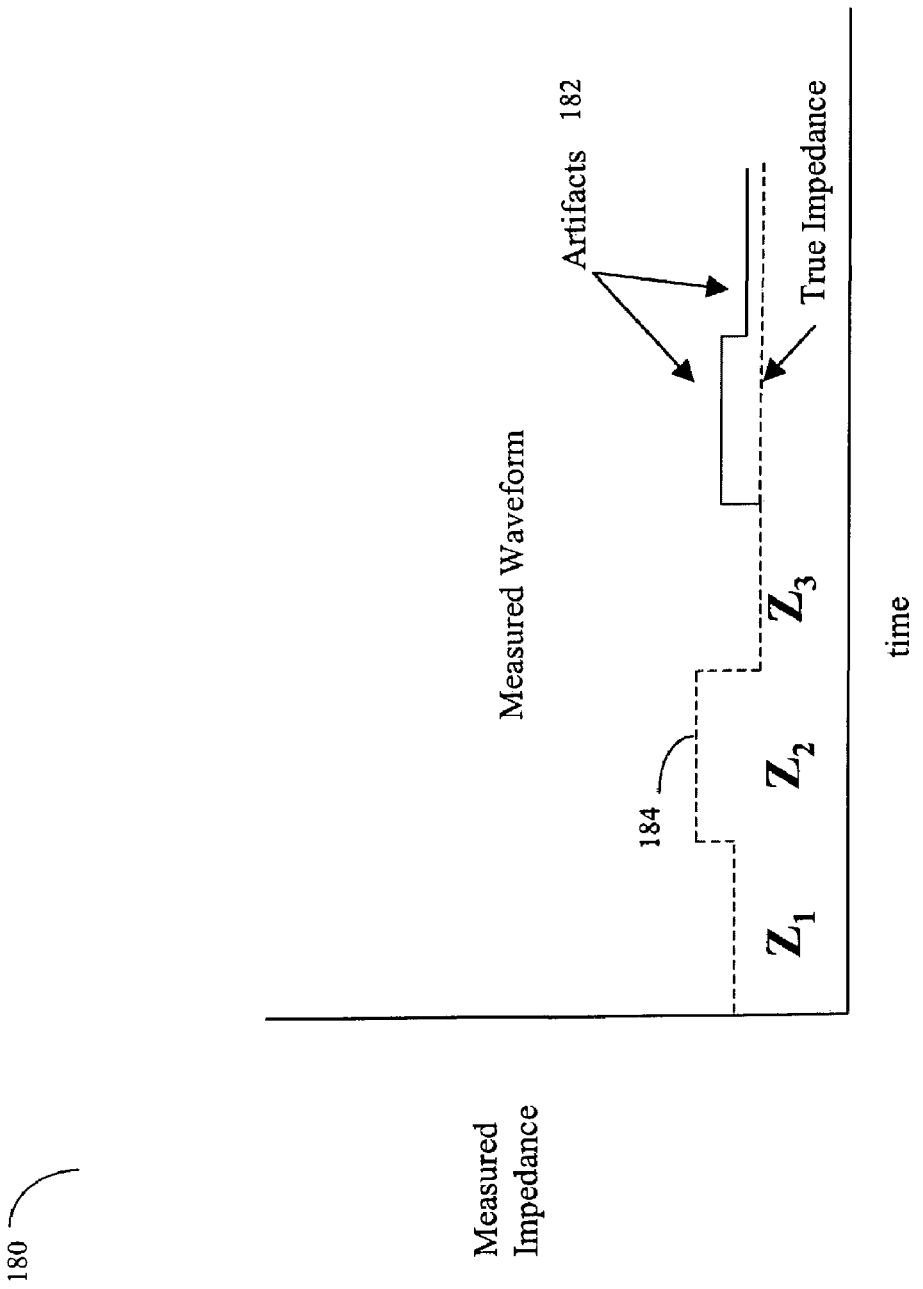
FIG. 5A is a graphical illustration of one embodiment of how the unwanted reflective components removed may appear in a waveform.

Referring now to FIG. 5A, shown is a graphical illustration 180 of how the foregoing reflective artifacts may appear in a measured waveform. The reflective artifacts, as indicated by the solid line 182, are those reflections which are removed by the processing steps of FIG. 4. The dashed line 184 represents the true impedance of the wire with the reflective artifacts or components removed. Without the reflective components caused by the scattering problem in a wire with no faults or events, there would appear graphically a straight horizontal line with a constant measured impedance. However, with the reflection components due to a fault in the wire and/or the scattering problem, measurements at different points in time result in a waveform as shown in 180 in which the varying reflective artifacts cause an additional unwanted change in the waveform of the measured impedance. In a wire with faults, there may be changes in the impedance indicated by changes in the waveform. However, the unwanted reflective components or artifacts due to the scattering problem cause extra "noise" in this waveform. Accordingly, the waveform 180 needs to be adjusted to compensate for those unwanted reflective components due to the scattering problem.

Figure 5B:
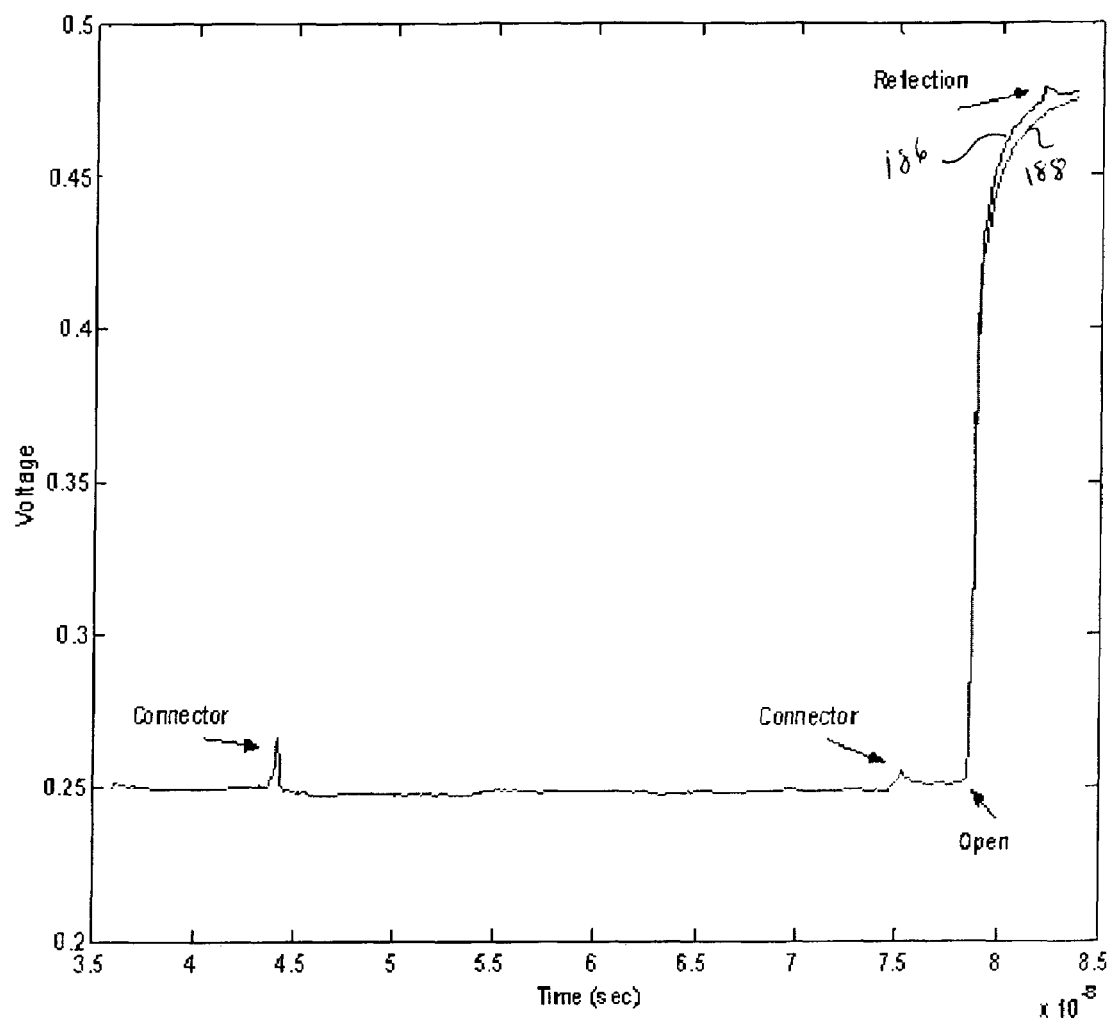
FIG. 5B is another graphical illustration of how the unwanted reflective components and reflective components related to wire events may appear in a waveform.

Referring now to FIG. 5B, shown is another illustration 185 comparing a measured waveform to a waveform that has been adjusted to remove the reflective components due to the inverse scattering problem. The measured waveform 186 includes voltage changes due connectors as well as reflective components. The adjusted waveform 188 includes those incident and reflective components due to the connectors in this example, but has been adjusted to remove the reflective components. It should be noted that other examples would include other peaks due to other events, such as a damaged or crimped wire, in place of the peak in the waveform associated with the connector. The particular waveform varies in accordance with the wire and any defects, connectors, and the like associated with each wire.

Figure 6:
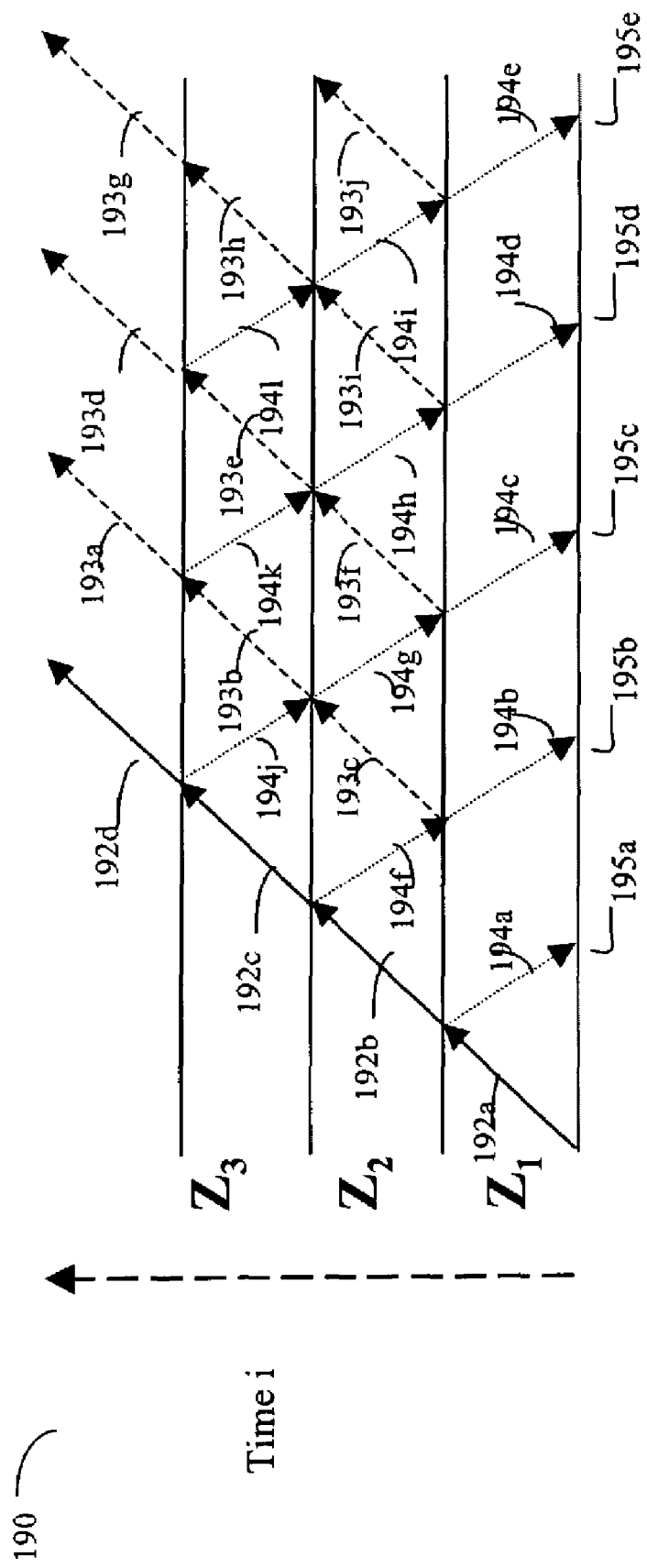
FIG. 6 is a graphical illustration of one embodiment of the inverse scattering problem and the associated reflective artifacts.

Referring now to FIG. 6, shown is a graphical illustration 190 of the inverse scattering problem and the associated reflective artifacts. The solid arrows 192a-192d indicate the adjusted or inferred measured waveform Z at a particular point in time determined in accordance with corrected or adjusted reflective and incident voltage values. The adjusted reflected voltage values at different points in time are stored in the diagonals of the U matrix. The adjusted incident voltage values at different points in time are stored in the diagonals of the D matrix.

The one or more reflective components as associated with the previously described U matrix are the dashed arrows sloping down to the right 194a-194l. The one or more incident components as associated with the previously described D matrix are the dashed arrows sloping upward to the right 193a-193j. After executing the processing steps described herein, the original measured incident and reflective voltage values are adjusted to remove reflective components caused by the reflective scattering problem.

Measured voltages are indicated as 195a-195e. It should be noted that the foregoing incident and reflective components each include two portions: a first portion representing an adjusted portion and a second portion representing the contribution due to the inverse scattering problem.

In one embodiment, after the reflective voltages and associated impedances are adjusted to take into account the inverse scattering problem, these adjusted values may be used as inputs to attenuation compensation processing as set forth, for example in step 126 of FIG. 3.

In one embodiment, the output of inverse scattering compensation processing, which is used as an input to attenuation processing, is a single vector of voltages, denoted VADJ[1 . . . N], where "N" is the number of measured voltages as referenced above. Each of the VADJ[i], i=1 . . . N, are the previously measured voltages which have been adjusted to remove the reflective artifacts, such as using the processing steps described in connection with FIG. 4. Each $$VADJ[i] = Vrefl,adj[i] + Vinc,adj[i]$$

where

Vrefl,adj[i] is the adjusted reflective voltage at time "i" and Vinc,adj[i] is the adjusted incident voltage at time "i".

This relationship is based on:

$$Vmeas[i] = Vrefl[i] + Vinc[i]$$

where:

Vmeas[i] is the measured voltage, Vinc[i] is the known incident voltage sent out on the wire at time "i", and Vinc[i] is inferred by subtracting Vinc[i] from the quantity Vmeas[i].

Each Vrefl,adj[i] may be determined using

```
for i = 1:N      % Adjust to determine final values
    Z(i + 1) = Z(i) * (1 + r(i));
    Vrefl (i) = (Z(i + 1) − Zo)/(Zo + Z(i + 1)) * Vinc(i) + Vinc(i)
end
``` as set forth and described elsewhere herein. Each Vinc,adj[i] may be determined as D[i,i], i=1,N, from the diagonal of the D matrix after performing FIG. 4 processing steps as described elsewhere herein.

As the voltage waveform travels down the wire, it is subject to a frequency-dependent attenuation where higher frequency components of the waveform are attenuated to a greater degree than lower frequency components of the waveform. In addition, the amount of attenuation at all the frequencies depends on the distance traveled by the waveform. Thus, a signal reflected from an anomaly at one meter would look different than a signal from a reflection of an anomaly at one hundred meters, even if both anomalies are identical. Accordingly, it is desirable to compensate for the frequency and length dependent attenuation so that an anomaly will cause the same reflective signal to be sensed irrespective of the distance of the anomaly to the point where the signal is measured. In an embodiment herein, the VADJ[1] through VADJ[N] voltage waveform signal generated by the process described above is further compensated to provide a compensated voltage waveform signal, VC[1] through VC[N], which represents the VADJ[1] through VADJ[N] signal compensated for frequency and length dependent attenuation.

An equation that describes attenuation of a voltage signal as a function of frequency and length of travel of the signal is the following:

$$A(f, L) = e^{-(R(f)*L/Z0)}$$

Where Z0 is the characteristic impedance of the cable and R(f) is the frequency dependent resistance of the cable. The frequency dependent resistance, R(f), may be determined using the equation:

$$R(f) = (1/2r)* (\mu f/\pi\sigma)^{1/2}.$$

Where r is the radius of the wire, $\mu$ is the permeability of free space, in henries per meter, and $\sigma$ is the conductivity of the conductor material of the cable. For copper conductors, $\sigma$ is approximately $5.8 \times 10^7$ ohms/meter.

Note that the quantities r and $\sigma$ are constant for a given cable (as, of course are $\mu$ and $\pi$). Thus, $R(f) = K * f^{1/2}$. More information about determining cable attenuation and the relationship thereof to frequency, length, and impedance, may be found in Heald, Mark A. and Marion, Jerry B., *Classical Electromagnetic Radiation*. Fort Worth, Harcourt Brace College Publishers, 1995 and in Hall, Stephen., Hall, Garret., McCall, James., *High Speed Digital System Design*. New York, John Wiley & Sons, Inc., 2000.

Although attenuation is a function of both frequency and length, in an embodiment herein the attenuation is approximated by assuming that the length is a constant equal to the round trip length of the cable (i.e., twice the cable length). In the case of such an assumption, the attenuation becomes a function of just the frequency rather than both frequency and length. As discussed in more detail below, in one embodiment, the length is set to the round trip length of the cable and only the frequency is taken into account when determining the attenuation and appropriate compensation. In another embodiment, both the frequency and length are used to determine and compensate for the attenuation.

Once the attenuation is determined, it is desirable to provide a gain filter that is the inverse of the attenuation so that the convolution of the attenuation and gain functions (in the time domain) or the multiplication of the attenuation and gain functions (in the frequency domain) cause the resulting signal to be unattenuated. That is, the gain filter is applied to the attenuated signal to remove the affects of attenuation therefrom.

Given that the attenuation may be determined as set forth above, it is fairly straight forward to calculate the gain required to offset the attenuation and then to design an FIR (finite impulse response) digital filter to provide that gain. Such a procedure is described, for example, in Oppenheim, Alan V., Schafer, Ronald W., *Discrete-Time Signal Processing*. New Jersey, Prentice Hall, 1989 and McClellan, James, et al. *Computer-Based Exercises for Signal Processing Using Matlab* 5. New Jersey, Prentice Hall, 1998. Of course, the number of coefficients for the FIR filter is a design choice. A greater number of coefficients increases the precision of the result while a lesser number of coefficients decreases the computational time required for the filter.

Figure 7:
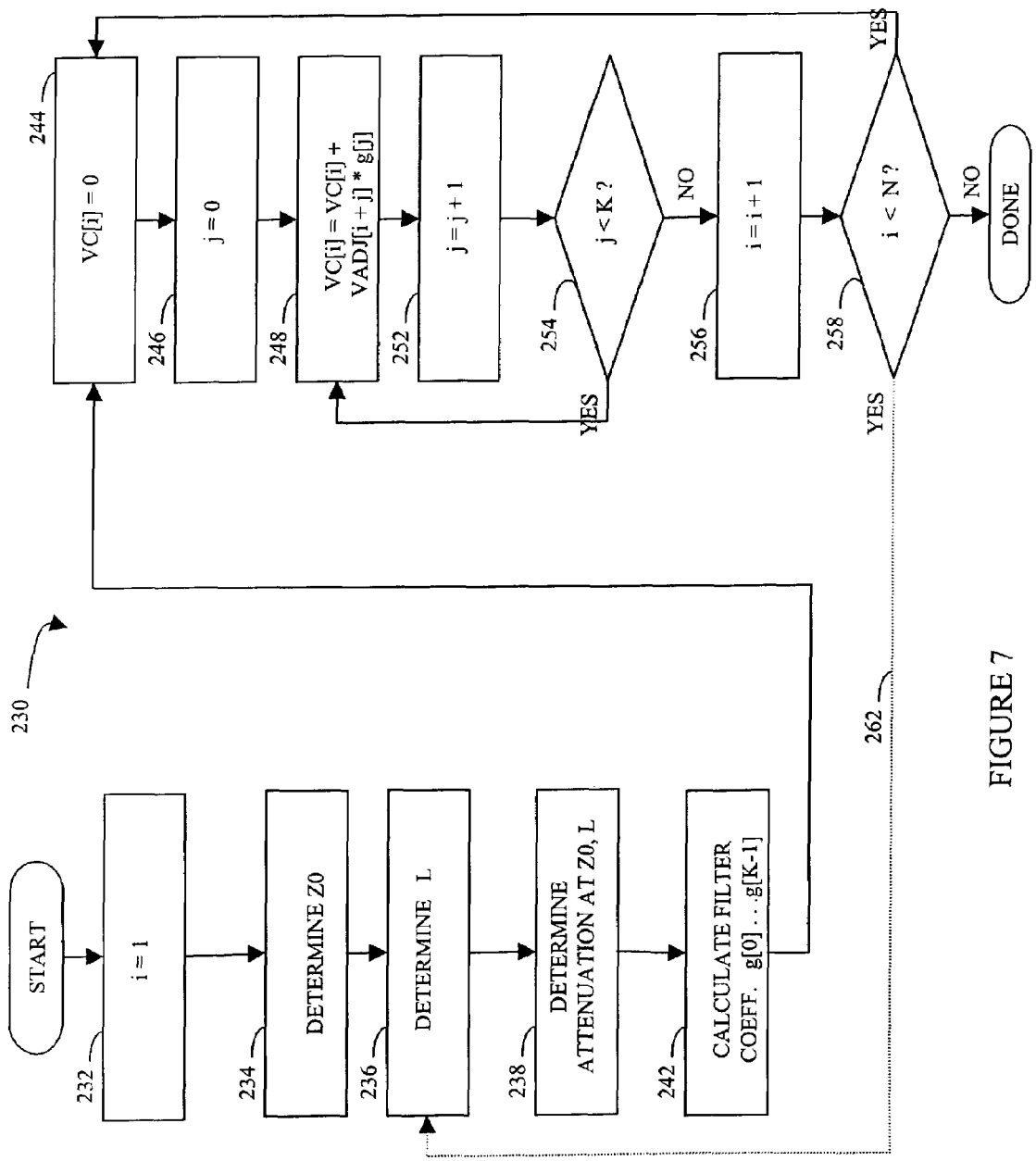
FIG. 7 is a flowchart showing steps for attenuation compensation.

Referring to FIG. 7, a flowchart 230 illustrates steps performed in connection with compensating a voltage signal to account for attenuation. The input signal, VADJ[1] through VADJ[N], is represented by a series of voltages each measured at a particular point in time, and thus indexed by one through N where N is the maximum number of samples. The object of attenuation compensation is to convert each of the points VADJ[1] through VADJ[N] into compensated voltage signals VC[1] through VC[N]. Note that, in theory, VC[1] is a function of each and every VADJ[1] through VADJ[N] value, VC[2] is a function of each and every VADJ[2] through VADJ[N], VC[3] is a function of each and every VADJ[3] through VADJ[N], etc. Thus, it would be possible to use an FIR filter with N coefficients to perform the compensation. However, practically speaking, it is often sufficient to provide a filter with less coefficients. In one embodiment, fifty filter coefficients may be used while in another embodiments only five filter coefficients may be used. Of course, other numbers of filter coefficients (between five and fifty or greater than fifty or less than five) may also be used.

Processing for the flowchart 230 begins at a step 232 where index variable, i, is set equal to one. The index variable i is used to index through each of the VADJ values and each of the VC values. Following the step 232 is a step 234 where the characteristic impedance of the cable, $Z_0$, is determined. The characteristic impedance, $Z_0$, may be provided using any one of a number of techniques. For example, $Z_0$ may be input by a user who obtains the value from a manual (or other source) for the particular type of cable being tested. Alternatively, $Z_0$ may be determined from the measurements of the cable using techniques described below.

Following the step 234 is a step 236 where the value of L is determined. In an embodiment herein, the value of L determined at the step 236 equals the length of the cable times 2 (i.e., the roundtrip length for the signal). Determining the length of the cable is described in more detail below. In other embodiments, L is allowed to change as a function of i. Note that the length traveled by a particular portion of the signal VADJ[i] is a function of the time it takes for the signal to make a roundtrip. In any event, for an embodiment illustrated herein, the value of L used at the step 236 corresponds to twice the length of the cable being tested, which is determined using techniques described below. However, note that, just as with Z0, it is possible to have a user enter the value of L as an input.

Following the step 236 is a step 238 where the attenuation is determined given the value of Z0 calculated at the step 234 and the value of L determined at the step 236. For an embodiment described herein, both Z0 and L do not change so that the attenuation is constant and is determined one time at the step 238. However, for alternative embodiments (described below), L varies for each point VADJ[i] so that a new attenuation will be calculated for each new L at the step 238.

Following step 238 is a step 242 where filter coefficients g[0] through g[K-1] are calculated based on the attenuation determined at the step 238. The number of filter coefficients is represented by K. As discussed above, it is straight forward to determine the filter coefficients for an FIR filter given the characteristic attenuation (and thus desired gain) for a cable. In addition, the value of K, the number of filter coefficients, is a design choice, as discussed elsewhere herein.

Following the step 242 is a step 244 where the value of VC[i] is set to zero. As discussed elsewhere herein, the end result of performing the steps of the flowchart 230 is an array of compensated voltages VC[1] through VC[N], where N is the number of measured points of the voltage waveform.

Following the step 244 is a step 246 where an index variable, j, is set equal to zero. The index variable j is used to index through the filter coefficients, as described in more detail below. Following step 246 is a step 248 where the value of VC[i] is set equal to the sum of VC[i] plus the value of VADJ[i+j]* g[j].

Following the step 248 is a step 252 where the index variable, j, is incremented. Following the step 252 is a step 254 where it is determined if the index variable, j, is less than K, the total number of filter coefficients. If so, then control transfer from the step 254 back to the step 248 to continue calculating VC[i]. Thus, the value of VC[i] is calculated using the loop comprising the steps 248, 252, 254 to provide the FIR filter functionality.

Once it is determined at the step 254 that the value of the index variable j is not less than the value of K, the number of filter coefficients, control transfers from the step 254 to a step 256 where the index variable i, which is used to index VADJ and VC, is incremented. Following the step 256 is a test step 258 which determines if i is less than N, the total number of points being processed. If not, then processing is complete. Otherwise, control transfers from the step 258 back to the step 244 to calculate the next VC[i].

In an alternative embodiment, the length is allowed to be a function of the index variable i, where L is proportional to i since each i represents a different point in time. Thus, for each new value for L, a new value for the attenuation is determined and a new set of filter coefficients is also determined. Although this alternative embodiment may be more computationally intensive than the embodiment described above, it has the advantage of using a different filter at each length to account for the fact that attenuation (and thus the desired gain) is a function of both the frequency of the signal and the length that the signal has traveled.

The alternative embodiment is illustrated by an alternative path 262 from the step 258. If it is determined at the step 258 that the index variable i is less than N, the total number of VADJ and VC points, then control transfers from the step 258 along the alternative path 262 back to the step 236 to determine L where, for this alternative embodiment, L is a function of the index variable i. The new value of L calculated at the step 236 based on the value of i may then be used at the following step 238 to recalculate the attenuation. The new value for the attenuation calculated for step 238 may be then used to calculate a new set of filter coefficients at the step 242. Thus, for this alternative embodiment, new filter coefficients are calculated at the step 242 for each VADJ[i]. Following the step 242 is the step 244 and follow on steps, described above, which proceed as set forth above in connection with the previous embodiment.

Referring to FIG. 8, a flowchart 280 illustrates steps for determining the length and characteristic impedance of a cable, which are used in the processing described above in connection with the flowchart 230 of FIG. 7. Processing begins at a first step 282 where the maximum and minimum voltage values, VMAX and VMIN, are determined in a straight forward manner by examining all of the VADJ[1] through VADJ[N]. Following the step 282 is a step 284 where the first derivative of the VADJ signal is determined in a conventional fashion by, for example, subtracting VADJ[i+1] from each VADJ[i] for all i's one through N−1.

Following the step 284 is a test step 286, where it is determined if the end of the cable is terminated by an open circuit or a short circuit (or components that approximate open or short circuits). In an embodiment herein, the first value of VADJ (VADJ[i]) is used. Note that VADJ[1] represents the voltage value at the test harness. In an embodiment herein, if (VMAX−VADJ[1]) is greater than (VADJ[1]−VMIN), then it is assumed that the cable is terminated by an open circuit (or equivalent). Otherwise, it is assumed that the cable is terminated by a short circuit (or equivalent).

If it is determined at the test step 286 that the cable is not terminated by an open circuit, then control passes from the step 286 to a step 288 where the index, NEND, of the minimum value for the voltage of the derivative (determined at the step 284) is determined. Otherwise, if it is determined at the test step 286 that the cable is terminated by an open circuit, then control passes from the step 286 to a step 292, where the index, NEND, for the maximum value for the voltage of the derivative (determined at the step 284) is determined.

Following either the step 288 or the step 292 is a step 294 where the cable length is calculated in a straight forward manner using the index, NEND, determined at the step 288 or the step 292. Since the index represents time, then the length of the cable is calculated by multiplying the speed of the waveform by the time represented by the index. Following the step 294 is a step 296 where VMED, the median value of the voltages between and including VADJ[1] and VADJ[NEND] is determined in a straight forward manner. Following the step 296 is a step 298 where the impedance is calculated using the formula Z0 equals (fifty*VMED)/(VIN−VMED), where VIN is the magnitude of the incident input voltage provided by the signal generator 44 shown in the diagram 40 of FIG. 1.

Once the signal compensation processing has been performed to equalize for attenuation or dispersion loss and remove multiple inverse scattering reflections, events of interest are detected in preparation for parametric classification. An event of interest is any change in characteristic impedance in a wire, including a connector element, cut, nick, crimp, insulation damage, or coupling with other structures or wires.

An event, once identified, is passed to the classification component to classify the type of event; however, one issue is to balance the probability of an event detection with the probability of a false alarm. Generally, an effective event detection system will have as low a probability of false alarm as possible while still maintaining an acceptable probability of detection of an event of interest. Efficient processing and classification of a signal is accomplished by classifying only events for which there is a certain probability that an event of interest has been identified. Such operation reduces wasted processing time in sending false alarms to be classified by the parametric classification operations.

False alarms usually occur because of system noise. Every system generally has system noise which is typically of a Gaussian distribution. Noise occurs due to electromagnetic interference as well as sampling noise resulting from an Analog to Digital conversion process (for example, the A/D converter might only have ten bits, giving rise to one thousand and twenty four distinct measured voltages). Other problems that affect successful event detection include the fact that the wire itself is not perfectly lossless, meaning that the characteristic impedance rises slightly with length. Thus, simply assigning voltage thresholds does not adequately distinguish between wire properties (such as low or high characteristic impedance) or noise signals and true events, such as a cut, crimp, or other fault.

Figure 9A:
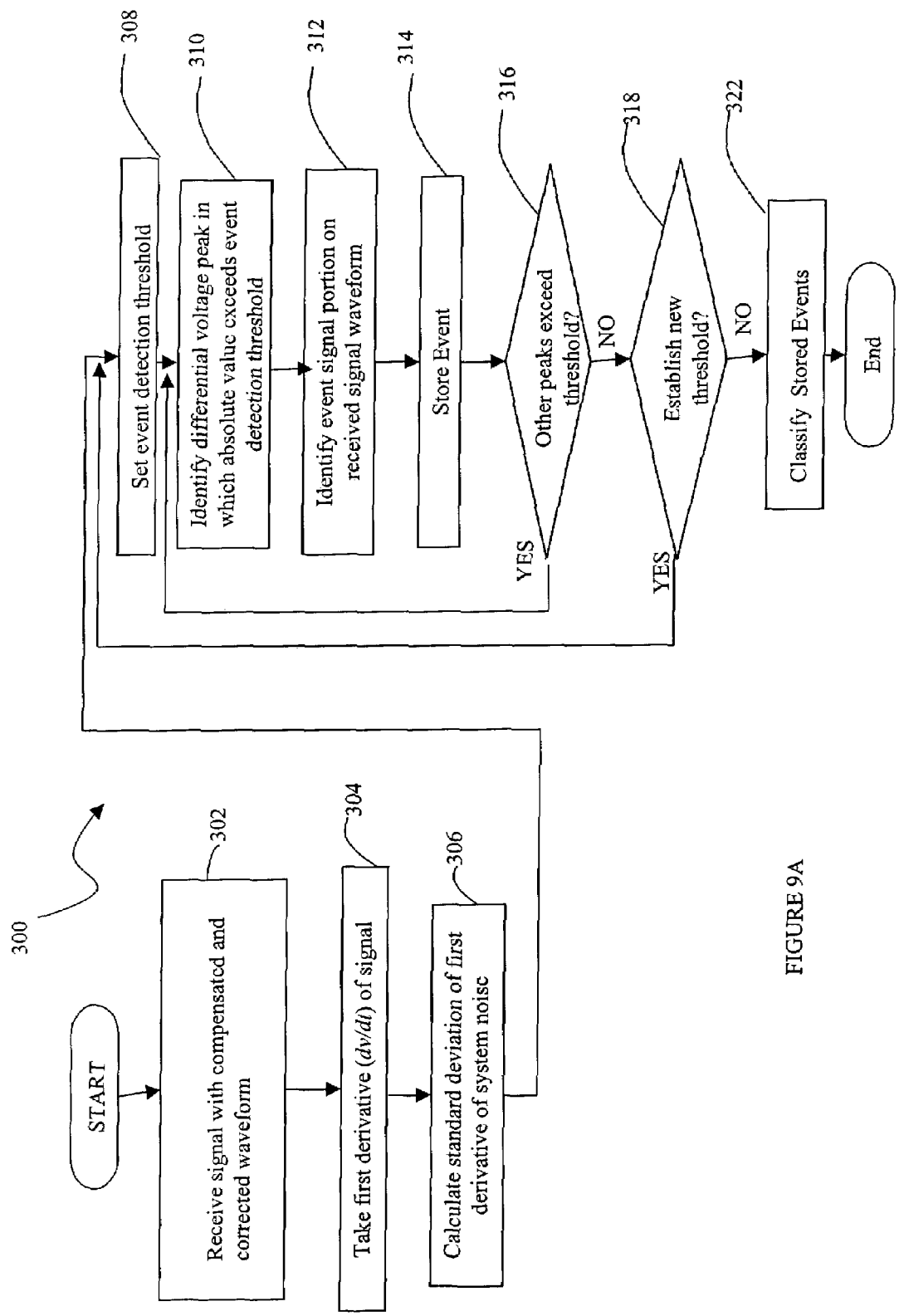
FIG. 9A is a flowchart showing steps for identifying events with a controlled false alarm rate according to one embodiment.

Referring now to FIG. 9A, a flowchart 300 is shown having steps for identifying events with a controlled false alarm rate according to one embodiment of the invention. For the system described herein, events are defined as portions of the signal where the first derivative exceeds a predetermined threshold. In some embodiments, an additional criteria may be imposed where, in addition to the derivative exceeding a predetermined threshold at a particular point, there is also a rate increase for the signal so that VC[k+1]/VC[k] is greater than a second predetermined threshold for two, three, or some other number of successive points starting at the particular point.

At a step 302, the signal VC[1] through VC[N] is received having a waveform that has been compensated for attenuation and dispersion loss and corrected to remove multiple inverse scattering reflections. Following the step 302 is a step 304, where the first derivative (dv/dt) of the signal is taken. This step is accomplished by taking the time difference of the voltage waveform:

$$dv[i]=VC[i-1]-VC[i], \text{ for } i=2 \text{ to } N.$$

By taking the derivative, the effects of wire loss and changes in characteristic impedance due to coupling are substantially removed since these events are often characterized by small changes in voltage versus time, causing the first derivative to be approximately zero. Further, examining and analyzing the raw VC[1] through VC[N] signal waveform to determine an event of interest with no initial information is not necessarily effective because mean voltage of the signal is not known, thereby preventing the establishment of a voltage threshold. Examination of the first derivative of the waveform removes this issue because the first derivative of the mean voltage is zero.

Unlike wire loss and characteristic impedance, the effect of system noise is not necessarily eliminated by taking the first derivative. Accordingly, following the step 304 is a step 306, where a standard deviation of the first derivative of the noise is calculated or estimated. Like the system noise, the first derivative of the system noise is typically Gaussian. Accordingly, at the step 308, an event detection threshold is set such that when the absolute value of the waveform derivative exceeds the threshold, an event is detected. The first derivative of the impedance changes due to connectors, opens, shorts or faults is relatively large compared to the system noise and are therefore detectable and distinguishable. Events below the threshold can be not distinguished without increasing the false alarm rate, and in general, are often not significant events.

In an embodiment described herein, the event detection threshold may be established by calculating (or estimating) the standard deviation of the waveform derivative on a portion of the waveform signal free from defects. For example, the wire under test may be connected to the test set via a test harness. The test harness is a nominal fifty Ohm coaxial cable with known length, which is ideally suited for generating threshold statistics. The threshold statistics are set based on the standard deviation measure. For example, in a preferred embodiment, the threshold is set at three times the standard deviation of the system noise test harness waveform derivative which may provide a false alarm rate of two in one thousand events (0.002).

Following the step 308 is a step 310, where a differential voltage peak is identified in which the absolute value of the peak exceeds the set event detection threshold. Such a peak indicates a high probability of an event of interest. Following the step 310 is a step 312, where the portion of the signal VC[1] through VC[N] that corresponds to the identified differential voltage peak is identified. Following the step 312 is a step 314, where the signal portion identified at the step 312 is stored temporarily in preparation for being sent to be classified, as further described elsewhere herein. Following the step 314 is a step 316, where it is determined whether other peaks that exceed the established event detection threshold exist. If so, then control transfers from the step 316 to the step 310, described above. Otherwise, control transfers from the step 316 to a test step 318, where it is determined whether a new threshold is to be established. In some embodiments, multiple thresholds may be used where each is established by a different criteria. In addition, it is possible to decide to use a new threshold established using different criteria based on the number of events detected (e.g., for a low number of events, lower the threshold and for a high number of events, raise the threshold). In some embodiments, the events stored at the step 314 may be discarded if a new threshold is established. Alternatively, it is possible to simply add new events to the events already stored. If it is determined at the step 318 that a new threshold is to be established, control transfers from the step 318 back to the step 308, discussed above. Otherwise, control transfers to the step 322, where the events stored at the step 314 are classified, as described in more detail below. Following the step 322, processing is complete.

It may be desirable in an embodiment to use a different technique other than the processing steps described in connection with the flowchart of FIG. 9A. There are instances in which the foregoing described in connection with FIG. 9A may tend to amplify any noise such as, for example, the effect of environmental noise and noise in connection with analog to digital conversion. As an alternative, an embodiment may use low pass filtering to remove such noise. However, certain types of filters, such as FIR filters, may actually remove or filter out data of interest. For example, use of an FIR filter in connection with the processing steps of FIG. 9A maintains the first moment or the mean value, but actually modifies the second moment which is not desirable in connection with event detection.

Accordingly, what will now be described is another processing technique that may be used in connection with detecting an event on a wire under test. The processing steps that will now be described "smooth out", such as by curve fitting, noisy data while maintaining the underlying shape of the higher moments of the data. The technique described in following paragraphs uses a polynomial to fit a portion of the compensated voltage data points defined in accordance with a window size and a designated data point. This provides for localized curve fitting for a predefined number of points before and after the designated point. The derivative of each of these polynomials may now be taken. The Ith first derivative may be evaluated at the Ith data point. Event detection may then be performed using the evaluated first derivatives.

Figure 9B:
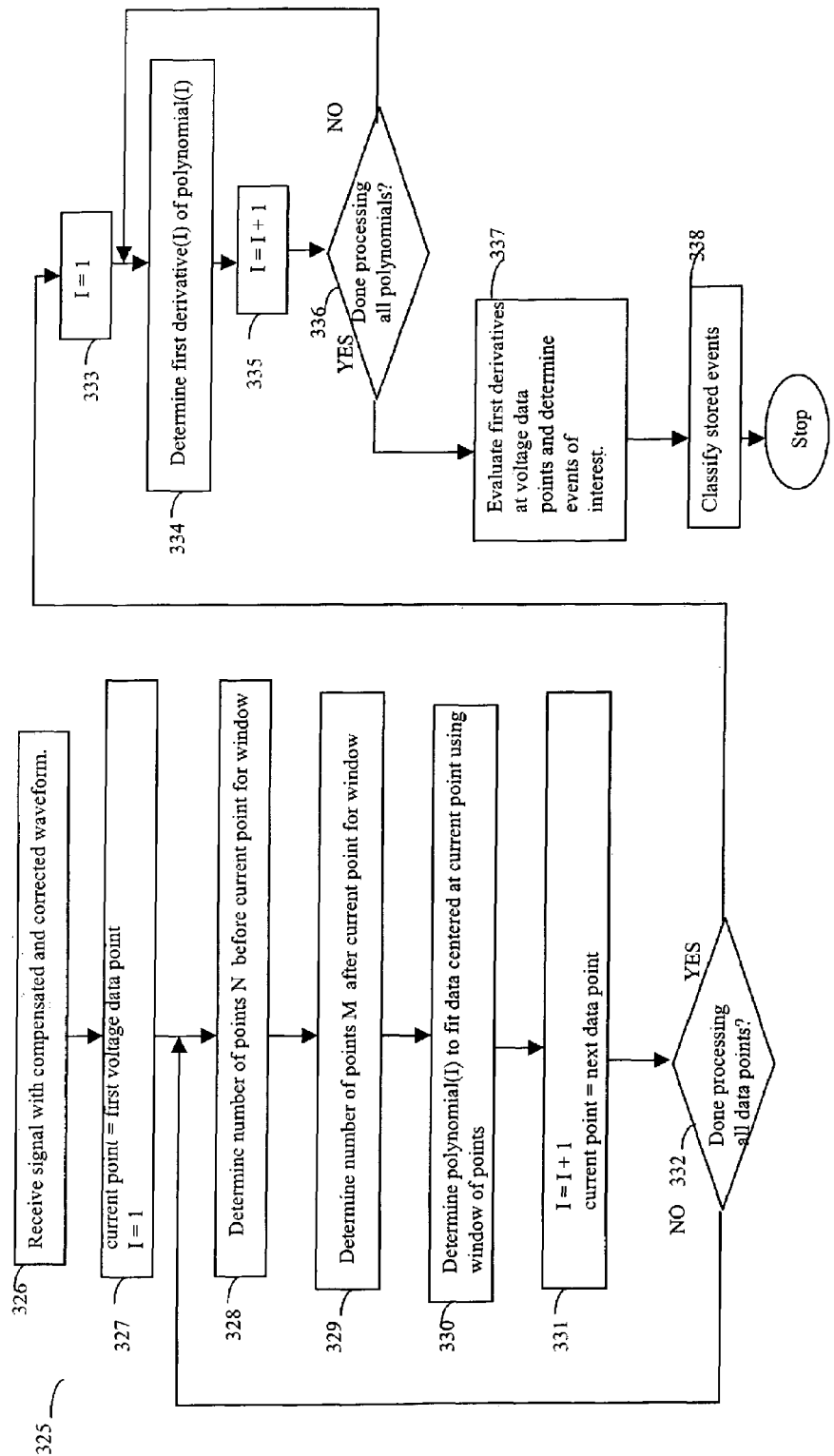
FIG. 9B is a flowchart showing steps for identifying events with a controlled false alarm rate according to another embodiment.

Referring now to FIG. 9B, shown is a flowchart 325 of processing steps that may be performed in another embodiment in connection with event detection. At step 326, a signal is received with a compensated and corrected wave form. The input received at step 326 is similar to that as described in connection with step 302 of FIG. 9A. At step 327, a current point is assigned to be the first voltage data point and the variable I, which is used in following processing steps as a counter, is also initialized to one (1). At step 328, a number of predefined or predetermined points, denoted as N, are determined existing prior to the current point. At step 329, a number of points, denoted as M, occurring after the current point are also determined. As used herein, the number of N points before the current point and the number of M points after the current point define a window of length N+M+1 points. Control proceeds to step 330 where the Ith polynomial is determined in accordance with the data centered at the current point using the predetermined window of N+M+1 points. Any one of a variety of different curve fitting techniques may be used to determine the Ith polynomial in accordance with the N+M+1 data points. A particular example is described in more detail elsewhere herein.

Control proceeds to step 331 where the loop control variable I is incremented by 1, and the current point is designated as the next data point. At step 332, a determination is made as to whether processing is complete for all of the data points. If not, control proceeds to steps 328 and 329 where a subsequent window is determined for the next data point and a polynomial is determined to fit that current data point and associated window of data points. It should be noted that an embodiment may use the same window size and values for M and N on each iteration. In this instance, values for M and N may be determined outside of the loop iteration prior to performing the first iteration.

At step 332, when all data points have been processed, control proceeds to step 333 where the variable I is re-initialized to one. At step 334, the first derivative of polynomial I, denoted as first derivative(I), is determined. It should be noted that the first derivative may be mechanically determined in accordance with well-known mathematical rules. For example, in one embodiment, the first derivative may be determined using, for example, well-known algebraic differentiation rules. At step 335, the loop control variable I is incremented by one (1). A determination is made at step 336 as to whether all polynomials have been processed. If not, control proceeds to step 334 where the first derivative of the next polynomial is determined. This processing proceeds until, at step 336, a determination is made that all first derivatives have been determined. Control then proceeds to step 337 where the first derivatives are evaluated at each voltage data point in accordance with the associated window of data points. The events of interest for each of the first derivatives are then determined.

Figure 9C:
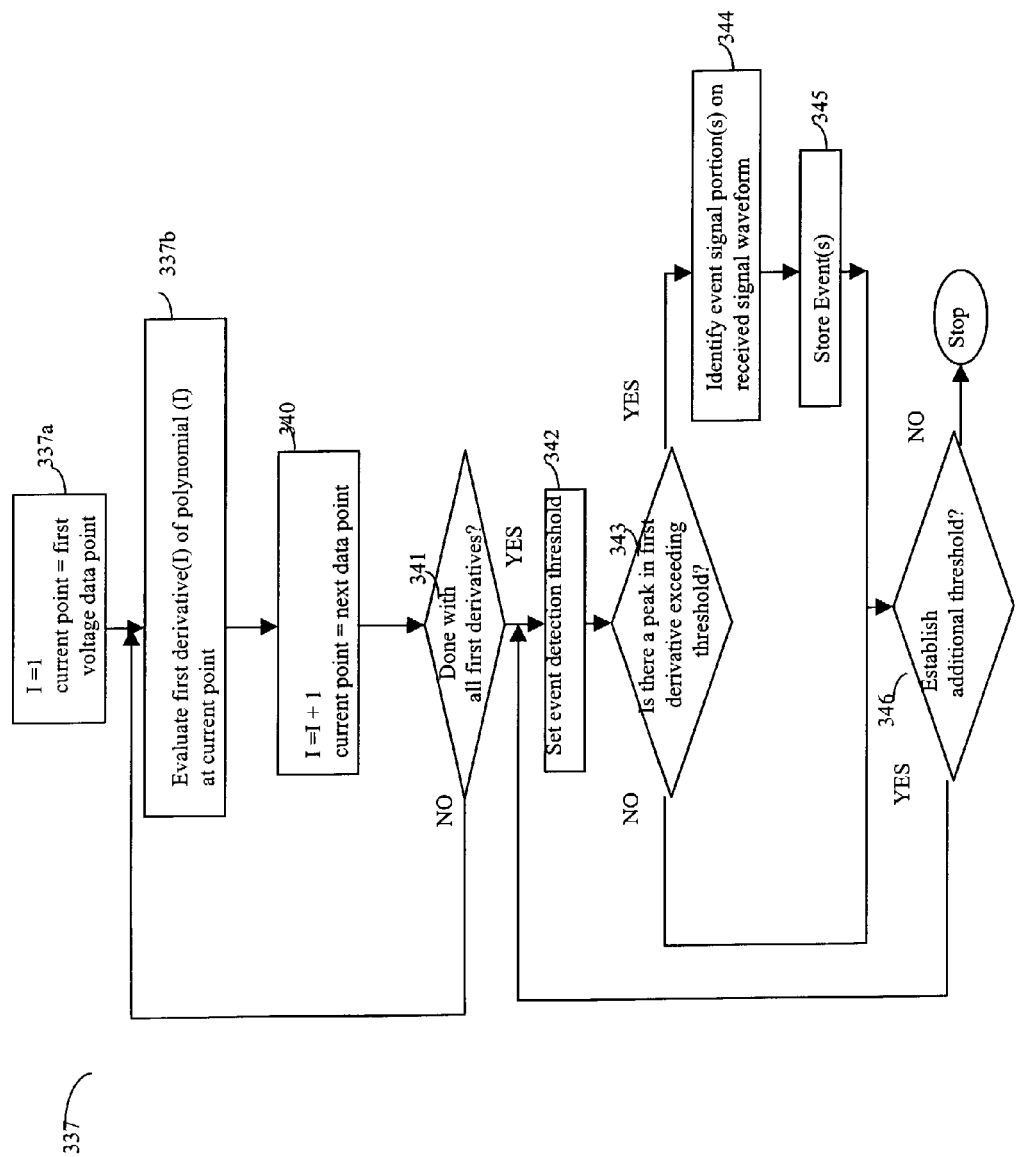
FIG. 9C is a flowchart showing in more detail processing for determining events of interest.

Referring now to FIG. 9C, shown is a flowchart of processing steps of one embodiment for evaluating first derivatives at voltage data points and determining events of interest previously described in connection with FIG. 9B. Flowchart 337 of FIG. 9C shows more detailed processing steps of one embodiment for step 337 referenced in FIG. 9B. At step 337a, variable I is initialized to one(1) and the variable current point is initialized as the first voltage data point. The voltage data points used in flowchart 337 are the compensated voltages input at step 326. At step 337b, the Ith first derivative, denoted as first derivative(I) in the flowchart, is evaluated at the current point. Control proceeds to step 340 where the variable I is incremented by one(1) and current point is assigned to be the next voltage data point. At step 341, a determination is made as to whether all the first derivatives have been processed. If not, control proceeds to step 337b to evaluate the next first derivative. Otherwise, if all first derivatives have been evaluated, control proceeds to step 342 where an event detection threshold is determined. Any one or more of a variety of different techniques may be used in connection the determining such a threshold, such as those described elsewhere herein in connection with FIG. 9A. At step 343, a determination is made as to whether there is a peak in the evaluated first derivatives exceeding the threshold. If not, control proceeds to step 346. If so, control proceeds to step 344 where the event signal portion corresponding to the first derivative peak is determined. An embodiment may use any one or more of a variety of different peak finding techniques, such as described in connection with FIG. 9A elsewhere herein. At step 345, the event determined may be recorded for further processing. At step 346, a determination is made as to whether an additional threshold is to be established. For example, if no events are detected when using a first threshold, an embodiment may subsequently, try a second different threshold. If additional thresholds are to be established, control proceeds to step 342. Otherwise, processing in connection with flowchart 337 ends.

It should be noted that the processing steps of FIGS. 9B and 9C provide an alternate technique in connection with determining first derivative values. These first derivative values are used rather than the compensated voltages when performing event detection. An embodiment may use one or both of the foregoing first derivative techniques when performing event detection.

An embodiment may select various values for N and M as used in the foregoing. In one embodiment, N and M may be selected as the same size such that there is no biasing in connection with N and M. N+M+1 form the window size which may vary in a particular embodiment. The window size selected in an embodiment may be inversely related to the bandwidth of a system. For example, a larger window size may be used in a system having less bandwidth, and a smaller window size may be selected in systems with larger bandwidths.

It should be noted that any one of a variety of curve fitting techniques may be used in an embodiment in connection with step 330 processing. Recall, step 330 processing may include determining a polynomial using a curve fitting technique in accordance with each particular window of data points with respect to a current data point. In one embodiment, the least-squares curve fitting technique may be used and the normal equations may be used in solving for the coefficients of the polynomials. Techniques such as this and others that may be used are well-known as described, for example in, Numerical Recipes in C, Pres, William, Teukolsky, Saul, Vetterling, Willian and Flannery, Brian, Cambridge University Press, Cambridge, 1988. Generally, the polynomials used in the foregoing processing steps of FIGS. 9B and 9C may be represented as follows:

$$a_0 + a_1 i + \ldots + a_n x^n$$

Normal equations for the above polynomial may then be represented as:

$$A\ c = v \qquad \text{NORMAL EQTN 1}$$

where, as used herein:
 A is matrix having N+M+1 rows (the size of the window) and n+1 columns;
 c is a vector of coefficients; and
 v is a vector of N+M+1 voltages.

Now, multiply both sides by $A^t$, the transpose of matrix A, to get:

$$A^t v = A^t A\ c$$

and now solve for c, the coefficients to get:

$$c = (A^t A)^{-1} A^t v \qquad \text{COEFFICIENT EQTN}$$

The normal equations may be used to solve for the coefficients of polynomial (I) using the associated window of data points associated with the Ith current data point.

Following is a pseudo code-like representation using the above COEFFICIENT EQTN that may be used in determining the coefficients. In the following, each $A_{i,j} = i^j$, i=−N, . . .

M, and j=0, ... ,n for voltages $V_{-N}, \ldots V_0, \ldots, V_M$ where Vo is referenced as the kernel of v below and corresponds to the current voltage data point as used in connection with FIGS. 9B and 9C. Note that $c_1$ is the smoothed value of v, and $c_2$ is the first derivative values of v. In the following description, c is an m×1 vector, where c(1)=is v smoothed, c(2) is the first derivative, c(n) is the n−1 derivative.

```
function vs = smth(v,m,d)
    %smoothing function,
    %v is an array of voltage
    %m is the polynomial size (2, 3, 4 or higher)
    %d is the derivative, 1 is zeroth, 2 is 1st When d=1, just return smoothed
        out original values in accordance with polynomial determined.
    nr = 8; %number of points prior kernel of v ;
    Window size = nr+nl+1 which is 17
                ; in this example
    nl = 8; %number of points after kernel of v
    idx = -nl:nr;
    j = 0:m;
    i = 1:length(idx);
    for i = 1:length(idx), %build up A where Ai,j = i^j as indicated above.
        A(i,:) = idx(i).^j;
    end
        At = A';    ;This is a transpose operator that determines the
                     transpose of the parameter
    AI = inv(A'*A); inv is a function that determines inverse of parameter
    L = length(v);
    for i = nl+1:(L-nr);
        crtI = idx+i;
        f = v(crtI);
        cn = AI*At*f;       ;Above COEFFICIENT EQUATION
        vs(i) = c(d);
    end
    if d == 1,              ; fill in beginning and ending
                              values for window size
        vs(1:nl) = v(1:nl);  ; depending on what derivative is being
                              determined as
                              ;indicated by "d"
        vs((L-nr+1):L) = v((L-nr+1):L);
    elseif d == 2,
        vs(1:nl) = 0;
        vs((L-nr+1):L-1) = 0;
    elseif d == 3, ;This indicates the second derivative
        vs(1:nl) = 0;
        vs((L-nr+1:L-2)) = 0;
    end
    vs = vs(:);   ;Returns array of smoothed voltage
values for the polynomial when d=1;
             ; Returns array of first derivative values corresponding
to voltage values when d=2.
```

Figure 10:
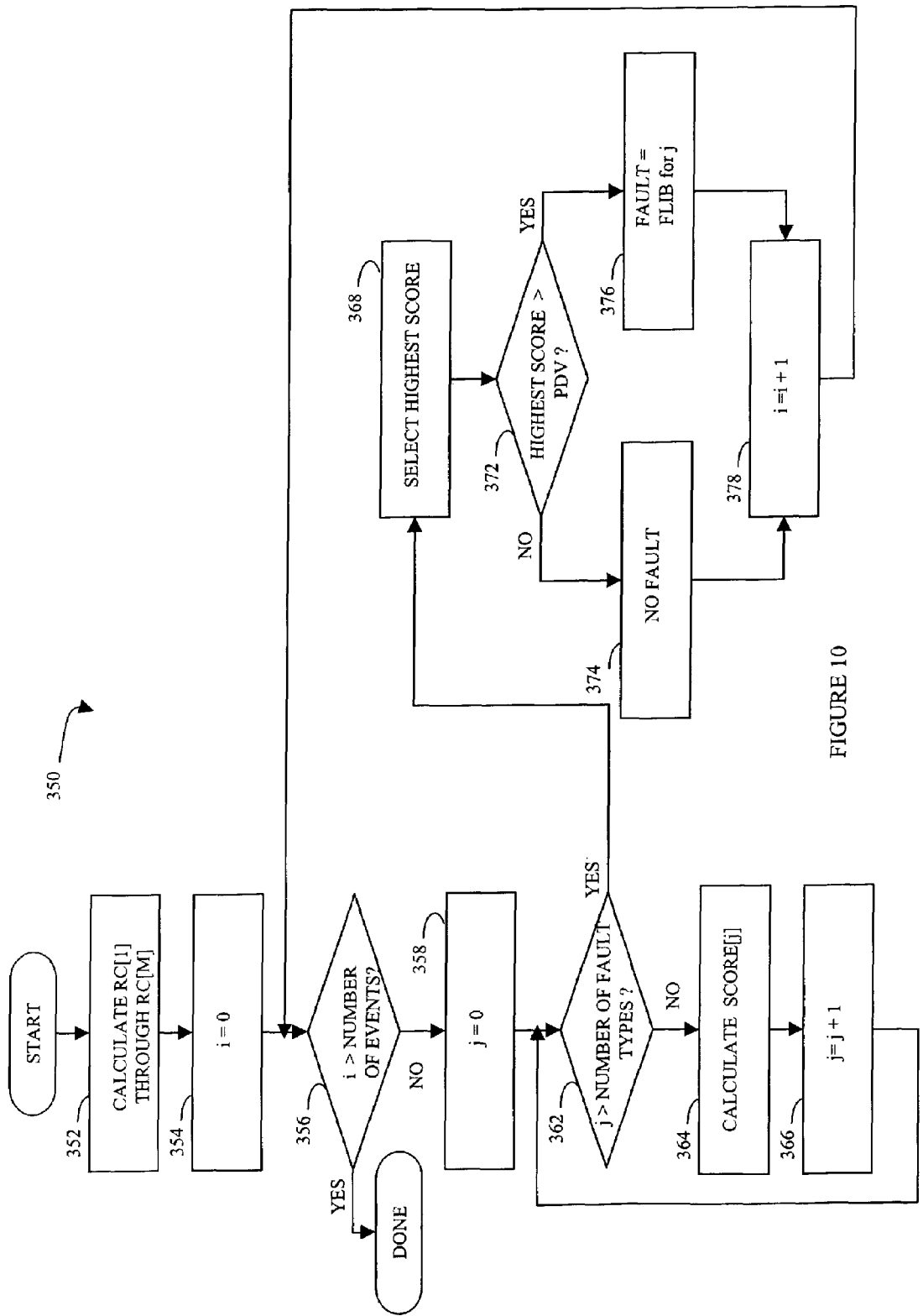
FIG. 10 is a flowchart showing in more detail the processing where each of the events are classified.

Referring to FIG. 10, a flowchart 350 illustrates in more detail the processing performed at the step 322 of the flowchart 300 of FIG. 9A and step 338 of FIG. 9B where each of the events are classified. An event is identified as a finite number of points VC[i] through VC[j] proximate to the event detected at the step 310 of the where, for an embodiment herein, VC[i] (the first point of the event) is greater than the threshold used at the step 310 and VC[i−1] is less than the threshold. For convenience, the points of each event will be referred to using index values one through M.

Processing begins at a first step 352 where the voltage values of the event are converted to reflection coefficient values, denoted herein as RC[1] through RC[M]. A reflection coefficient is simply a scaling of the voltage so that, irrespective of the magnitude of the input voltage, the analyzed signal is the same. In an embodiment herein, voltages are converted to reflection coefficients by dividing the voltage values by the magnitude of the input voltage. Accordingly, assume that the input voltage is VINPUT, then the reflection coefficients, RC[1] through RC[M] are calculated by the formula RC[k] =VC[k]/VINPUT for k=1 through M.

Following the step 352 is a step 354 where an index, i, is set to zero. The index i is used to iterate through the events detected at the step 310 and stored at the step 314 of FIG. 9A. Following the step 354 is a test step 356 which determines if the index variable, i, is greater than the number of events detected at the step 310 of FIG. 8. If i is greater than the number of detected events, then processing is complete. Otherwise, control passes from the test step 356 to a step 358 where another index variable, j, is set to zero. The index variable j may be used to iterate through different fault types stored in a library of fault types. The library of fault types may be stored in the data storage element 52 of FIG. 1 and contain different patterns, each of which corresponds to a particular fault type. The patterns in the library may contain wave form shapes corresponding to wire insulation being cut, the wire being crimped, etc.

Following the step 358 is a test step 362 which determines if the index, j, is greater than the number of fault types stored in the library. If not, then control passes from the step 362 to a step 364 where a score is calculated for the event being analyzed (RC[1] through RC[M]) and the fault type j. For each event, there is calculated a number of scores corresponding to the number of fault types. Calculating the score at the step 364 is discussed in more detail hereinafter. Following step 364 is a step 366 where the index variable, j, is incremented to iterate through different fault types. Following the step 366, control transfers back to the step 362, discussed above.

If it is determined at the step 362 that the index variable j, is greater than the number of fault types, then control passes from the step 362 to a step 368 to select the highest score for event i among each of the scores calculated at the step 364. Following step 368 is a test step 372 which determines if the highest score for the event is greater than a predetermined value (PDV). In an embodiment herein, the predetermined value used at the test step 372 is zero. However, for other embodiments, the predetermined value may be different. The predetermined value used at the step 372 depends, in part, on the formula used to calculate the score at the step 364.

If it is determined at the test step 372 that the highest score calculated at the step 364 does not exceed the predetermined value, then control transfers from the test step 372 to a step 374 where the event i is deemed not to correspond to any fault (i.e., corresponds to noise). That is, if no fault types correlate well with the event (i.e., no fault types generate a high enough score at the step 364), then it is determined that the event does not correspond to any fault type and that there is no fault.

On the other hand, if it determined at the test step 372 that the highest scoring event is greater than the predetermined value, then control transfers from the step 372 to a step 376 where the event is deemed to correspond to a fault having the fault type that caused the highest score. Thus, for example, if fault type number five (i.e. j=5) corresponded to the highest score calculated at the step 364, then the fault for the event set at the step 376 corresponds to fault type number five. Following step 376 and following step 374 is a step 378 where the index variable, i, is incremented to iterate through the different events calculated at the step 310 of FIG. 8. Following step 378 control transfers back to the step 356 discussed above.

Figure 11:
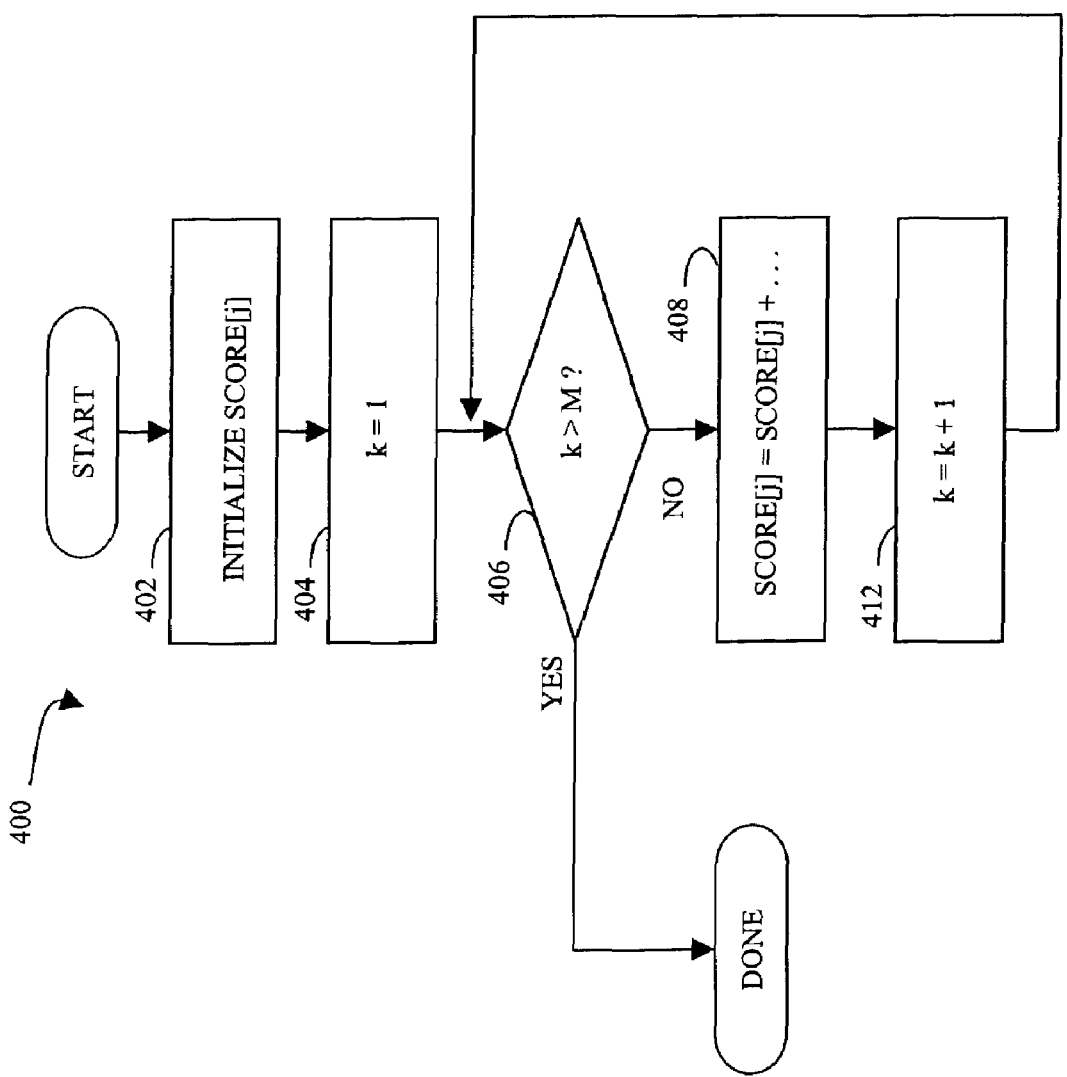
FIG. 11 is a flowchart showing the calculation of the score for each of the faults in the fault library.

Referring to FIG. 11, a flowchart 400 illustrates in more detail calculation of the score for each of the faults in the fault library. Processing begins at the first step 402 where score [j] is initialized. As discussed above, the index variable j is used to iterate through the different types of faults for each event. Thus, score[j] corresponds to the score of the jth fault in the fault library for the event being examined RC[1] through RC[M]. In an embodiment herein, score[j] is initialized to zero at the step 402. However, for other embodiments, it may be possible to initialize score[j] to some other value.

Following the step 402 is a step 404 where an index variable, k, is set equal to one. The index variable k is used to iterate through each of the points of the event RC[1] through RC[M]. Following the step 404 is a test step 406 which determines if the index variable, k, is greater than M, the number of points for the event. If so, then processing is complete. Otherwise, control transfers from the step 406 to a step 408 to calculate the score.

In an embodiment herein, the score is calculated based on the values measured for the event RC[1] through RC[M], the expected values for random (non-fault) noise, the expected values for each fault in the fault library, and the expected variance of the fault pattern values. As discussed above, the fault library contains patterns of different types of faults. In the flowchart 400 of FIG. 11, the fault library is referred to as FLIB[j, k], where the j index is the particular fault in the fault library for which score [j] is being calculated and k is an index to each of the points in the pattern in the fault library FLIB[j, k] that is compared to each point in the event RC[k].

In addition, in one embodiment, there is a stored array, NOISE[k], which corresponds to expected values for a pattern made by random (non-fault) noise. Note that if the event RC[1] through RC[M] corresponds to NOISE[k], then the calculated value of score[j] is expected to be relatively low. There is also an array VARIANCE[k] which indicates the variance of the pattern stored in FLIB[j, k]. Note that a low variance would tend to require the event RC[1] through RC[M] to match the pattern stored in FLIB relatively closely to generate a particular score[j] whereas the same score[j] may be generated by a match between the event RC[1] through RC[M] that is less close if there is a larger variance. In other words, the lower the variance, the more closely an event has to match a particular pattern to generate a particular score.

At the step 408, score[j] is calculated by adding to the previously calculated score[j] using the following formula:

$$score[j]=score[j]+(FLIB[j, k]-NOISE[k])*VARIANCE[k]*RC[k]+$$

$$(\tfrac{1}{2})*(NOISE[k]^2-FLIB[j, k]^2)*VARIANCE[k]$$

Following step 408 is a step 412 where the index variable, k, is incremented to iterate through each of the point of the event RC[1] through RC[M]. Following the step 412, control transfers back to the step 406, discussed above, to determine if the index variable, k, exceeds the value M, the number of points in the event.

In some embodiments, it is possible to take into account the covariance of each of the patterns stored in the fault library. The covariance represents that correlation between each point of the fault library FLIB[j, k1] and each other point FLIB[j, k2], where k1, k2 equal one through M. The covariance may be represented by a two dimensional square matrix, COVJ, for each of the faults in the fault library where each entry COVJ[k1, k2] represents the covariance between FLIB[j, k1] and FLIB[j, k2]. Note that when k1 equals k2, the value of COVJ[k1, k2] equals the variance VARIANCE[k1 or k2]. Note also that there may be a covariance matrix for the noise COVN.

Figure 12:
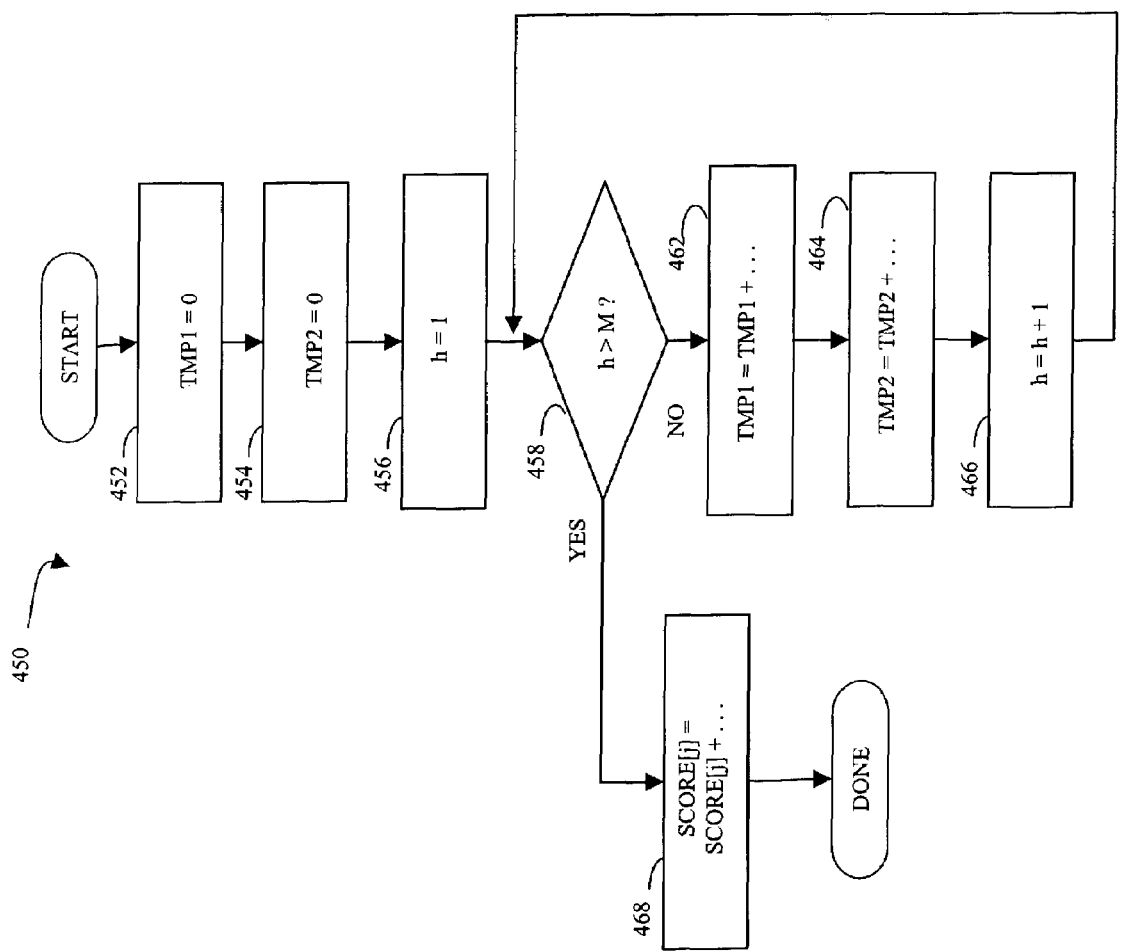
FIG. 12 is a flowchart showing a more generalized calculation for calculating the values for score[j] that takes into account the covariance.

Referring to FIG. 12, a flowchart 450 illustrates a more generalized calculation for calculating the values for score[j] that takes into account the covariance. Processing begins at the first step 452 where a temporary variable, TMP1, is set equal to zero. Following step 452 is a step 454 where another temporary variable, TMP2, is also set equal to zero. Following the step 454 is a step 456 where an index variable, h, is set equal to one. The index variable h is used to iterate through the covariant matrixes.

Following the step 456 is a test step 458 which determines if the index variable, h, is greater than M, the number of points of the event (and in the patterns of the library). If not, then control transfers from the step 458 to the step 462 where TMP1 is calculated using the formula:

$$TMP1=TMP1+COVN[h, k]*(RC[k]-NOISE[k])$$

Following the step 462 is a step 464 where TMP2 is calculated using the formula:

$$TMP2=TMP2+COVJ[h, k]*(RC[k]-FLIB[j, k])$$

Following the step 464 is a step 466 where the index variable, h, is incremented. Following the step, control transfers back to the step 458, discussed above. Once it is determined at the step 458 that the index variable h is greater than M, the number of data points, control transfers from the step 458 to a step 468 where the value of score[j] is calculated using the equation:

$$score[j]=score[j]+TMP1*(RC[k]-NOISE[k])+TMP2*(RC[k]-FLIB[j, k])$$

In some embodiments, it is possible to add the quantity ln(det(COVN)/det(COVJ)) to the final value calculated for score[j] (e.g., after the step 406 in the flowchart 400 of FIG. 11), where det is the determinant (a matrix operation that results in a scalar value). It is also possible to initialize score [j] to this value at the initialization step 402.

Note that, in instances where there is no covariance between points of the waveforms, then the covariance matrixes will contain zeros except on the diagonals (the variance). In such a case, the general case discussed in connection with the flowchart 450 of FIG. 12 collapses into the special case illustrated in connection with the flowchart 400 of FIG. 11 and the equation of the step 408.

Figure 13A:
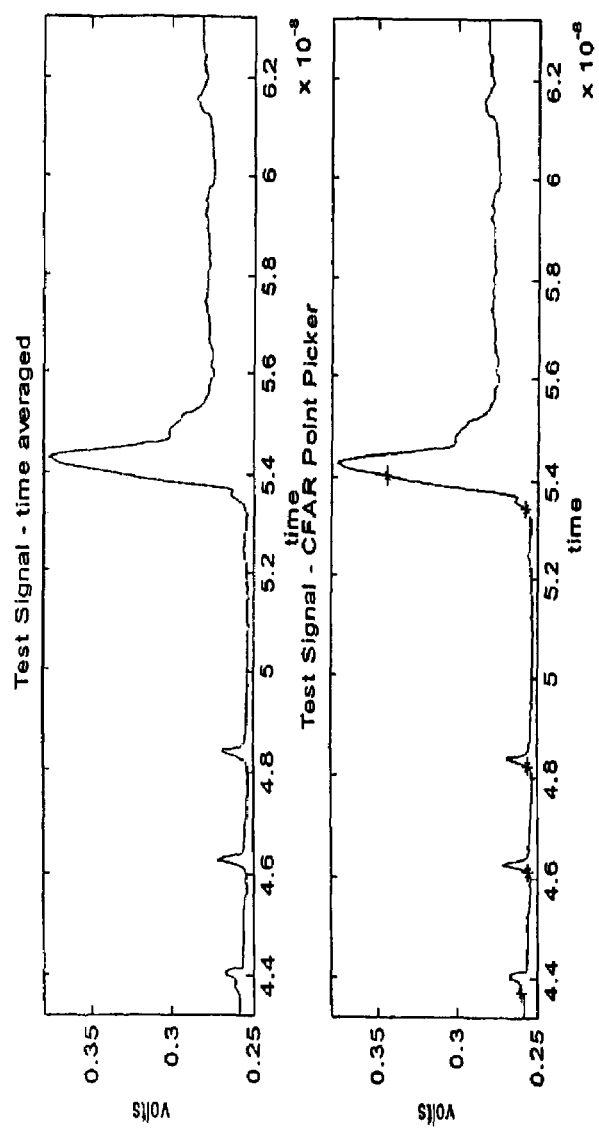
FIG. 13A is an example of a test signal on a cable in which the signal is averaged and variance calculated on the returns and showing identified events of interest.
Figure 13B:
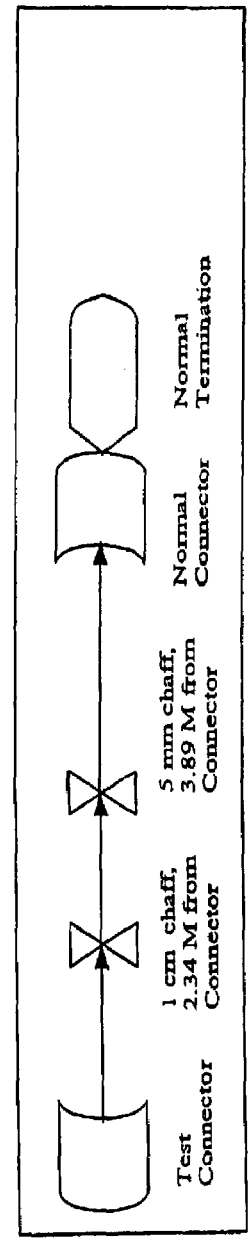
FIG. 13B is an example of a display showing classification and distance information for the identified events after pattern matching and other processing according to one embodiment of the invention.

FIG. 13A is an example of a test signal on a cable in which the signal is averaged and variance calculated on the returns and showing identified events of interest. Five events of interest are identified (marked with a "*") according to the techniques described elsewhere herein and five segments of the signal are indicated as needing to be tested. Each segment is subject to pattern recognition against a library of events as described above. The process continues until all classes of fault have been tested against. FIG. 13B is an example of a display showing classification and distance information for the identified events after pattern matching and other processing according to one embodiment of the invention. As shown in FIG. 13B, two chaffs have been identified, a 1 cm chaff at 2.34 meters from the test connector and a 5 mm chaff at 3.89 meters from the test connector. The other events are the test connector, a normal connector and the normal termination.

The shape of the reflected wave is valuable because it reveals the nature and the intensity of the cable mismatch or fault. Diagnostic and prognostic analysis of a cable fault is effected by event classification pattern recognition and matching techniques described above that are used to compare unclassified events with a stored library of classified events or faults.

Event classification pattern matching utilizes reflection waveform patterns or profiles of events that are stored in a classification or fault library. Unclassified event profiles are compared with the stored reflection profiles for events such as connectors, terminations and faults. Generally, faults fall under two categories: Inductive faults and Capacitive faults. Inductive faults relate to damage to the insulation due to cuts, nicks and breaks. They are called inductive faults because the local wire inductance is larger than the nominal wire, resulting in an increase in characteristic impedance. The capacitive faults relate to damage characteristic of crimps or bends in a wire, where the insulation is "thinned" and the local capacitance increases. This causes a drop in the wire characteristic impedance.

Terminations fall under four basic categories: open, short, inductive short and capacitive short. An open termination could reflect a switch or cut in the wire. A short reflects a termination to ground and is immediately characterized as a fault. Inductive shorts and capacitive shorts could reflect various hardware terminations, such as a fuel probe and can be used for fault classification. For example, for a wire supplying a fuel probe, any termination other than a capacitive short would be a fault.

Event waveform patterns are stored in the library for identifiable terminations and faults (such as cuts, cracks, chafes, dielectric degradation, and bad connectors) and utilized to classify an unclassified event of interest. The input waveform profiles of the unclassified events are normalized, corrected for multiple reflections, and converted to reflection coefficients reflecting the settled voltage. These waveform adjustment steps allow wires of different characteristic impedances to be tested against only one fault library. The use of settled voltage is important in order to have only one library. For example, if the incident voltage were used instead of the settled voltage, a 30-Ohm characteristic impedance wire would have a reflection coefficient of −0.02. Any event detected on this wire would, without using the settled voltage, be interpreted as a short.

In preferred embodiments, the fault library is generated primarily by two methods: empirical testing and analytical modeling.

In the empirical testing method, stored event waveform patterns are generated by empirically measuring reflection waveforms for wires having purposefully manufactured and identified fault events. The measured waveforms are normalized and subjected to other waveform adjustment steps to generate a set of reflection profiles that are stored in the fault library and are suitable for comparison with unclassified events in wires of differing characteristic impedances.

In one embodiment, a number of wire types are sampled over time and one or more faults are intentionally introduced into each wire type. The faults are classified by severity and type (e.g. termination types, connector, etc.). (See, for example, the general schematic set-up shown in FIG. 20, and the defect embodiments shown in FIGS. 24A-G). To generate the stored fault waveform patterns for each fault type, measurements are taken of the reflected waveform profiles for the same fault made multiple times in each particular wire type. The reflected waveform profiles are normalized, processed and corrected as described elsewhere herein. Means values and variances are calculated based on the fault measurements for each wire type. For example, as described above, the variances may be stored in an array VARIANCE[k] which indicates the variance of each the patterns stored in the fault library FLIB[j, k].

Further, in some embodiments, the covariances associated with each the fault patterns stored in FLIB[j, k] may be calculated and utilized in the pattern recognition and matching techniques. As described above, the covariance represents that correlation between each point of the fault library FLIB[j, k1] and each other point FLIB[j, k2], where k1, k2 equal one through M. The covariance may be represented by a two dimensional square matrix, COVJ, for each of the faults in the fault library where each entry COVJ[k1, k2] represents the covariance between FLIB[j, k1] and FLIB[j, k2]. In a preferred embodiment, the covariance matrix COVJ associated with each fault is stored as part of the fault library. However, it is contemplated that the covariance matrix can be stored outside of the fault library in a separate system element that can be utilized as needed in the pattern matching techniques described above.

Figure 14:
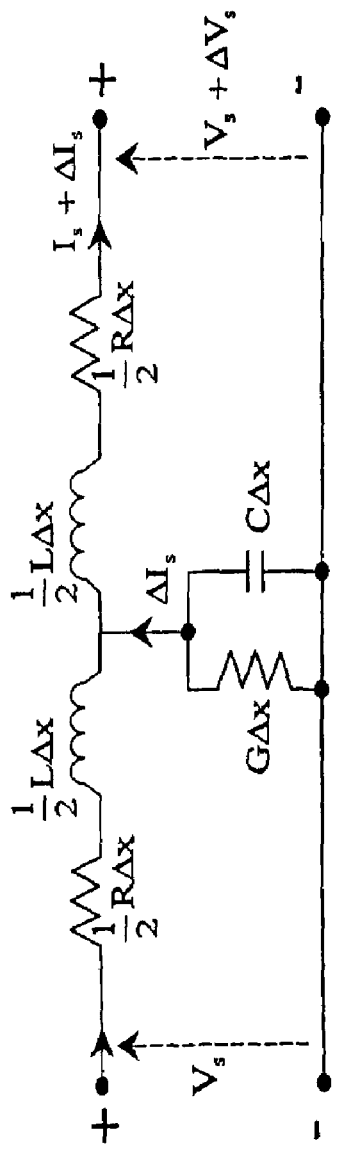
FIG. 14 is a schematic illustration of a general GRLC cable model of an incremental length Δx.

In analytical modeling, modeling load responses allows efficient modeling, detection and location of cable faults or defects. The most general circuit model for cables comprises inductance (L), capacitance (C), shunt conductance (G), and series resistance (R) at each length increment assuming uniform cable properties. FIG. 14 shows a general GRLC circuit model of an increment cable length $\Delta x$.

Applying Kirchoff's law to the circuit yields:

$$V_s(x) = \left(\frac{1}{2}R\Delta x + j\frac{1}{2}wL\Delta x\right)I_s + \left(\frac{1}{2}R\Delta x + j\frac{1}{2}wL\Delta x\right)(I_s + \Delta I_s) + V_s + \Delta V_s \quad \text{EQUATION L1}$$

Letting $\Delta x$ approach zero yields negligible $\Delta I_s$, that is, $$\frac{dV_s}{dx} = -(R + jwL)I_s \quad \text{EQUATION L2}$$

In a similar way, averaging the voltage across the branch and letting $\Delta x$ approach zero, yields:

$$\frac{dI_s}{dx} = -(G + jwC)V_s \quad \text{EQUATION L3}$$

These are the counterparts of Maxwell's differential equations (connecting the electric and magnetic fields). They have a well-known solution:

$$V_s(x) = V_0 e^{-\gamma x} \quad \text{EQUATIONS L4, L5}$$

$$I_s(x) = \frac{V_0}{Z_0} e^{-\gamma x}$$

where, $$\gamma = \alpha + j\beta = \sqrt{(R + jwL)(G + jwC)}$$

$$Z_0 = \sqrt{\frac{(R + jwL)}{(G + jwC)}}$$

With $\gamma$ being the propagation constant of the cable, $\alpha$ the attenuation constant of the cable (in Nepers per unit length), $\beta$ the phase shift (in radians per unit length), and $Z_0$ being the characteristic impedance of the cable. The generator voltage requires a finite time to travel down to a point x. Thus, phase of the voltage moving down the line will lag behind the generator voltage by an amount $\beta$ per unit length. The voltage will also be attenuated by an amount $\alpha$ per unit length due to the series resistance and shunt conductance.

Suppose that a "cable" has an air dielectric between its inner and outer conductors. In such case, the velocity of voltage propagation approaches the speed of light in the cable. Assuming an infinitely long or matched (i.e. has a load equal to its characteristic impedance) cable, the propagation constant ($\gamma$) and the cable characteristic impedance ($Z_0$) allow the computation of the voltage and the current at any distance x of the cable. When the transmission line is finite in length and not matched, the above equations are not satisfied unless a second wave originating at the load and propagating back toward the generator is taken into account. This reflected wave represents the energy that was not absorbed by the load ($Z_L$) as it is different from the characteristic impedance ($Z_0$). The ratio of the reflected wave to the incident wave is called the voltage reflection coefficient ($\rho$) and is given by:

$$\rho = \frac{Z_L - Z_0}{Z_L + Z_0} \qquad \text{EQUATION L6}$$

The reflection coefficient ($\rho$) can be seen as the cable "transfer function" where the input is the incident voltage whereas the output is the reflected (and not the load) voltages. This notion is very practical (by means of the LaPlace transform) to compute the time response of the system under various loads or mismatches, as described below.

In one embodiment, the defect can be accurately modeled as a load mismatch, and for purposes of modeling, it can be assumed that the load is known. Knowing incident voltage ($V_i$), cable characteristic impedance ($Z_0$), and termination load ($Z_L$) permits the analytical determination of the resulting wave at the source (i.e. incident plus reflected waves), according to the following equation:

$$V_0 = (1+\rho) \times V_i = \left(\frac{2Z_L}{Z_L + Z_0}\right) V_i \qquad \text{EQUATION L7}$$

Figure 15:
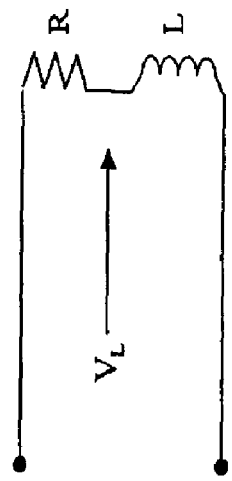
FIG. 15 is a schematic illustration of a model RL series-type mismatch.

Solving this equation, that involves complex impedance, is a classic problem and can be solved in many ways. For example, it can be approached by solving the zero-state response of the system and assuming linearly superimposed natural and forced responses. It can also be solved by applying the Laplace transform to both sides of the equation and then transforming this product back into the time domain. A simpler and more direct analysis involves evaluating the reflected voltage at t=zero and at t=∞ and assuming any transition between these two values to be exponential. In any case, it does not matter how the analysis is done since it will be performed offline to form the system knowledge base. What matters is the correlation (i.e. degree of similarity) between the reflection of interest and the model under comparison. In what follows, the Laplace transform will be applied to a basic example of an RL series model, as shown in FIG. 15. The same approach can be applied to any other model.

The load impedance in this case is given by, $$Z_L = R + jwL \qquad \text{EQUATION L8}$$

Suppose that the incident stimulus is a pulse that can be approximated by a step function (i.e. $E_i$) during the very short time of the impulse rise. Applying the Laplace transform to Equation L7 (i.e. working in the p-domain (complex variable p)) yields, $$V_0(p) = \left(\frac{2Z_L(p)}{Z_L(p) + Z_0(p)}\right) \times \frac{E_i}{p} \qquad \text{EQUATION L9}$$

Where $Z_L(p)$ stands for the Laplace transform of $Z_L$, that is $$Z_L(p) = R + pL \qquad \text{EQUATION L10}$$

For a DC analysis where the characteristic impedance is perceived as a total impedance (e.g. $Z_0 = 50$ ohms), $Z_0(p) = Z_0$. Equation L9, yields, $$V_0(p) = \frac{2E_i\left(\frac{R}{L} + p\right)}{p\left(p + \frac{R + Z_0}{L}\right)} \qquad \text{EQUATION L11}$$

Decompose Equation L11 into simple elements (i.e. zero-poles ratio) that admit well behaved Laplace transforms, $$V_0(p) = \frac{2E_i\left(\frac{R}{L} + p\right)}{p\left(p + \frac{R + Z_0}{L}\right)} = \frac{\alpha}{p} + \frac{\beta}{\left(p + \frac{R + Z_0}{L}\right)} \qquad \text{EQUATION L12}$$

Determining the constants $\alpha$ and $\beta$ is now straightforward. First multiply both sides of Equation L12 by the pole of interest (i.e. multiply by p for $\alpha$, and $$\left(p + \frac{R + Z_0}{L}\right)$$

for $\beta$), then let p tend to such poles. For example, to compute $\alpha$, we multiply both sides of Equation L12 by p and then let p go to zero. This yields, $$\alpha = \left(\frac{2R}{R + Z_0}\right) E_i \qquad \text{EQUATION L13}$$

Similarly, multiplying both sides by $$\left(p + \frac{R + Z_0}{L}\right)$$

and let $\beta$ go to $$-\left(\frac{R + Z_0}{L}\right)$$

yields, $$\beta = \left(\frac{2Z_0}{R + Z_0}\right) E_i \qquad \text{EQUATION L14}$$

Recall that the inverse Laplace transform of a first order 1-pole ratio is given by, $$L^{-1}\left\{\frac{K}{p - p_0}\right\} = K e^{-\left(\frac{t}{\tau}\right)} \qquad \text{EQUATION L15}$$

where τ=1/p₀ is the circuit propagation constant. Thus, the registered voltage at the start of the cable is given by inverting Equation L12 back into the time domain, $$V_0(t) = 2E_i \left\{ \frac{R}{R+Z_0} + \frac{Z_0}{R+Z_0} e^{-\left(\frac{t}{\tau}\right)} \right\}, \quad \text{EQUATION L16}$$

with $\tau = L/(R+Z_0)$

Note that, as mentioned earlier, this could also have been derived using the expected voltage at times t=0 and t=∞ and assuming an exponential decay between the two instants. In fact, at time t=0 the inductor will not accept a sudden change in current; it initially looks like an infinite impedance, and $\rho_0=1$ at t=0. Thus, $V_0(t)|_{t\to\infty}=(1+\rho_0)E_i=2E_i$. Then, the current in L builds up exponentially and its impedance drops toward zero. At t=∞, therefore $Z_L$ is determined only by the value of R (i.e. $\rho_\infty=(R-Z_0)/(R+Z_0)$). Hence, $V_0(t)|_{t\to\infty}=(1+\rho_\infty)E_i=((2R/(R+Z_0))E_i$. Assuming the voltage varies between these two limit conditions with a constant τ=L/(R+Z₀) then Equation L13 follows. The constant τ is set at L/(R+Z₀) because it represents the effective resistance seen by the inductor; that is L divided by R+Z₀ (i.e. R is seen in series with Z₀).

Figure 16:
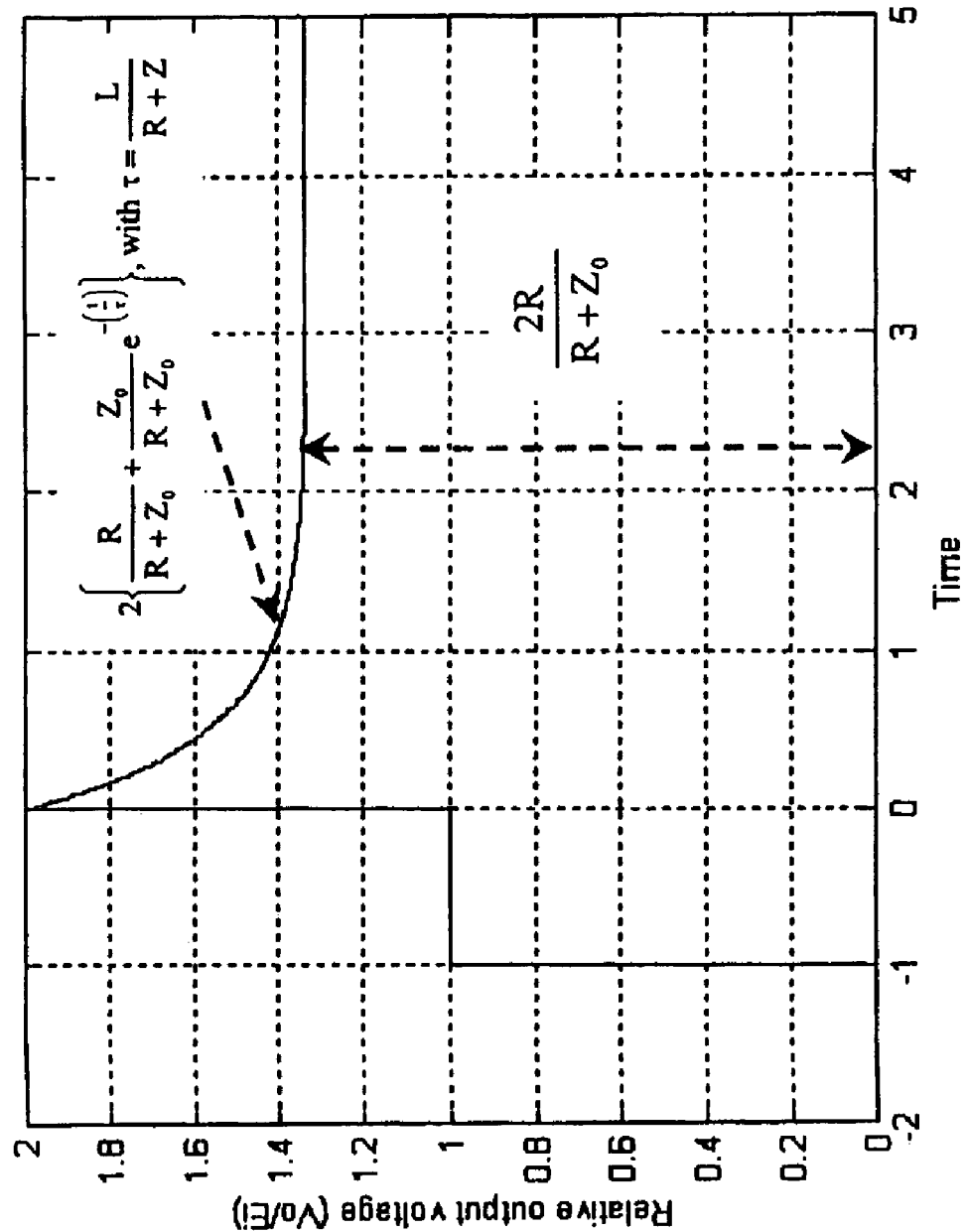
FIG. 16 illustrates a typical time response of an RL series-type mismatch.
Figure 17:
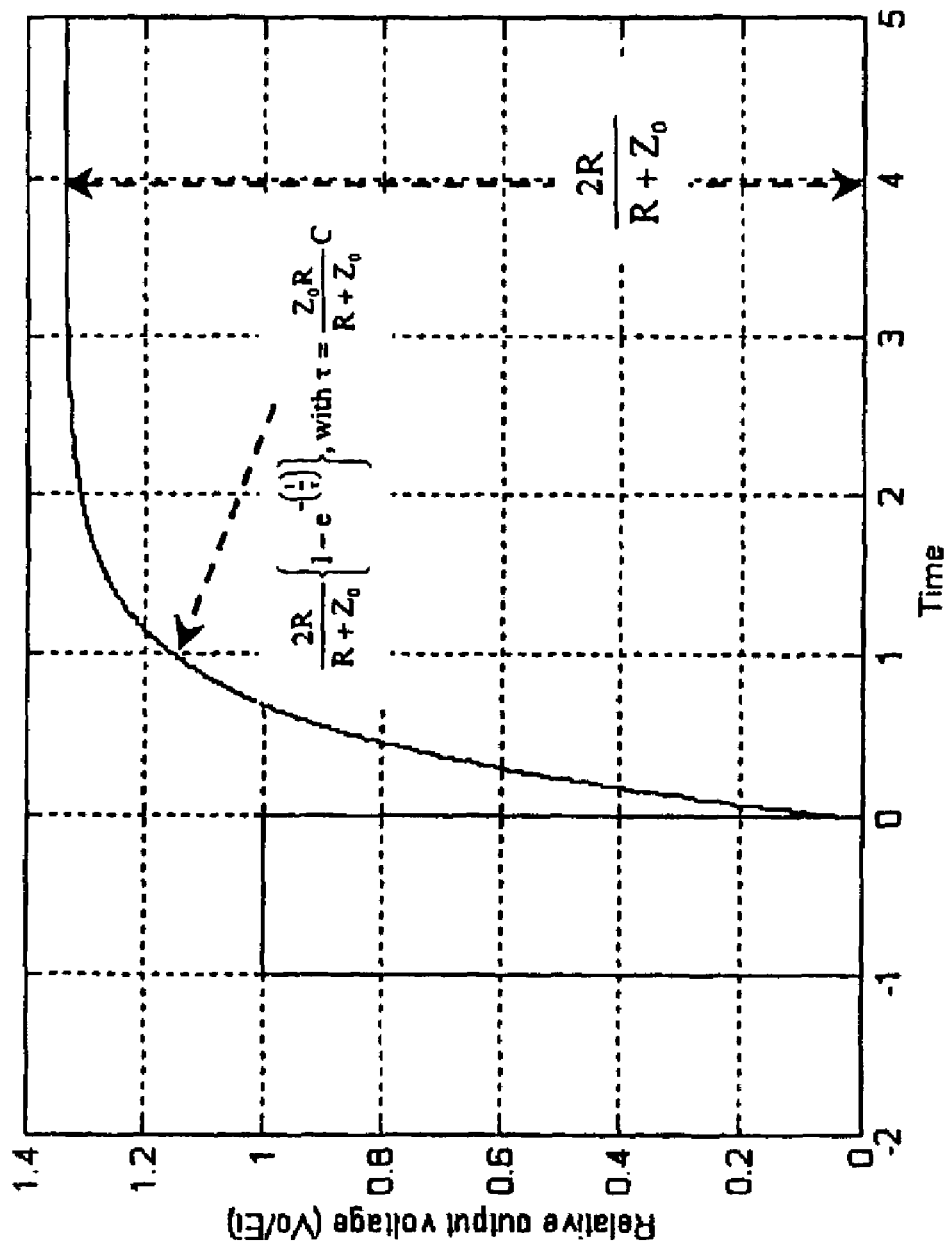
FIG. 17 illustrates a typical time response of an RC parallel-type mismatch.

The time response of the general response of an R–L mismatch (in a DC context) is shown at FIG. 16 (the time origin is supposed when the impulse first reaches the mismatch). It is known that an inductor in series with a resistor provide a good approximation of a cable-sensor connection. Thus, simulating a connection with an RL model is an efficient way to deconvolve the mismatch portion due to the connection and consider only mismatches of interest (due to cable defects in our case). A similar analysis is possible for the case of the parallel R–C termination (see Equation L17 and FIG. 17) and parallel R–L termination (see Equation L18 and FIG. 18).

$$V_0(t) = E_i \times \frac{2R}{R+Z_0}\left\{1-e^{-\left(\frac{t}{\tau}\right)}\right\} \quad \text{EQUATION L17}$$

with, $\tau = \frac{Z_0 R}{R+Z_0} C$ $$V_0(t) = E_i \times \frac{2R}{R+Z_0}\left\{1-e^{-\left(\frac{t}{\tau}\right)}\right\} \quad \text{EQUATION L18}$$

with, $\tau = \frac{R+Z_0}{Z_0 R} L$

Similarly, such analysis may also be performed for the general RLC case.

Figure 19:
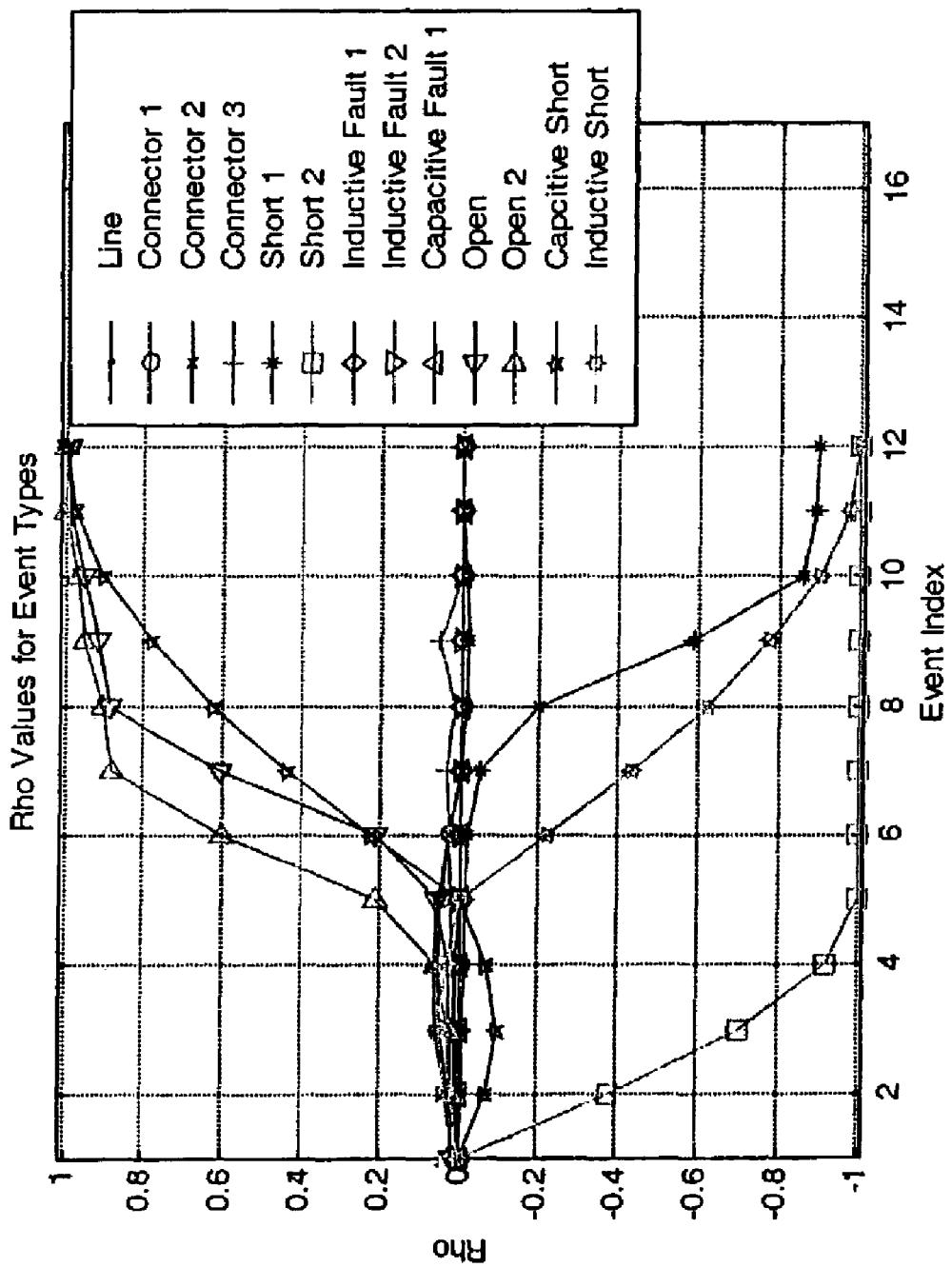
FIG. 19 illustrates the generated reflection coefficient (rho (ρ)) values for event types as stored in the fault library.

In practice, modeling tools such as SPICE can be used to simulate different fault types and generate statistics from these SPICE simulated faults. In one example, as shown in FIG. 19, the following events were simulated. Four non-fault events were developed: Line, Connector Type 1, Connector Type 2, and Connector Type 3. Five fault events were developed: Short Type 1, Short Type 2, Inductive Fault Type 1, Inductive Fault Type 2 and Capacitive Fault Type 1. Four Termination events were developed: Open 1, Open 2, Capacitive Short, and Inductive Short. FIG. 19 illustrates the reflection waveform patterns with generated reflection coefficient (rho (ρ)) values for these event types as stored in the fault library.

With modeling tools such as SPICE, upper and lower bounds may be set for component (RLC) values in the simulation of the faults or other events. By appropriately setting these bounds in multiple simulations, the modeling tool allows the generation of multiple points as the RLC values are varied. This process allows the generation of variances and covariances for the simulated faults so as to correspond with expected system noise, much like in the case of empirically derived event profiles as described above.

What will now be described are wire diagnostics using joint time-frequency techniques such as, for example, wavelets and the Hilbert-Huang Transform (HHT) for wire defect detection and isolation. Using the joint time-frequency techniques, a stimulus is injected into the wire of interest as described in connection with, for example, FIG. 1. As described elsewhere herein, reflectometry may be performed using only one end of a wire under test. The reflected signal that correlates with the wire health and possible defects therein is acquired for further processing. As described in following paragraphs, time-frequency techniques that are multi-dimensional may be used to detect and to locate events, such as insulation defects of coaxial cables. Conceptually, time-frequency cells may provide for better representation of the reflected energy resulting in a sharp identification of embedded features within the signal of interest. The joint time-frequency techniques may be characterized as a 2-dimensional approach and may also be referred to as Time-Frequency Domain Reflectometry (TFDR). TFDR may be more accurate in identifying and locating defect-related signatures than a single 1-dimensional approach, including Time Domain Reflectometry (TDR) and Frequency Domain Reflectometry (FDR). In connection with the TFDR, wavelets and the Hilbert-Huang Transform (HHT) may be used to build time-frequency distributions of signals of interest.

The TFDR techniques described herein may be used in performing, for example, event identification processing 104 and event classification as described elsewhere herein in connection with FIG. 2. The output of the compensation processing 102 of FIG. 2 provides a vector of compensated reflective voltages obtained at various sampling times that may be used in TFDR techniques described herein. Subsequently, the output produced for a wire under test using the TFDR techniques may be compared to baseline conditions to determine and classify an event occurrence. It should be noted as used herein, the term baseline refers to a reference set of data associated with known wire conditions including, for example, a baseline data set for a healthy wire condition and a baseline data set associated with each of one or more particular wire faults, damage states, and the like.

As described elsewhere herein in more detail, wires can be categorized according to many criteria including, for example, type of insulation (e.g. Kapton or Teflon), size and length, or shape (e.g. coaxial or twisted pair). One embodiment may utilize, for example, a Teflon type of insulation in a 0.8-inch-wide, 50-feet-long coaxial cable that may included in an aircraft fuel system. Using reflectometry techniques described in following paragraphs, the reflected signal from a wire of interest is analyzed using time-frequency techniques, such as using wavelets and HHT.

Existing wire inspection systems using reflectometry analyze signals exclusively either in the time domain, using TDR techniques, or in the frequency domain, using FDR techniques. TDR may be employed for signal integrity verification of transmission lines, primarily in high-speed applications. The technique of one embodiment includes two main steps. In a first step, a fast rising DC step pulse, such as less than 50 pS, is injected into the wire of interest. Second, the resulting reflections are acquired and analyzed. As described elsewhere herein, a perfect wire, such as one with no events, generates no reflections. There are two basic types of TDR measurements. The first TDR type, referred to as a single-ended measurement, is performed using a single channel with a TDR step pulse source and a companion receiver for reflection analysis. The second TDR type is a differential measurement performed by injecting two signal sources of opposite polarity into adjacent conductors and analyzing the resulting reflections. As with the single ended technique, each channel consists of one TDR step pulse source and a companion receiver. The differential technique can reveal additional information about parallel conductors inside a common shield including differential impedance between conductors.

Traditional TDR methods have been applied to transmission lines with a predictable impedance profile such as coaxial or twisted pair cables. In these type of cables, changes in impedance along the conductor(s) may manifest themselves as discernable changes in the reflection profile. While TDR works very well in identifying opens and shorts along the length of impedance cables, in the case of damage to the cable insulating material, the defect is much more difficult to detect with the TDR technique. Insulation defects usually have little effect on the TDR step pulse and thus have a little or no effect on the reflection signature. Use of TDR techniques for detection and location of insulation defects presents a challenge in applications, for example, such as in connection with aircraft wiring, in which the wiring may include wiring composed of non-impedance-controlled construction. Furthermore, the effectiveness of TDR diminishes with increased cable length, due to rise time degradation and attenuation loss.

Frequency Domain Reflectometry (FDR) is similar in principle to the TDR technique. FDR uses an RF sweep for wire stimulation, rather than a DC pulse as used in TDR. A portion of the transmitted sweep signal on the cable will be reflected back to the transmitter if the load is not an ideal impedance match such as, for example, in the presence of wire events such as shorts, opens, or any other defect in between. The reflected energy should be at the same frequency as the incident (sweep) signal, but different in phase. The resulting signal (incident +reflected) appears as standing waves on a frequency sweep. Peaks of individual cycles can be translated into distance to the fault through a well-known relation between frequency and distance:

$$D = \frac{c \times V_{op}}{2f} \approx \frac{492 \times V_{op}}{f}$$

where D represents the distance to fault, c designates the speed of light, $V_{op}$ stands for the velocity of propagation of light inside the cable, and f is the frequency of one cycle of the standing wave. Additionally, the peak-to-peak value of the reflection determines the magnitude of the fault. Unlike the TDR technique that uses DC-pulse stimulus thus RF-insensitive, one drawback of the FDR technique is its sensitivity to RF waves.

Accordingly, the TFDR techniques combine aspects of both TDR and FDR that extract and evaluate failure-related signatures from reflections from the wire under test. In one embodiment, reference signatures of a healthy wire and signals associated with particular types of events, such as defects, may be empirically determined, such as by inserting hard failures into a healthy wire, stimulating the wire under test with a predetermined waveform, and then using time-frequency processing techniques to extract failure-related features from reflected signals. It should be noted that the reference signature of a healthy wire may be compared to those of various events to determined the existence of different events. The reference signature associated with a healthy wire may be estimated theoretically from a reflection model or empirically determined from an experimental setup involving a healthy wire.

Figure 20:
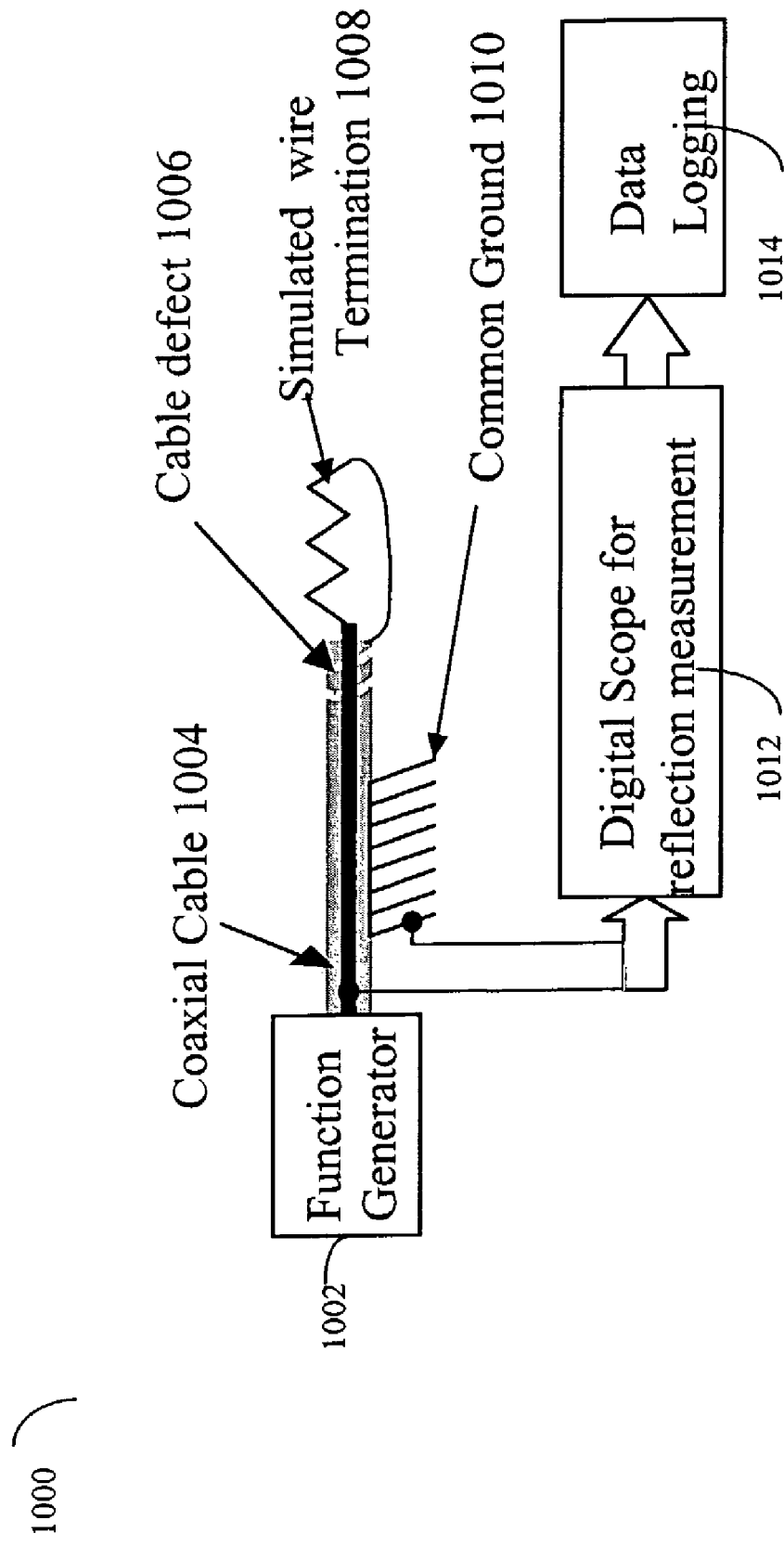
FIG. 20 is an example of an embodiment of a system used for joint time-frequency domain reflectometry(TFDR)

Referring now to FIG. 20, shown is an example of an embodiment 1000 for generating wire stimuli and measuring reflections using the TFDR techniques. The embodiment 1000 may be used in gathering data about specific types of events and as well as in performing subsequent actual testing of a wire. The function generator 1002 generates a stimulus for the wire under test, which in this instance is the coaxial cable 1004. The cable 1004 includes a cable defect 1006 and a simulated wire termination end 1008 with the cable 1004 connected to common ground 1010. The reflection of the cable 1004 is sensed and measured by the digital scope 1012 and data about the events may be logged as part of the data logging unit 1014.

It should be noted that an embodiment may include the function generator or other components to perform processing steps on the reflection measurement(s) obtained as described herein in order to compensate the reflected signals, such as, for example, in connection with attenuation compensation and removing unwanted reflections.

Figure 21:
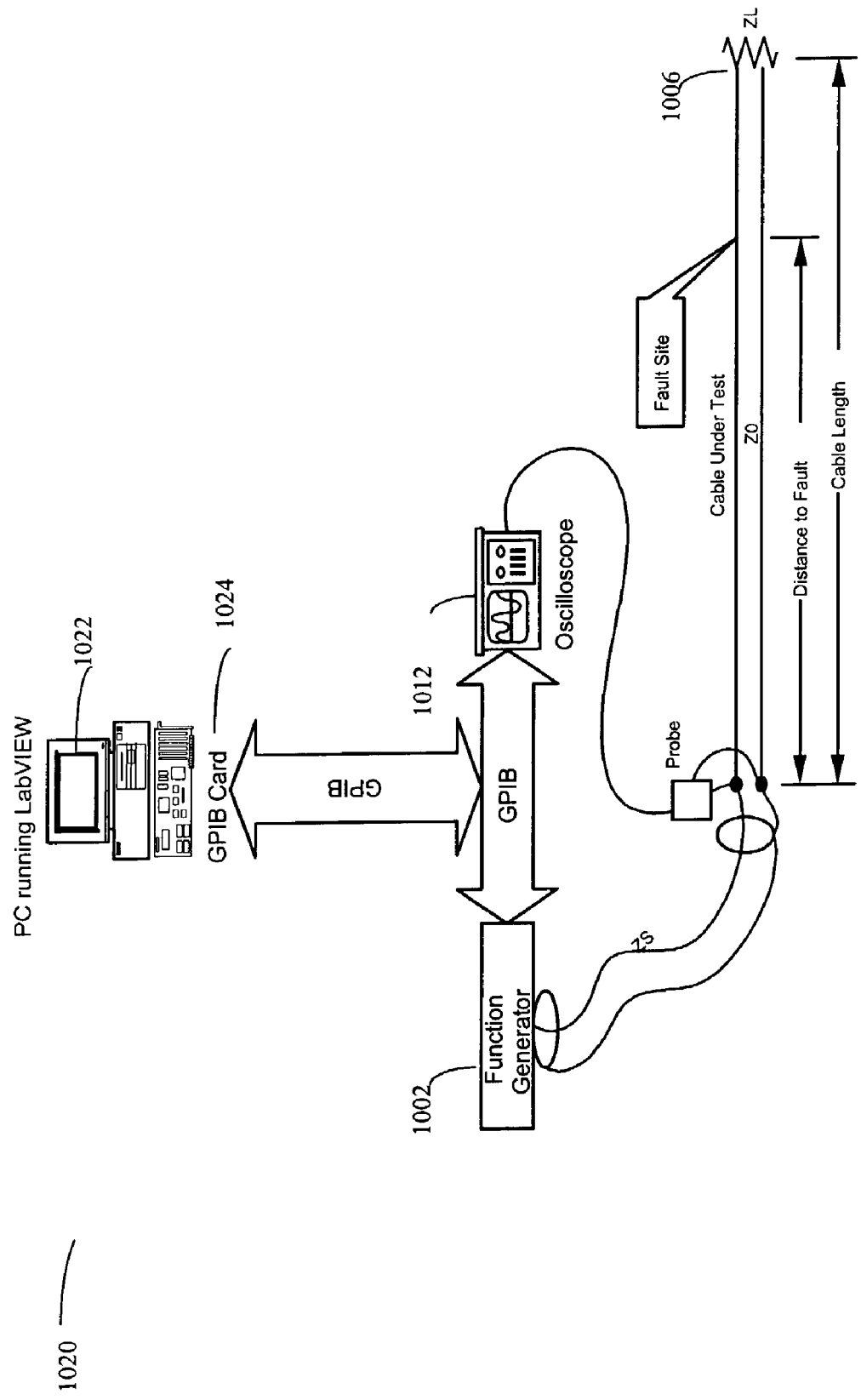
FIG. 21 is a more detailed configuration of an embodiment of FIG. 20.

Referring now to FIG. 21, shown is an example 1020 of a configuration based on the general setup described previously in connection with FIG. 20. In the example 1020, the stimulus signal is generated, transmitted, and read back automatically by software without human intervention in order to minimize measurement errors and to correlate abnormal variations in the reflected signals with wire failures. The configuration 1020 includes a personal computer (PC) 1022 with a GPIB (General Purpose Interface Bus) communication card 1024 and software that controls communications between the GPIB card 1024, the function generator 1002, and the oscilloscope 1012. In this embodiment, the software tool provides control of the function generator and the oscilloscope. A software tool may use any one or more of a variety of software packages, languages, and the like.

In one embodiment, the PC 1022 may be used in performing other processing steps as described herein, for example, in connection with attenuation processing and removing unwanted reflections.

Figure 22A:
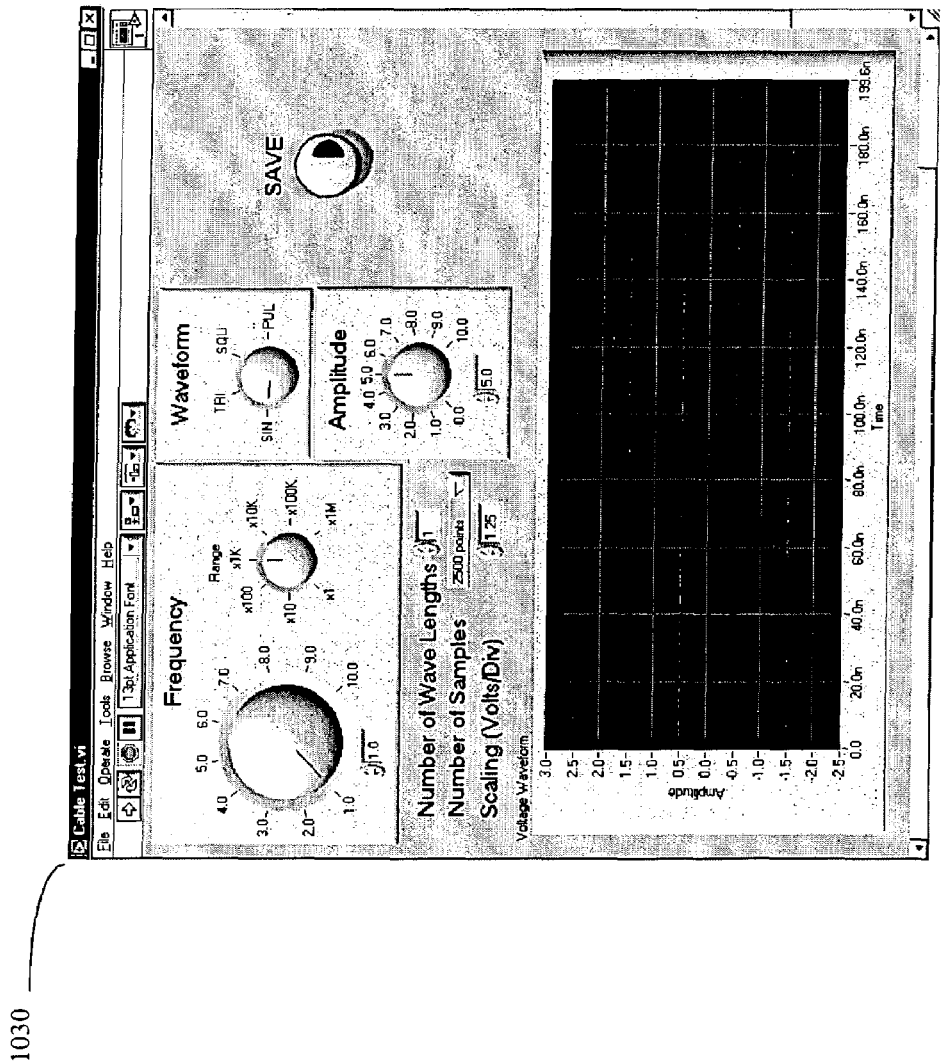
FIG. 22A is an example of an embodiment of a software interface.

Referring now to FIG. 22A, shown is one example of a software interface 1030. In this embodiment 1030, the LABVIEW software product by National Instruments is used. The software interface or graphical user interface (GUI) lets the experimenter select the characteristics of the stimulus, including its shape, frequency, and amplitude, in addition to oscilloscope settings, such as time-base and scaling. Other embodiments may use other hardware and/or software and varying configurations than as described herein.

Figure 22B:
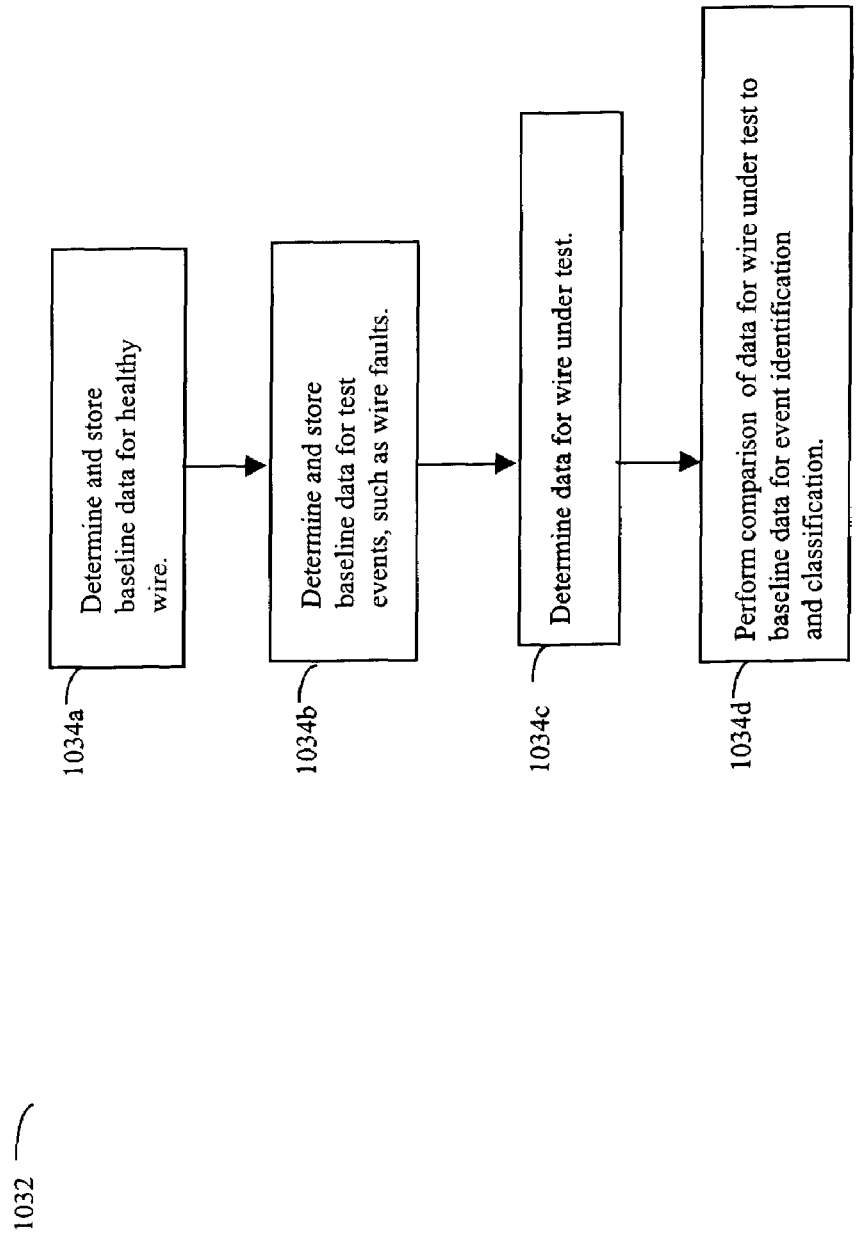
FIG. 22B is a flowchart of method steps of one embodiment for performing TFDR techniques to identify wire events.

Referring now to FIG. 22B, shown is a flowchart 1032 of steps of one embodiment for performing TFDR techniques in connection with identifying wire events. At step 1034a, baseline data for a healthy wire is determined. At step 1034b, baseline data for one or more defects of the wire is determined. This may be determined empirically, as described in more detail elsewhere herein, or using various modeling techniques, as also described elsewhere herein. The data from steps 1034a and 1034b may be stored, for example, in the library 112 of FIG. 2. At step 1034c, sometime later data is gathered for a wire under test for which events, such as a defect, are to be identified. At step 1034d, a comparison is made between the baseline data and the data obtained for the wire under test to identify particular events.

Figure 22C:
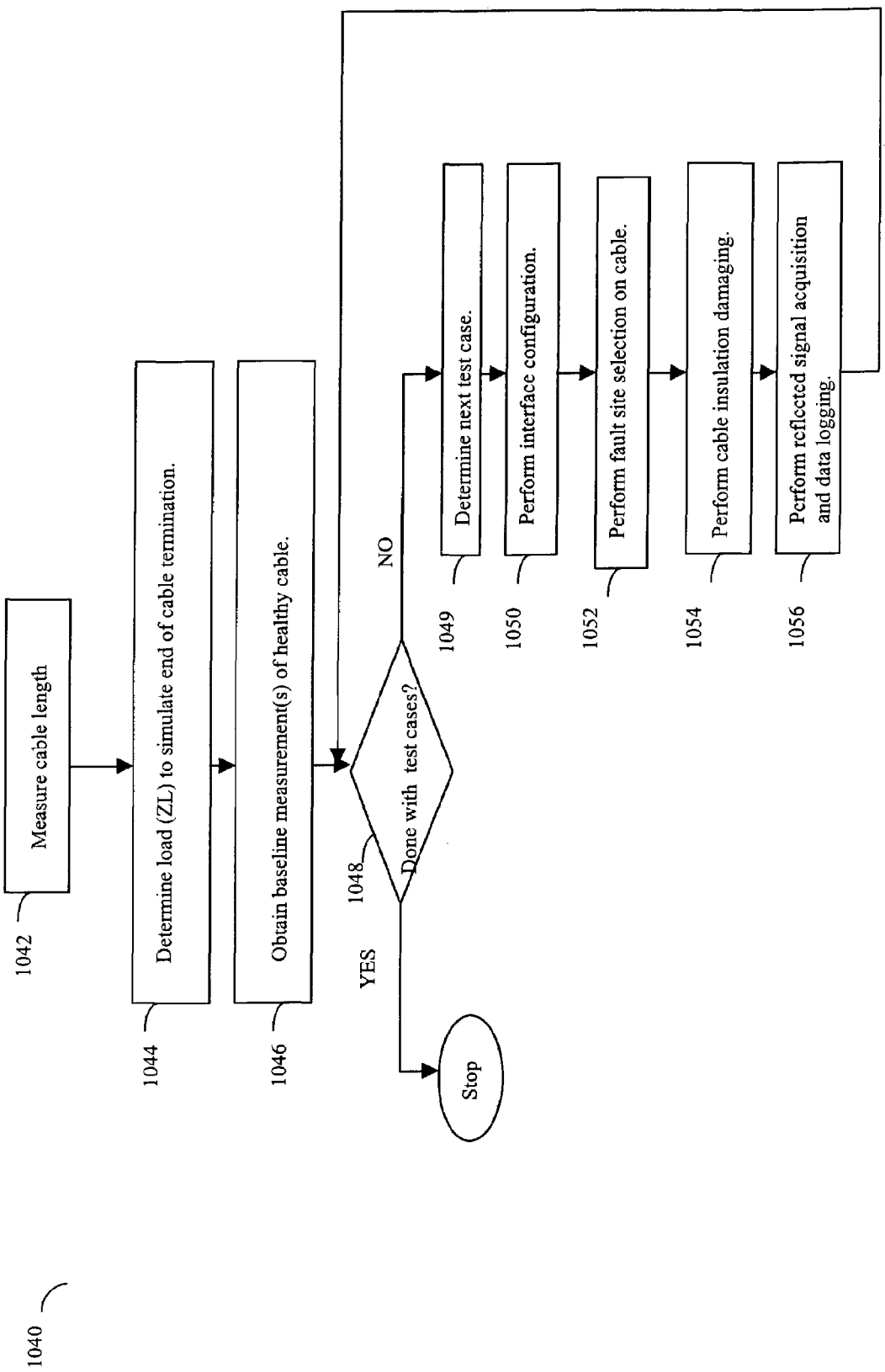
FIG. 22C is a flowchart of methods steps of one embodiment to gather data about wire events and a healthy wire.

Referring now to FIG. 22C, shown is a flowchart 1040 of steps of one embodiment to gather data about different types of events, such as faults, in a wire. Flowchart 1040 shows more detail of processing steps 1034a and 1034b described in connection with FIG. 22B. At step 1042, the length of the cable to be tested is determined. It should be noted that the cable length may be used in performing compensation processing. At step 1044, an appropriate load (ZL) is then added at the end of the cable to simulate the wire termination 1008. This may be used, for example, to simulate a sensor or a subsystem to which the cable 1004 is connected. In one embodiment, a resistor may be used in approximating resistive loads. To build a small database of baselines for reference signatures, several measurements of the "healthy" cable may be taken, as at step 1046, prior to damaging the wire for obtaining defect baseline test case data. At every baseline measurement, the cable may be moved and bent to vary its geometrical configuration. As part of obtaining measurements in connection with a healthy cable and also for test event conditions, an embodiment may also perform processing to remove unwanted noises from the reflective signals, such as, for example, in connection with attenuation processing and removing unwanted reflections as described elsewhere herein. At step 1048, a determination is made as to whether all test cases are complete. If so, processing stops. Otherwise, control proceeds to step 1049 where the next test case is determined. Subsequent steps 1050, 1052, and 1054 relate to settings in connection with the particular test case of step 1049. At step 1050 interface configuration is performed, such as in connection with modifying the settings of the GUI 1030. At step 1052, fault site selection is performed. At step 1054, cable insulation damaging is performed. At step 1056, reflected signal acquisition and data logging are performed. The data may be stored, for example, in the library 112 of FIG. 2. This process is repeated, with increasing damaging conditions, until a given number of defects is reached. It should be noted that an embodiment may perform additional steps or omit one or more of the following in connection with the particular test case for which data is being gathered. The foregoing processing steps may be used in connection with empirically obtaining a set of data to be used in comparison steps for wires under test at a later point in time. Similar to step 1046, an embodiment may also include processing steps to remove unwanted noise, such as in connection with attenuation compensation and removing unwanted reflective signals as described elsewhere herein.

Figure 23:
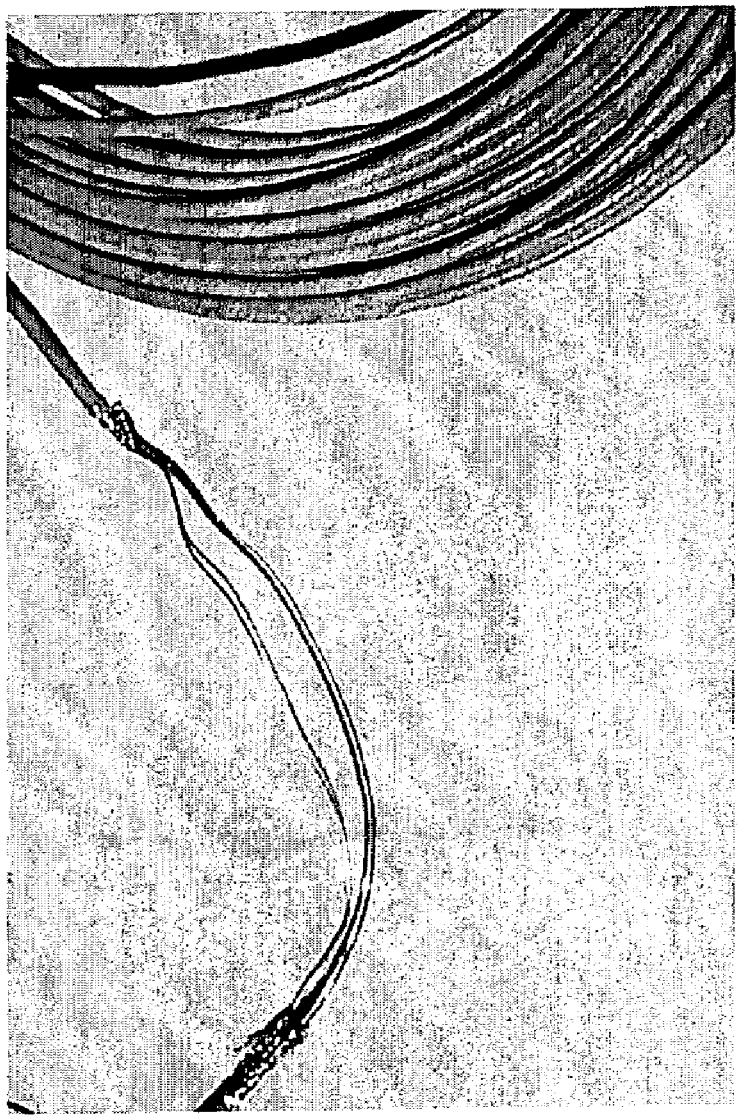
FIG. 23 is an illustration of a cable inflicted with abrasions and damage as measured in processing steps of FIG. 22C.

In one data gathering phase of one embodiment, four "big" abrasions, for example as shown in illustration 1070 of FIG. 23, are inflicted on a cable in which each subsequent abrasion produced a greater amount of damage to the cable than the previous. These abrasions or events of damage to the cable indicate a good correlation between extracted features based on the proposed approach described in following paragraphs and the studied defects. Subsequently, in a second data gathering phase of one embodiment, a broader range of defects are obtained that range in severity from a small cut in the insulation to a 7-centimeter-long abrasion.

Figure 24A:
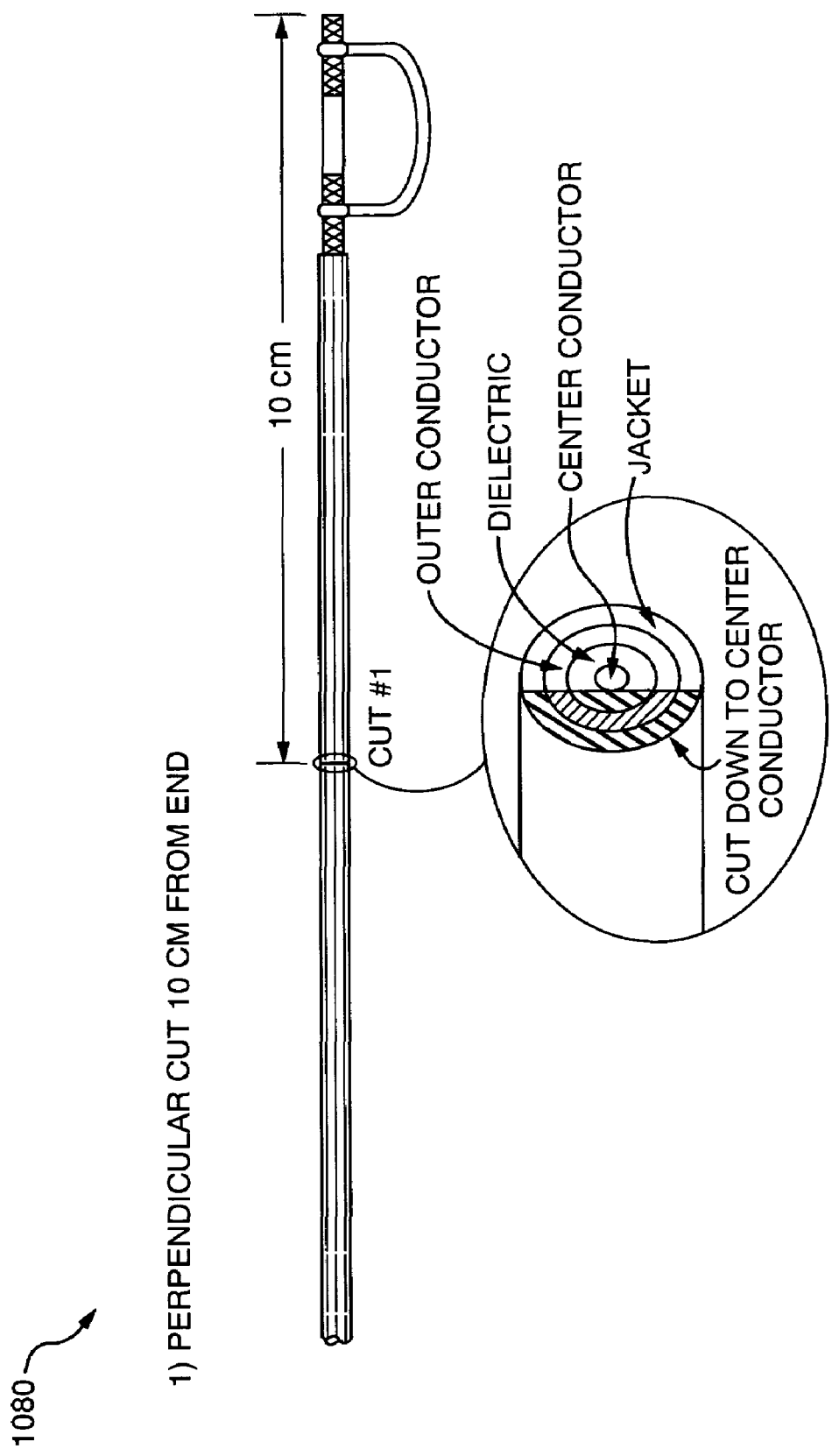
FIGS. 24A-24G are illustrations of different defects in one embodiment for which data is gathered and used for comparison to data for a wire under test.
Figure 24B:
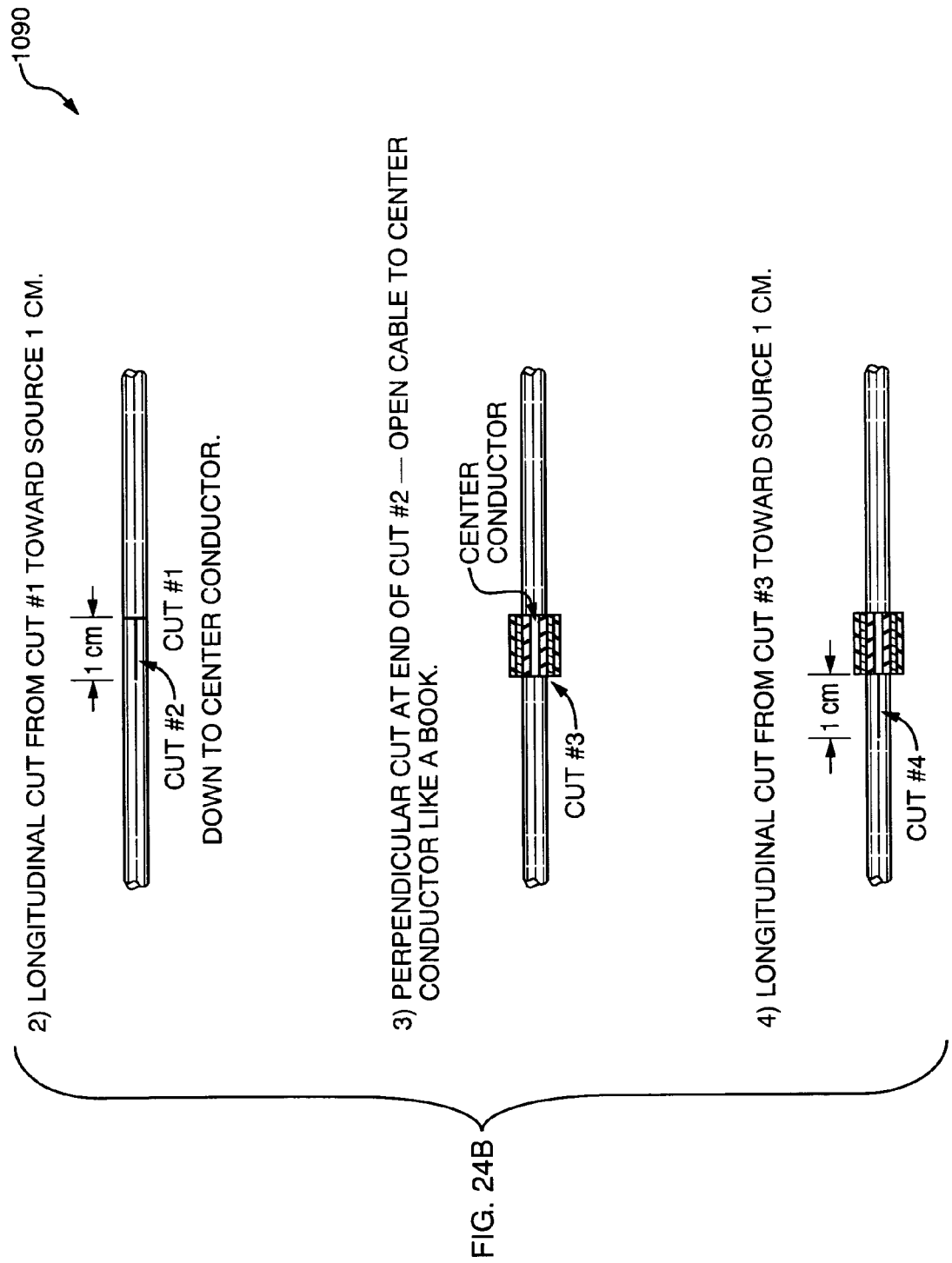
Figure 24C:
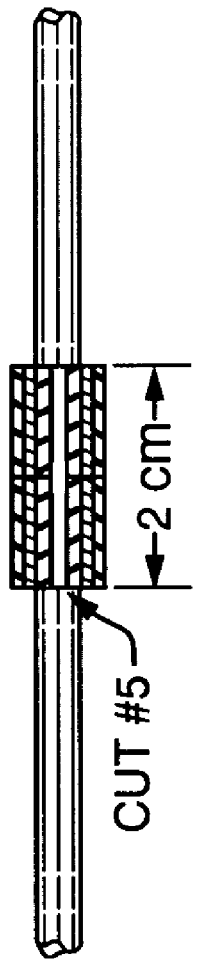
Figure 24D:
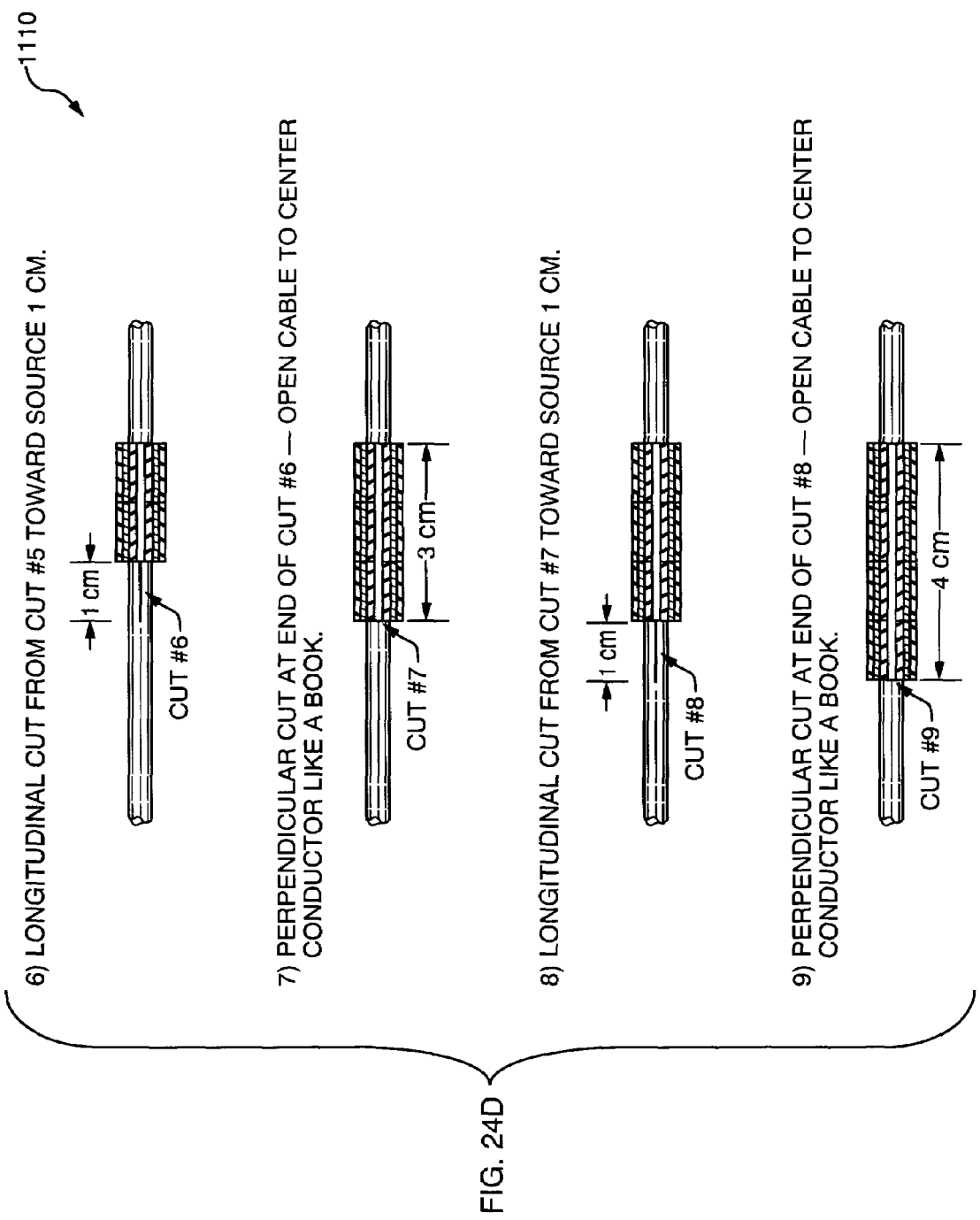
Figure 24E:
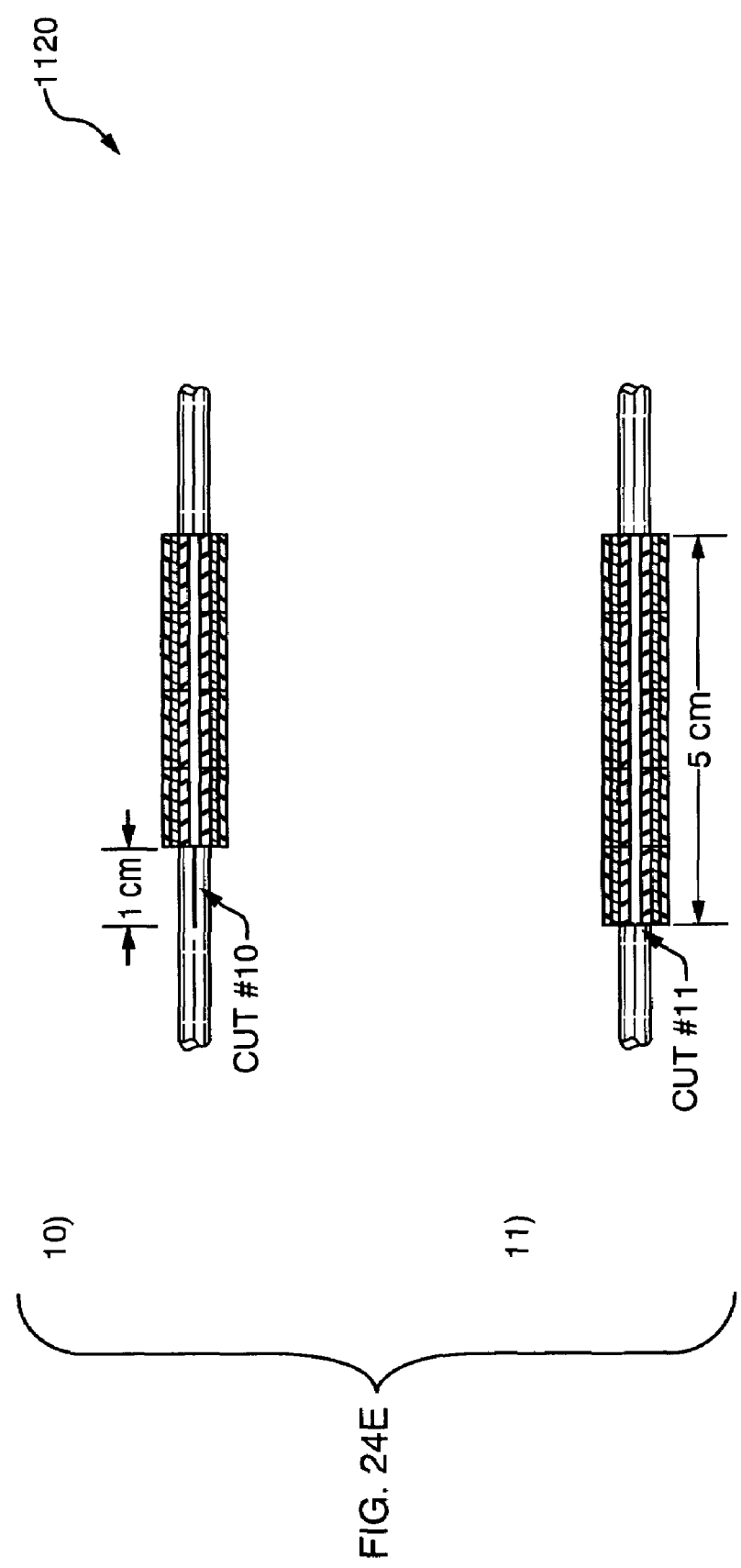
Figure 24F:
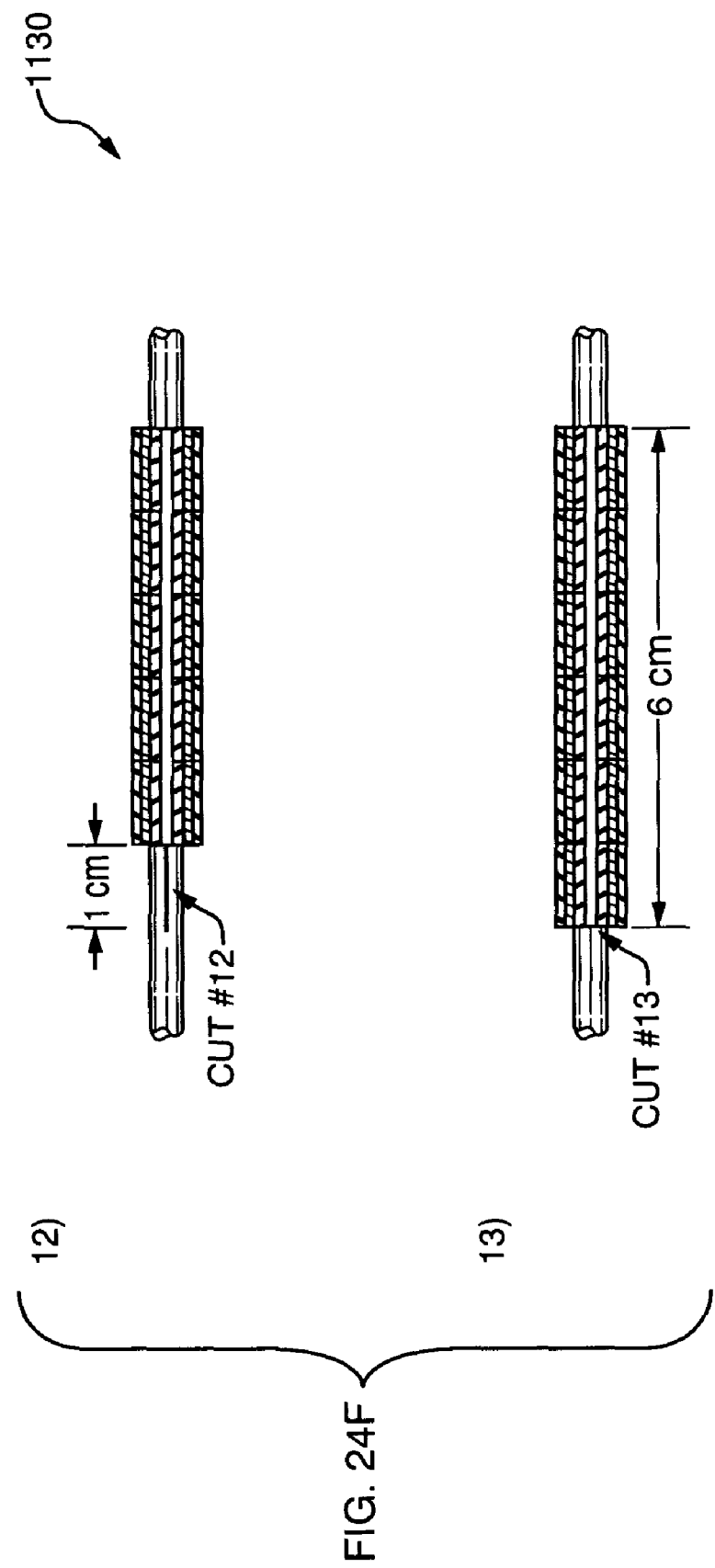
Figure 24G:
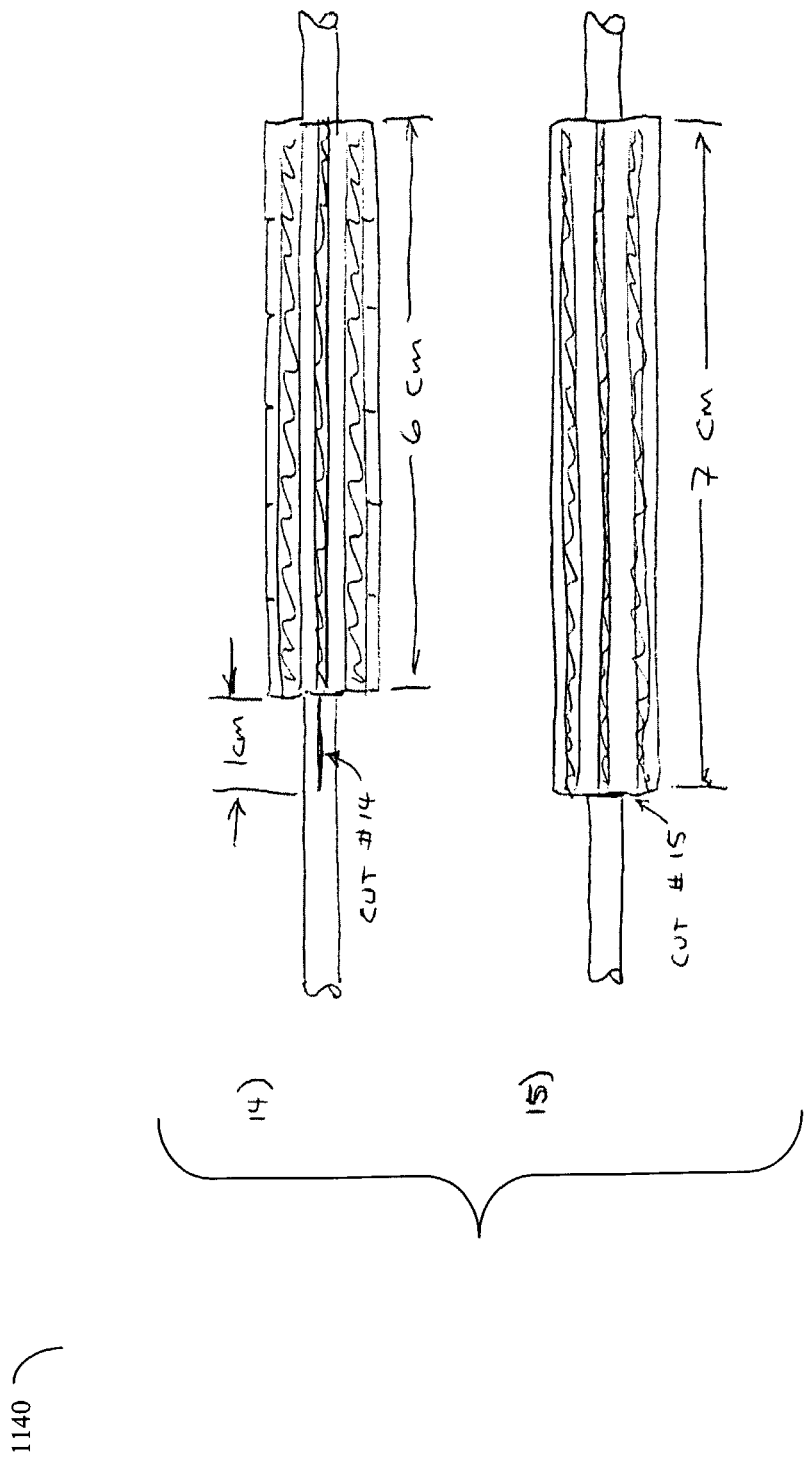

Referring now to FIG. 24A, shown is an example 1080 of a first defect resulting in a perpendicular cut 10 cm from the end of the cable. Referring now to FIG. 24B, shown is an illustration 1090 of additional defects 2-4 made to the cable. These defects include a second defect that is a 1 cm. longitudinal cut toward the signal source with respect to the cut shown in 1080. The third defect is a perpendicular cut at the end of the cut made in connection with defect #2. The fourth defect is a 1 cm. longitudinal cut toward the source with respect to the cut made in defect #3. Referring now to FIG. 24C, shown is an illustration 1100 of additional defect 5 made to the cable. Defect 5 is a perpendicular cut made at the end of the cut of defect #4 that results in opening the cable to the center conductor. Referring now to FIG. 24D, shown is an illustration 1110 of additional defects 6-9 to the cable. Defect #6 is a 1 cm. longitudinal cut toward the source with respect to the cute of defect #5. Defect #7 is a 3 cm. perpendicular cut at the end of the cut of defect #6. Defect #8 is a 1 cm. longitudinal cut with respect to the cut of defect #7 toward the source. Defect #9 is a perpendicular cut at the end of the cut associated with defect #8. Referring now to FIG. 24E, shown is an illustration 1120 of defects 10 and 11. Defect #10 is a 1 cm longitudinal cut with respect to the cut of defect #9. Defect # 11 is a perpendicular cut at the end of the cut associated with defect #10. Referring now to FIG. 24F, shown is an illustration 1130 of defects 12 and 13. Defect 12 is a 1 cm. longitudinal cut with respect to the cut associated with defect #11. Defect #13 is a perpendicular cut with respect to the cut associated with defect #12. Referring now to FIG. 24G, shown is an illustration 1140 of defects 14 and 15. Defect #14 is a 1 cm. longitudinal cut with respect to the cut associates with Defect #13. Defect #15 is a perpendicular cut with respect to the cut associated with Defect #14. It should be noted that other embodiments may use different types of events as part of the data gathering process or phase described herein.

An embodiment may use any one or more of a variety of different waveforms, including sinusoidal, square, chirp, and pulse types, in connection with the stimuli signal sent out on the wire in connection with detection and isolation of cable insulation defects. Additionally, an embodiment may utilize different wave sizes, total number of samples, and different sampling frequencies.

As used herein, two-dimensional joint time-frequency techniques for signal processing, such as wavelets, are inherently more efficient than single-dimensional time-based or frequency-based techniques. Efficiency of such multidimensional techniques relates to the ability to capture transient features exhibiting instantaneous frequency behavior in a limited span of time.

One such two-dimensional TFDR technique utilizes wavelets. Wavelets may be used to extract sharp features localized in both time and frequency. Such features may relate, for example, to hidden embedded structures of the signal of interest due to the adaptive nature of wavelets. In one embodiment, high frequency analysis may be performed using narrow windows, and low frequency analysis may be performed using wide windows. As known to those skilled in the art, the term "window" as used herein may be described as the time and frequency spectrum over which the dilated and translated mother wavelet is not zero.

It should be noted that wavelet analysis is well suited to deal with non-stationary data, as in connection with the cable's defect-related features.

Wavelet analysis may be either continuous or discrete. Continuous Wavelet Transform (CWT) is a "resemblance" measure calculated by continuously shifting a scalable function (i.e. mother wavelet) over the signal of interest and computing the correlation between two signals, the translated and dilated mother wavelet and the signal under analysis. Use of CWT in an implementation scheme may be computationally prohibitive in most of real time applications. In one embodiment, a more practical form of the CWT may be utilized to make the calculation for a limited subset of scales, but at every signal sample.

Discrete Wavelet Transform (DWT) measures the resemblance between the mother wavelet and the signal under analysis only on a limited number of scales (i.e. frequencies) and for a limited number of the signal samples based on powers of two. It should be noted that the DWT may be more efficient and just as accurate as the CWT in most applications. However, the CWT may prove to be superior to the DWT in extracting hidden features structures embodied in the signal of interest.

Wavelet analysis depends on the wavelet function. Different wavelets may be appropriate for different applications. It is typically recommended to select a mother-wavelet function such that the associated digital filter has a small order (to speed up the convolution) and the resulting analysis yields only few nonzero coefficients. In one embodiment in connection with wire diagnostics, the inventors determined that the Mexican hat wavelet exhibited superior performance in feature extraction. An embodiment may prefer to use the CWT in signal analysis because it permits continuous tuning of time and frequency resolutions. Although such continuous tuning may be characterized as computationally expensive, CWT permits the detection of small variations in the frequency signature over time. As a first step into characterizing the 15 cable faults previously introduced, an embodiment may use the following first of two energy-related features:

$$\rho = \sqrt{\frac{\sum_{k=1}^{N}\sum_{s=1}^{S}|C_{sk} - C_{sk}^{Baseline}|^2}{\sum_{k=1}^{N}\sum_{s=1}^{S}|C_{sk}^{Baseline}|^2}},$$ EQUATION WV1 where $C_{sk}$ represents the continuous wavelet coefficients of the signal under test collected over a time-span of N samples and a time-scale (i.e., frequency) span of S scales; and $C_{sk}^{Baseline}$ represents the set of wavelet coefficients of the baseline signal that is associated with a healthy signature.

In the foregoing EQUATION WV1, s ranges the span of scales with a maximum scale of "S". As known in the art, scales are parameters used in connection with wavelet analysis. A scale parameter in connection with wavelet analysis may be characterized as being inversely related to the frequency of interest. Selection of scale parameter values in an embodiment may vary in accordance with the frequency band of interest, hardware, sampling frequency, type of faults being detected, and the like.

The differential wavelet energy ratio ρ is proportional to the deviation of the signature energy with respect to the baseline of a healthy wire in the given time-frequency span (N, S). The higher the deviation ρ, the more severe the fault appears in the cable. For example, a ρ value of 0.1, means that energy deviation of the faulty signature is about 10% the energy associated with that of a healthy baseline signature.

Figure 24H:
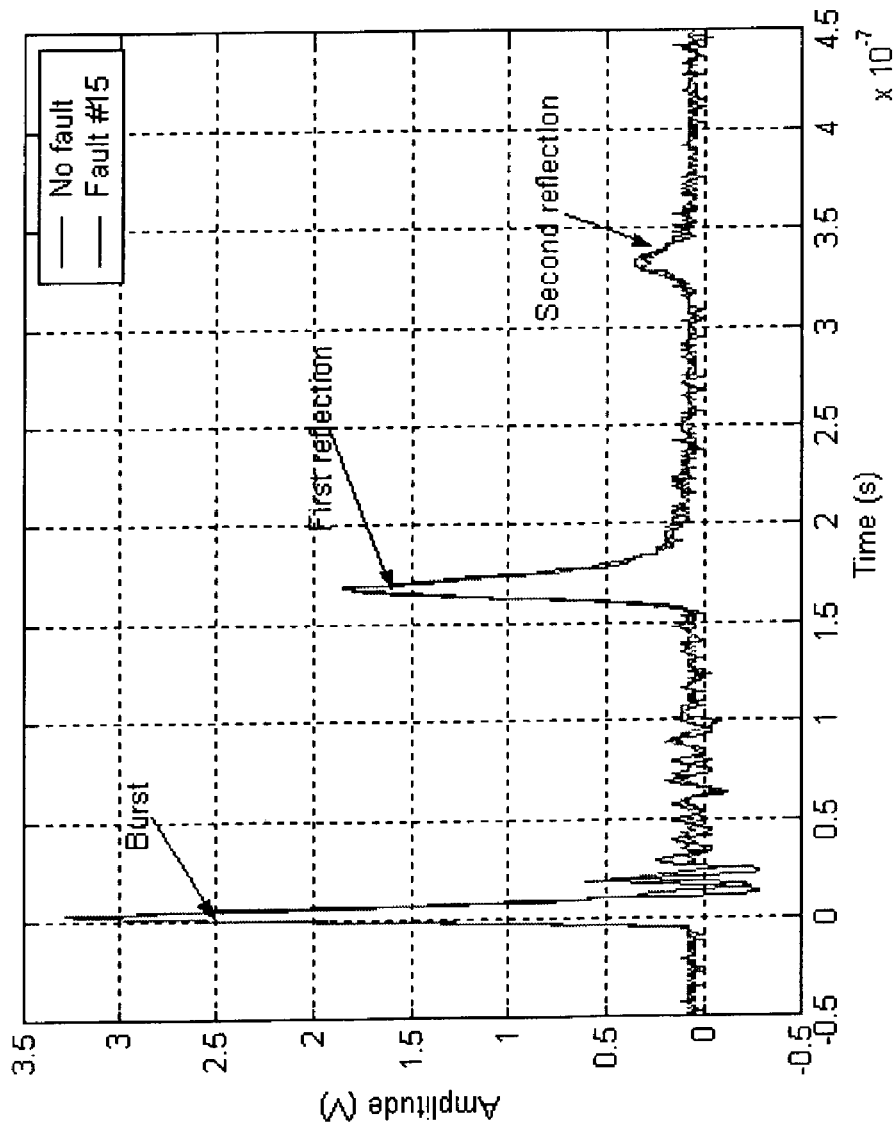
FIG. 24H is a graphical illustration of reflections generated by an eight ns-width pulse and samples at 1-GHZ frequency.

Referring now to FIG. 24H, shown is a graphical illustration 1145 showing the reflections generated by an eight nanosecond width pulse sampled at a frequency of 1 GHZ. The illustration 1145 is referenced below in connection with other figures.

Figure 25:
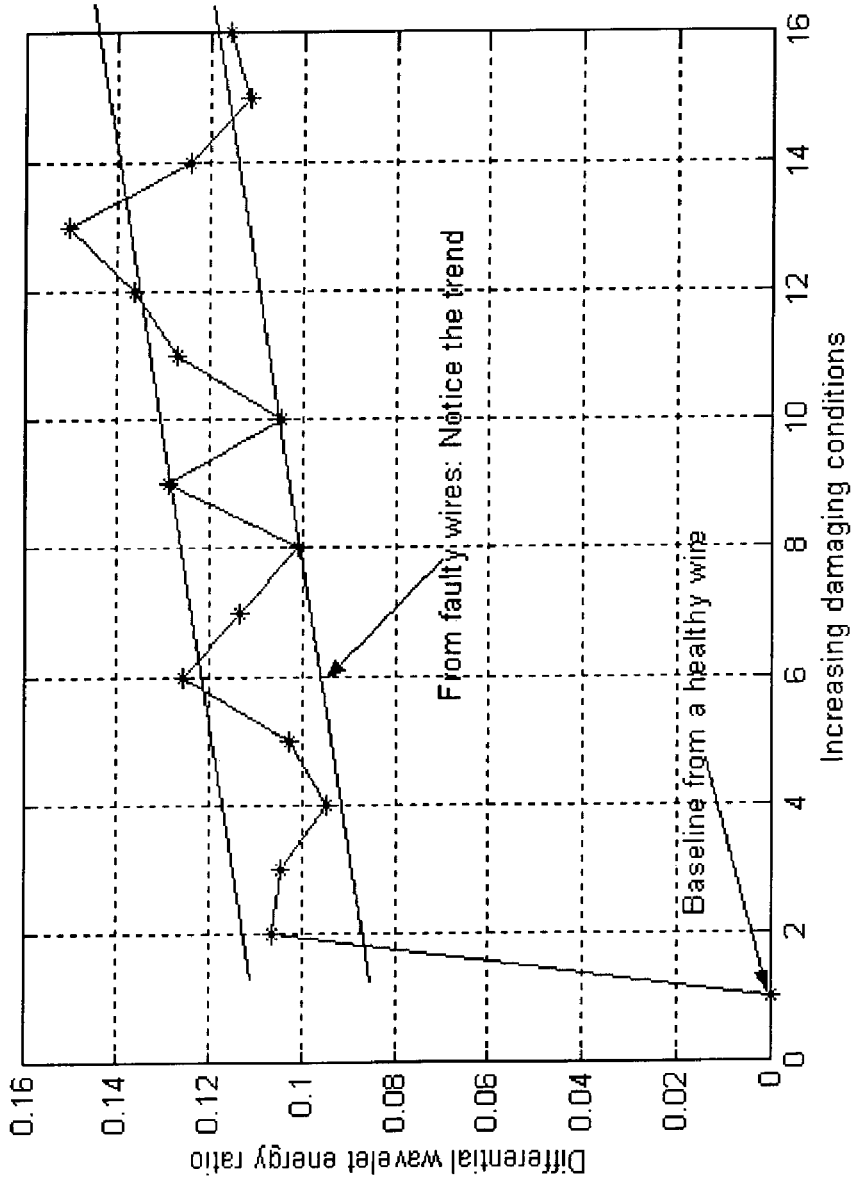
FIG. 25 is a graphical illustration of the variation of the differential wavelet energy ratio versus the fault conditions of FIGS. 24A-24G.

Referring now to FIG. 25, shown is a graphical illustration 1150 of the variation of ρ using the Mexican hat wavelet versus the degree of damage on the wire that equates to the order of the fault as determined by the inventors in one embodiment. Illustration 1150 plots the differential wavelet energy ratio versus fault-sizes computed using the pulse stimulus of the FIG. 24H over a time-span of 0.5 microseconds and a frequency band of 0.1 to 5.6 MHz.

Figure 18:
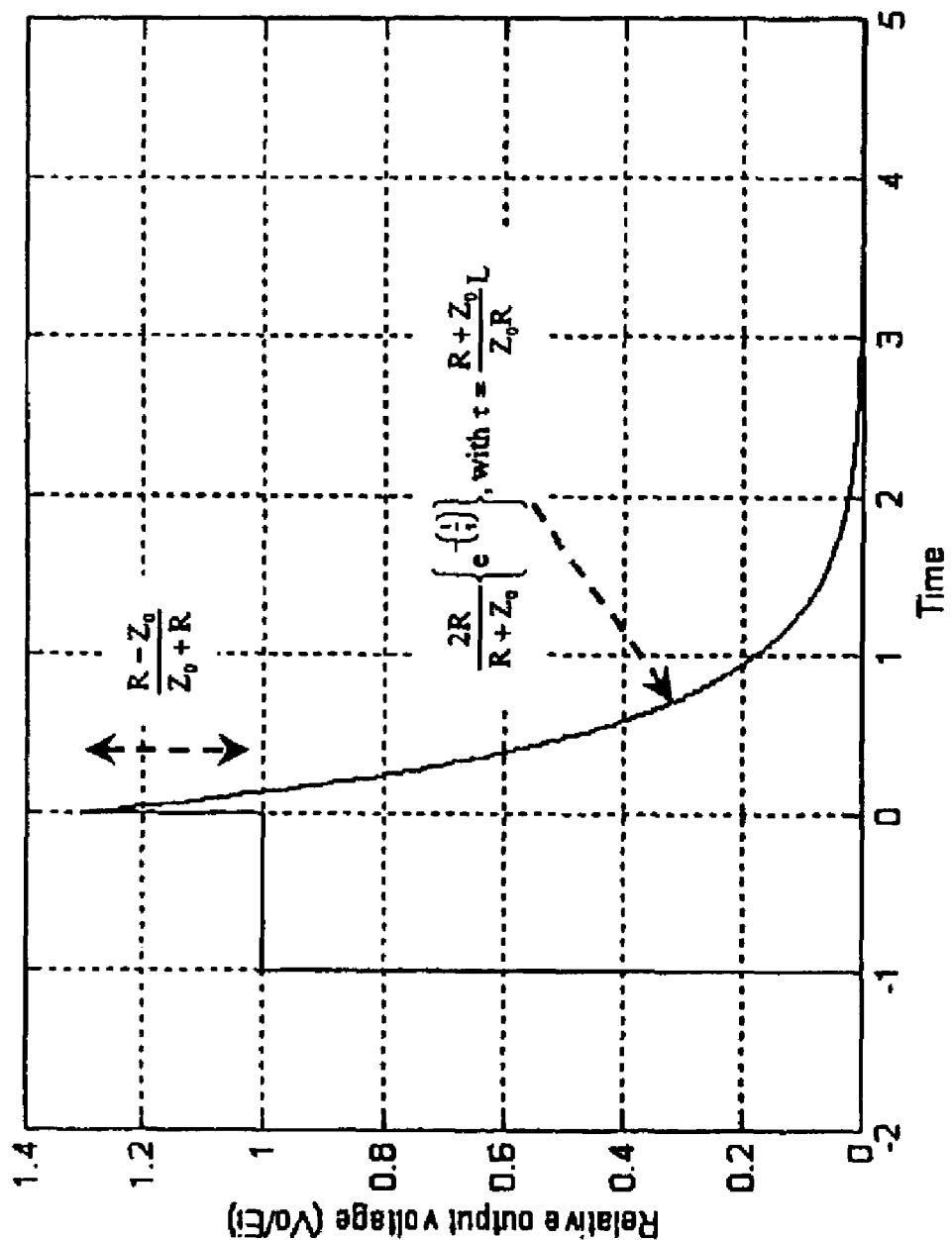
FIG. 18 illustrates a typical time response of an RL parallel-type mismatch.

The Defect number is shown in the X axis, ranging from Defect #2 being the smallest or least severe defect to Defect #15 being the most severe. These Defect numbers refer to the defects described elsewhere herein. Ideally, ρ should linearly increase with the relative degree of damage on the wire described by the previous fifteen faults. FIG. 18 shows the gap between a failure and a non-failure case. Though not linear, the increasing trend of ρ versus fault size is in agreement with the determination and detection of cable events using the TFDR techniques.

In one embodiment used by the inventors, the following wavelet-based feature indicated an increased event detection power and higher sensitivity to the size of the failure than the above measure ρ of EQUATION WV1.

$$\delta = \sqrt{\frac{\sum_{k=1}^{N}\sum_{s=1}^{S}\left|\frac{\partial C_{sk}}{\partial s} - \frac{\partial C_{sk}^{Baseline}}{\partial s}\right|^2}{\sum_{k=1}^{N}\sum_{s=1}^{S}\left|\frac{\partial C_{sk}^{Baseline}}{\partial s}\right|^2}}$$ EQUATION WV2

The feature δ is the local wavelet energy ratio of the signature of interest with respect to the baseline of a healthy signature. The "local" nature of wavelet-based signature relates to the partial derivative of the signal energy with respect to the time-scale s (i.e. inverse frequency). It should be noted that "s" and "S" are defined as in connection with the description of EQUATION WV1. The foregoing parameter δ may be characterized as considering irregularities (or entropy) in the distribution of the signal energy. For example, a value of 0.25 of δ means that the signature under investigation exhibits 25% degree of irregularity more in its energy distribution compared to that of a healthy or non-defective baseline. This feature may be used to detect the weakest frequency deviations. However, it should be noted that such a feature may be more sensitive to noise.

Figure 26A:
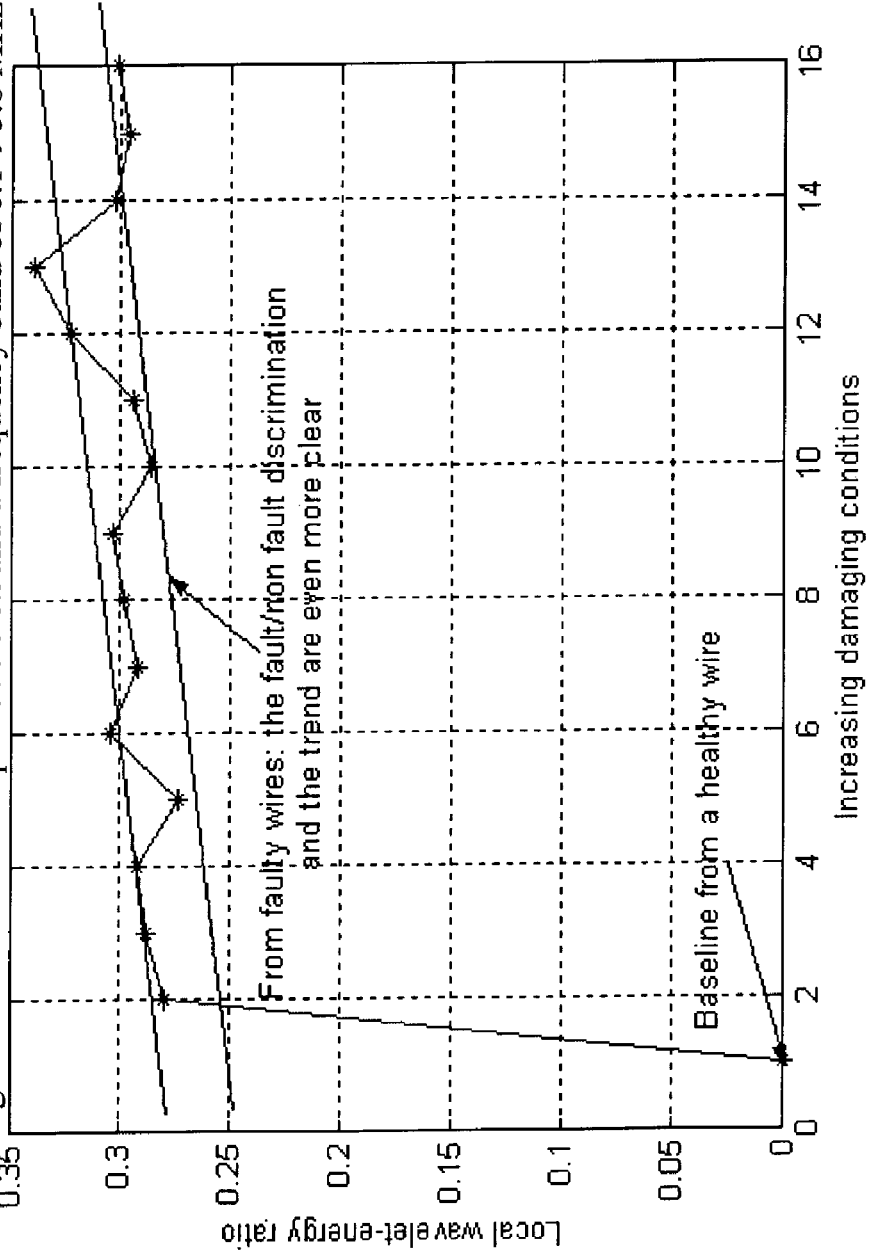
FIG. 26A is a graphical illustration of the local wavelet energy ratio versus the fault conditions of FIGS. 24A-24G.

Referring now to FIG. 26A, shown is a graphical illustration 1160 indicating the variation of δ versus the associated damaging condition defect number similar to 1150. Illustration 1160 depicts local wavelet energy ratio versus fault-sizes computed using the pulse stimulus of the FIG. 24H over a time-span of 0 to 0.5 and a frequency band of 0.1 to 5.6 MHz. Note that the order of magnitude of δ is about 3 times the order of magnitude of ρ (i.e. 0.3 versus 0.1) indicating that in some embodiment, δ may be more effective in detecting events, such as failures, than ρ.

Figure 26B:
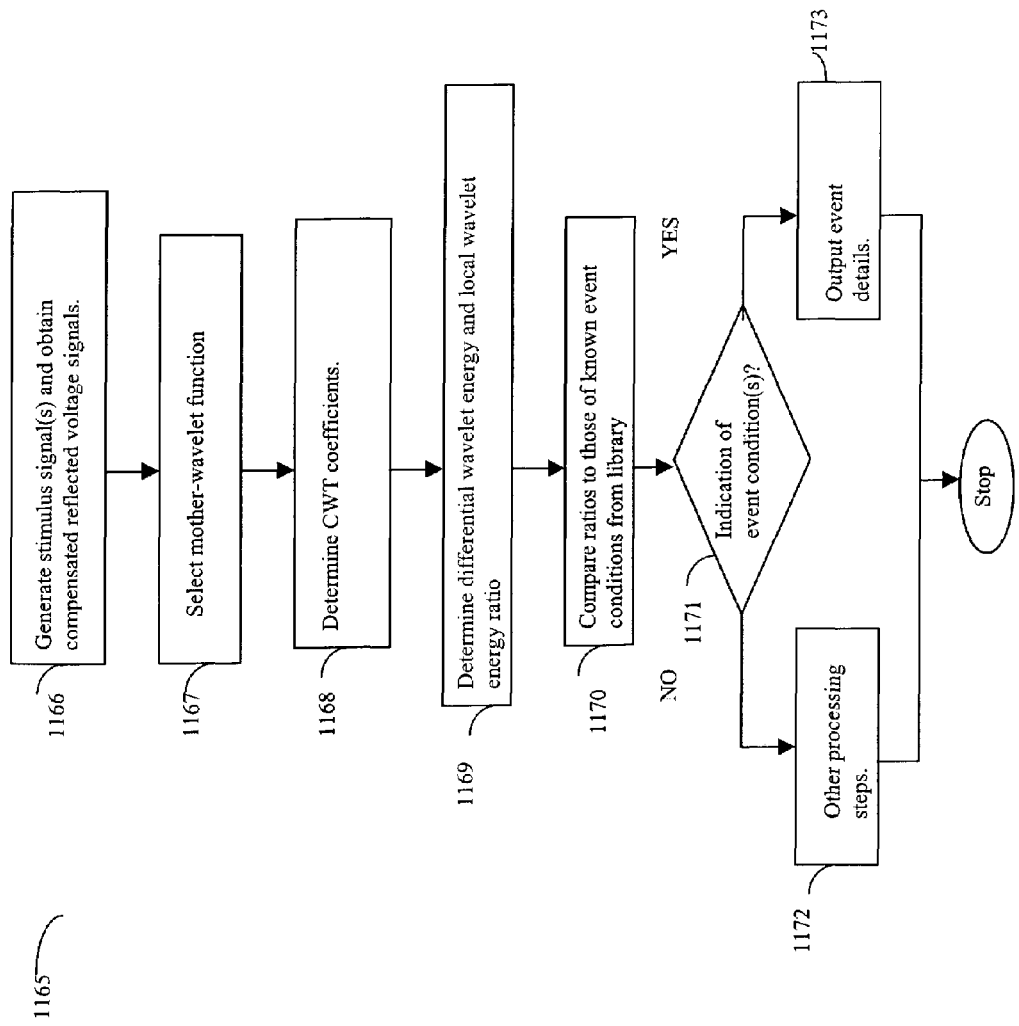
FIG. 26B is a flowchart of steps of one embodiment summarizing the wavelet TFDR technique.

Referring now to FIG. 26B, shown is a flowchart 1165 of steps of one embodiment summarizing use of the wavelet TFDR technique described herein for determining wire events for a wire under test. It is assumed that previous baselines of known wire events and healthy wire conditions have been determined. At step 1166, the stimulus signal is generated for the wire under test, and the reflected voltages are obtained and then may be compensated. The compensated reflected voltage signals may be obtained, for example, as an output from compensation processing 102 of FIG. 2. It should be noted that an embodiment may also not perform compensation processing as a previous step depending on the application, amount of noise, and the like. An embodiment may also generate one or more different types of stimulus signals. For example, one embodiment may generate pulse signals. An embodiment may also generate a stimulus signal using a wavelet function as described herein. At step 1167, the mother wavelet function is selected for processing the compensated reflective voltages.

At step 1168, the CWT coefficients are determined. At step 1169, the differential wavelet energy and local wavelet energy ratio are determined. It should be noted that an embodiment may use other features than those of step 1169 in this particular embodiment. At step 1170, the ratios for the wire under test are compared to the ratios of known event conditions, for example, as may be stored in the library 112 of FIG. 2. At step 1171, a determination is made as to whether an event condition is indicated in accordance with known event data previously obtained and stored in the library. Of so, control proceeds to step 1173 where event details may be output to the user. Otherwise, control proceeds to step 1172 where other processing may be performed. Step 1172 processing may include, for example, a message that a wire event or condition could not be determined.

As described in connection with flowchart 1165, the time-frequency signatures of the wire under test can be compared to the library of time-frequency signatures for classification. After canceling the effect of the cable length (e.g. via cable equalization) and other artifacts (e.g. omit multiple reflections via backscattering) 2-D signatures (in a time-frequency plans) can be compared point by point to look for the best fitting match between the known conditions and the data of the wire under test. If, for example the best fitting data curve that matches the data obtained for a wire under test corresponds to a healthy wire, then there is no failure. If the best fitting corresponds to a particular type of failure, such as a "negative bump-type" of failure, then the processing of step 1173 may determine an associated cause or diagnosis such as, for example, that the cause is likely to be a wire short. It should be noted that there are many other ways of comparing signatures for the final goal of classification, for example, such as those that may be applied at a specific limited time span and limited frequency spectrum rather than comparing each point, or a point every predetermined interval.

It should be noted that an embodiment may use the techniques of parametric classification as described elsewhere herein in event classification for TFDR techniques. As with any particular technique used to analyze a reflective signal, the parameters are determined which characterize each event and may vary with each technique. For example, TFDR techniques may analyze a waveform in the joint time-frequency domain using parameters in the time and frequency domain in which amplitude may be a third dimension. The interface defined for this type of analysis using the parametric classification includes parameters defined accordingly.

An embodiment may also utilize other wavelet-based features to detect and characterize cable failures and other events. However, the foregoing two features were determined to perform best in one embodiment. An embodiment may include additional features such as, for example, the digital implementation of the intermittence (i.e. $I_w(s, t)$—EQUATION WV4) and the time-scale contrast (i.e. $E_w(s,t)$—EQUATION WV3)

$$E_w(s, t) = \frac{C_w(s, t)}{\int_{z=0}^{z=s} C_w(z, t)dz}$$ EQUATION WV3

$$I_w(s, t) = \frac{C_w(s, t)}{\langle C_w(s, t) \rangle_t}$$ EQUATION WV4

Another TFDR techniques utilizes the HHT technique as described, for example, in N. Huang, "A New Method for Nonlinear and Nonstationary Time Series Analysis: Empirical Mode Decomposition and Hilbert Spectral Analysis," Proceeding of SPIE, Vol. 4056, pp. 197-209, Apr. 26-28, 2000, Orlando, Fla. This HHT technique was developed mainly to analyze nonlinear and nonstationary data (e.g. seismic data). Frequency signatures of nonstationary and nonlinear signals change in time rapidly and irregularly. Classical spectral analysis techniques, such as the Fourier-based analysis, cannot deal efficiently with such data because such spectral analysis techniques are based on the assumption that the data is either linear, stationary, or both.

An embodiment using the HHT technique decomposes an input signal into a finite and often small number of intrinsic mode functions (IMFs) that reflect local properties of the signal to which the Hilbert transform (HT) is then applied. The process of data decomposition is called Empirical Mode Decomposition (EMD). The Hilbert Transform (HT) is then applied to the IMFs. Final presentation of the analysis (i.e. HT of the IMFs) is an energy-frequency-time distribution yielding instantaneous frequencies may be used to determine meaningful identifications of embedded features and wire events. Unlike typical spectral analysis approaches, where the basis functions are fixed and pre-determined, the EMD technique adaptively decomposes the signal into oscillating components.

As part of EMD, the data is decomposed without reference to a set of predetermined basic functions, such as when using, for example, the Fourier analysis. For example, the projection basis is built from a prior fixed set of basic functions, such as the case of sine waves for the Fourier analysis and wavelets for the wavelet analysis. In contrast, the EMD technique decomposes the original signal into a set of oscillatory modes called Intrinsic Mode Functions (IMF). For a function to be an IMF, the following two conditions hold true:

i) The IMF has the same numbers of zero crossings and extrema;
ii) The IMF has symmetric envelopes defined by the local maxima and minima respectively. In other words, the extrema must be symmetric with respect to the local mean.

The first condition, similar to the sine wave requirement as used with the Fourier analysis, ensures sharp frequency localization. It is similar to the narrow-band requirement for a stationary Gaussian process. The second condition ensures that the spectral analysis will not cause undesired frequency artifacts as induced by asymmetric waveforms.

Following is a pseudo-code description of one embodiment of a process for generating IMFs from the original signal x(t) representing voltages at various points in time for different time samples. This process is known as the sifting process.

1. Initialization
   a) $r_0(t) = x(t)$; Residual initialization
   b) i=1; Intrinsic Mode Function (IMF) count initialization 2. Extraction of the $i^{th}$ IMF
   a) j=0; $h_j(t) = r_i(t)$; Initialize the research of the $i^{th}$ IMF
   b) Extract the local minima and maxima of $h_j(t)$
   c) Interpolate the local extrema by a cubic spline. This step yields an upper and a lower envelopes for $h_j(t)$
   d) Compute the mean $m_j(t)$ of the envelopes
   e) $h_{j+1}(t) = h_j(t) - m_j(t)$
   f) If there is "not much" change between $h_{j+1}(t)$ and $h_j(t)$ THEN
      i) Let the $i^{th}$ IMF be $h_{j+1}(t)$; that is $IMF_i(t) = h_{j+1}(t)$
      ii) Exit step 2
      ELSE
      i) j=j+1
      ii) Go to b) of step 2

3. Residual Calculation
   a) $r_{i+1}(t) = r_i(t) - IMF_i(t)$
   b) If $r_{j+1}(t)$ has at least 2 extrema
      THEN
      i) i=i+1
      ii) Go to step 2
      ELSE
      i) j=j+1
      ii) $r_{i+1}(t)$ is the residue
      iii) Stop the decomposition One embodiment of the foregoing at step 2f) above used a condition of having the standard deviation between $h_{j+1}(t)$ and $h_j(t)$ be at least 0.3. As used in step 2f), for example, the IF-THEN condition evaluates to true if the standard deviation between $h_{j+1}(t)$ and $h_j(t)$ is not greater than a threshold value. This threshold value in one embodiment may be selected as 0.3 or greater. The foregoing threshold condition stops an iteration before divergence occurs. It was found that threshold values of 0.3 or greater exclude divergence of the algorithm for the type of data in one embodiment as described herein. Other embodiments may use other thresholds in accordance with the types of data and applications.

It should also be noted that an implementation of the foregoing may perform mathematical calculations, such as in connection with standard deviation, to account for certain conditions, such as a possible divide by zero. One embodiment may determine the standard deviation, SD, as:

$$SD = \text{sum}(((h_j(t) - h_{j+1}(t))^2)/(h_j(t)^2 + eps))$$

in which "eps" is some small epsilon value, such as 0.000001, used to avoid a divide by zero error in some instances. It should be noted that the particular value selected for eps may vary in accordance with the particular hardware and/or software and mathematical calculations included in an embodiment.

Additionally, an embodiment include other processing options, such as transformation of the frequency axis over half of the spectrum for better visualization of the graphical display of results.

The foregoing converges if the actual IMF has only two extrema (i.e. a monotonic function) or less (i.e. a constant function). In this instance, the IMF is the residue of the decomposition. The IMF represents the DC part or the trend of the original signal. If N is the total number of the intrinsic mode functions then, at the end of the foregoing EMD technique pseudo-code description, the original signal can be written as:

$$x(t) = \sum_{i=1}^{N} IMF_i(t) + r_N(t) \qquad \text{EQUATION WV5}$$

The sifting process in the EMD technique is similar to the process of dilation in the wavelet transform. Each IMF contains lower frequency oscillations than the previous one just extracted. The first set of IMFs, designated as being from 1 to K, carry the high frequency content of the signal. The last portion of IMFs, such as those designated from N–L to N, carry the low frequency content of the signal.

To illustrate the EMD technique, FIGS. 27A through 27D include graphical illustrations 1180, 1200, 1220 and 1240 of one example of a voltage signature along with its 11 intrinsic mode functions. In the foregoing, each IMF has the same number of extrema and zero crossings. Notice also that each IMF has symmetric envelopes with respect to the time line.

It should be noted that envelopes, as used herein, may be defined as curves linking local extrema (i.e. maxima or minima) of a time series, for example, such as may be represented as x(k), k=1 to N. Maxima and minima are points of the curve that satisfy d(k)=x(k+1)−x(k)=0 for the approximation of the derivative. Typically the number of maxima equals the number of minima (plus or minus 1). Depending on the nature of the first extremum (either a maximum or a minimum), maxima may be at odd indices (i.e. d(1), d(3), d(5), . . . ) and minima may be on even indices (i.e. d(2), d(4), d(6), . . . ). There are many ways in which these points may be linked together to produce the envelopes such as, for example, cubic spline interpolation.

Once the IMFs are determined, the Hilbert transform may be applied to each of the IMFs. The Hilbert transform is known by extracting instantaneous frequency components that can accommodate for data may be nonstationary and nonlinear. The Hilbert transform, Y(t), of an arbitrary time series, X(t), is given by:

$$Y(t) = \frac{1}{\pi} P \int_{-\infty}^{+\infty} \frac{X(\alpha)}{(t-\alpha)} d\alpha \qquad \text{EQUATION WV6}$$

where P is a normalizing constant. Equation WV6 defines the Hilbert transform as the convolution of the original signal X(t) with 1/t emphasizing the local properties of X(t). Now, consider the following complex signal Z(t)

$$Z(t) = X(t) + iY(t) = A(t)e^{i\theta(t)} \qquad \text{EQUATION WV7}$$

Hence, $$\begin{cases} A(t) = \sqrt{(X^2(t) + Y^2(t))} \\ \theta(t) = \arctan\left(\frac{Y(t)}{X(t)}\right) \end{cases} \qquad \text{EQUATION WV8}$$

The polar representation of the original signal X(t), as given by EQUATION WV8, indicates that this representation is the best local fit of an amplitude and phase varying function to X(t). The instantaneous frequency can be estimated as:

$$f(t) = 2\pi \frac{d\theta(t)}{dt} \qquad \text{EQUATION WV9}$$

Let the instantaneous frequency of the $i^{th}$ IMF be, $$f_i(t) = 2\pi \frac{d\theta_i(t)}{dt} \qquad \text{EQUATION WV10}$$

where $\theta_i(t)$ represents the instantaneous phase of the $i^{th}$ IMF. At a given instant t, there will be a vector of amplitudes A(t) corresponding to different frequencies of the IMFs (i.e. A(f, t)). The final result, known as the Huang-Hilbert Transform (HHT), is a time-frequency-energy distribution representing the instantaneous Hilbert spectrum energy:

$$S_H(f,t) = 20 \log(A^2(f,t)) \qquad \text{EQUATION WV11}$$

Data in connection with EQUATION WV11 above may be stored for each of the baselines of the healthy wire and different events, such as defects or faults. This stored data of known events may be compared to additional analysis data obtained in connection with an actual wire under test at a later time. The known stored data may be compared to the additional analysis data to determine the existence/non-existence of particular events using any one or more of a variety of different techniques as described herein and known in the art. For example, in addition to the classification techniques described herein, an embodiment may compare a predetermined number of points in each of the two data sets using correlation.

The foregoing HHT technique, including the EMD method, is described, for example, in S. Mallat, "*A Theory for Multiresolution Signal Decomposition. The Wavelet Representation*," IEEE Transactions on Pattern Analysis and Machine Intelligence, Vol. 11, No. 7, pp. 674-693, JULY 1989; N. Huang, "*A new Method for Nonlinear and Nonstationary Time Series Analysis: Empirical Mode Decomposition and Hilbert Spectral Analysis*," Proceeding of SPIE, Vol. 4056, pp. 197-209, 26-28, Apr. 2000, Orlando, Fla.; and Huang, N. E., et al., 1998, *"The empirical mode decomposition and the Hilbert spectrum for nonlinear and nonstationary time series analysis*," Proceedings of the Royal Society London. A, 454, pp. 903-995.

Figure 26C:
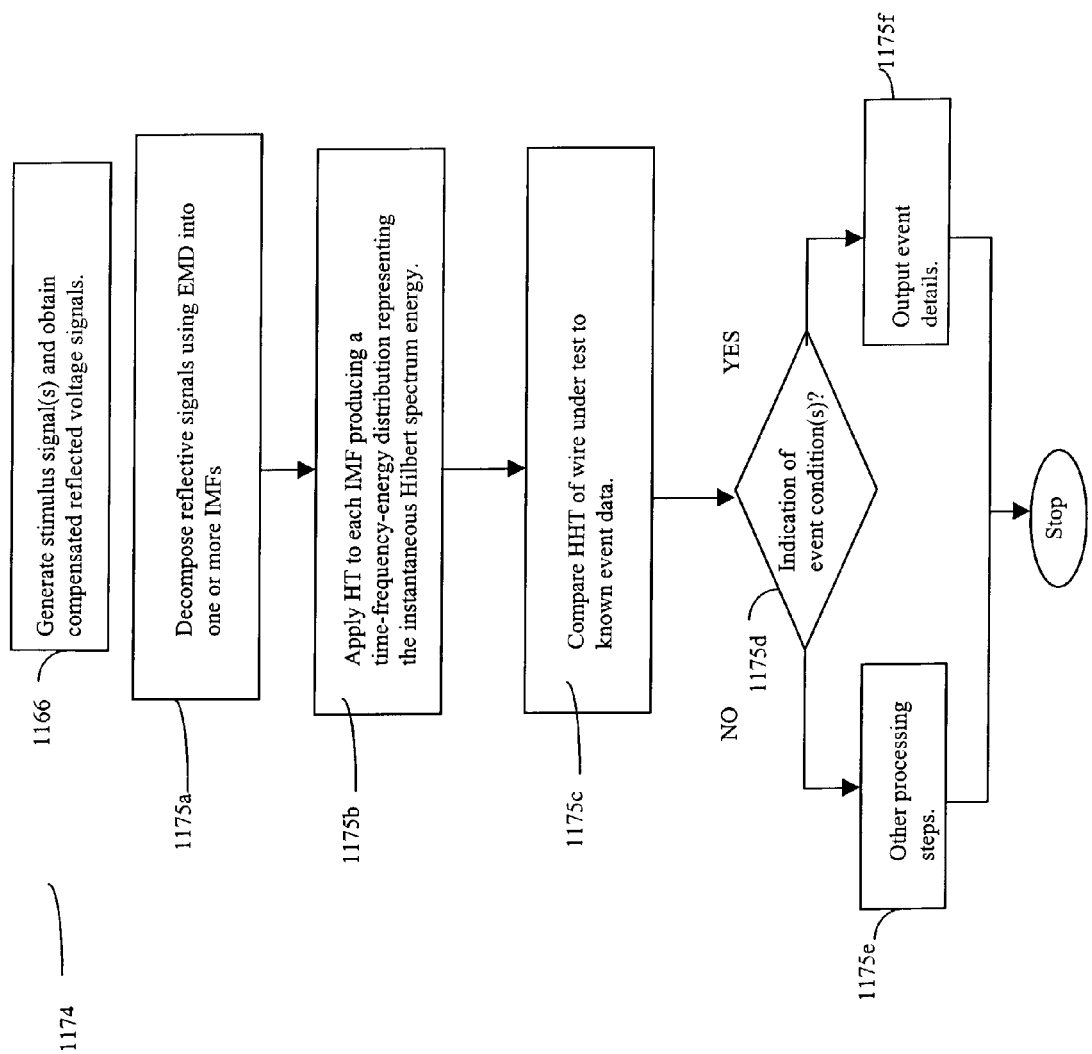
FIG. 26C is a flowchart of steps of one embodiment summarizing the HHT TFDR technique.
Figure 27A:
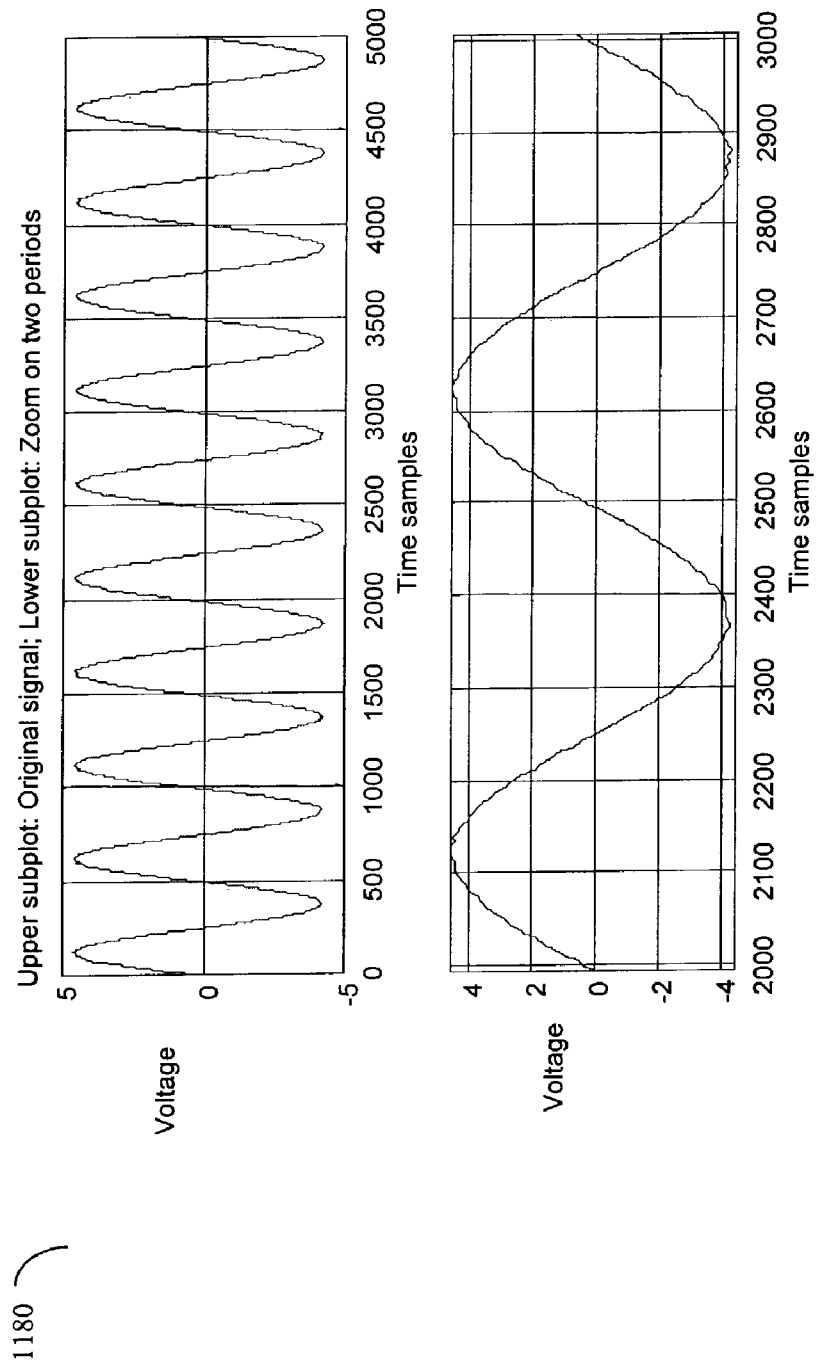
FIGS. 27A-27D are graphical illustrations of the a voltage signature and its decomposed 11 intrinsic mode functions (IMFs)
Figure 27B:
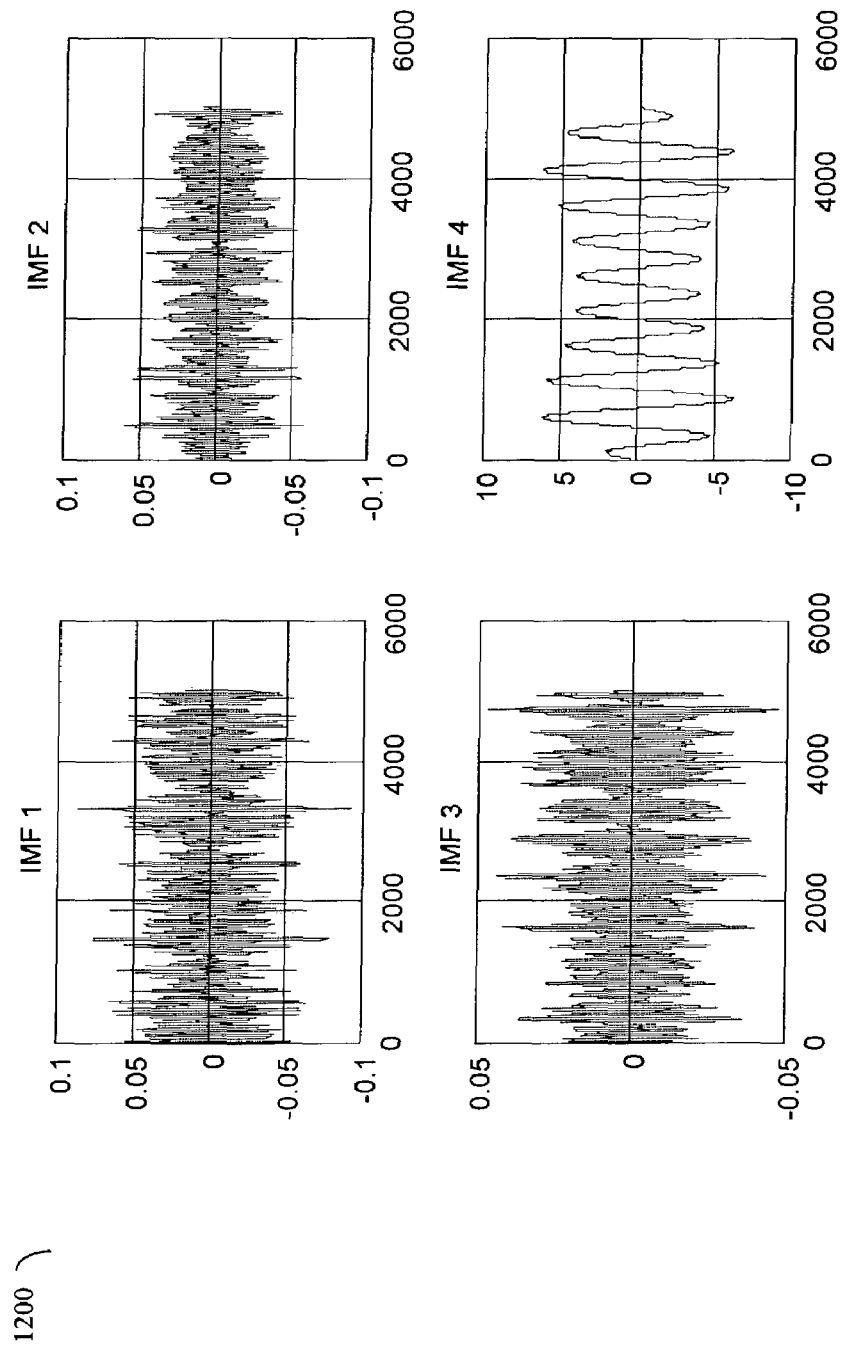
Figure 27C:
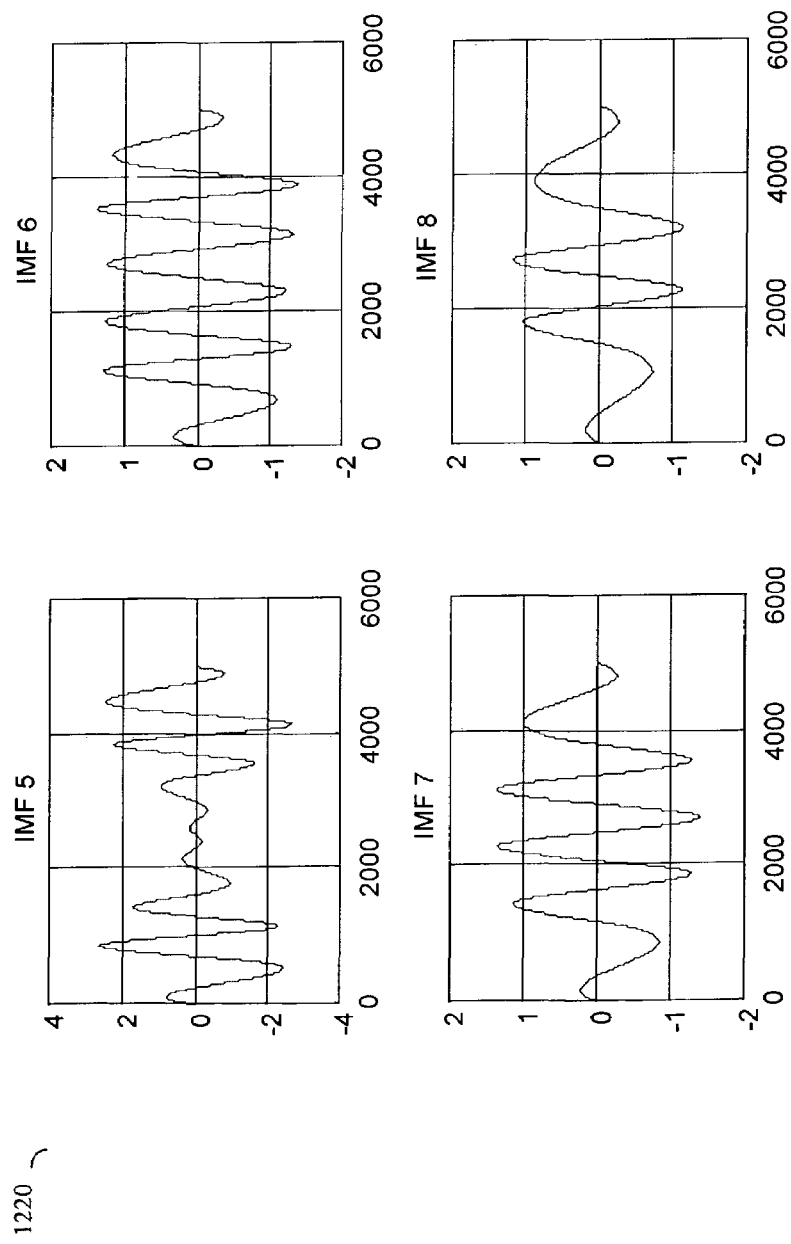
Figure 27D:
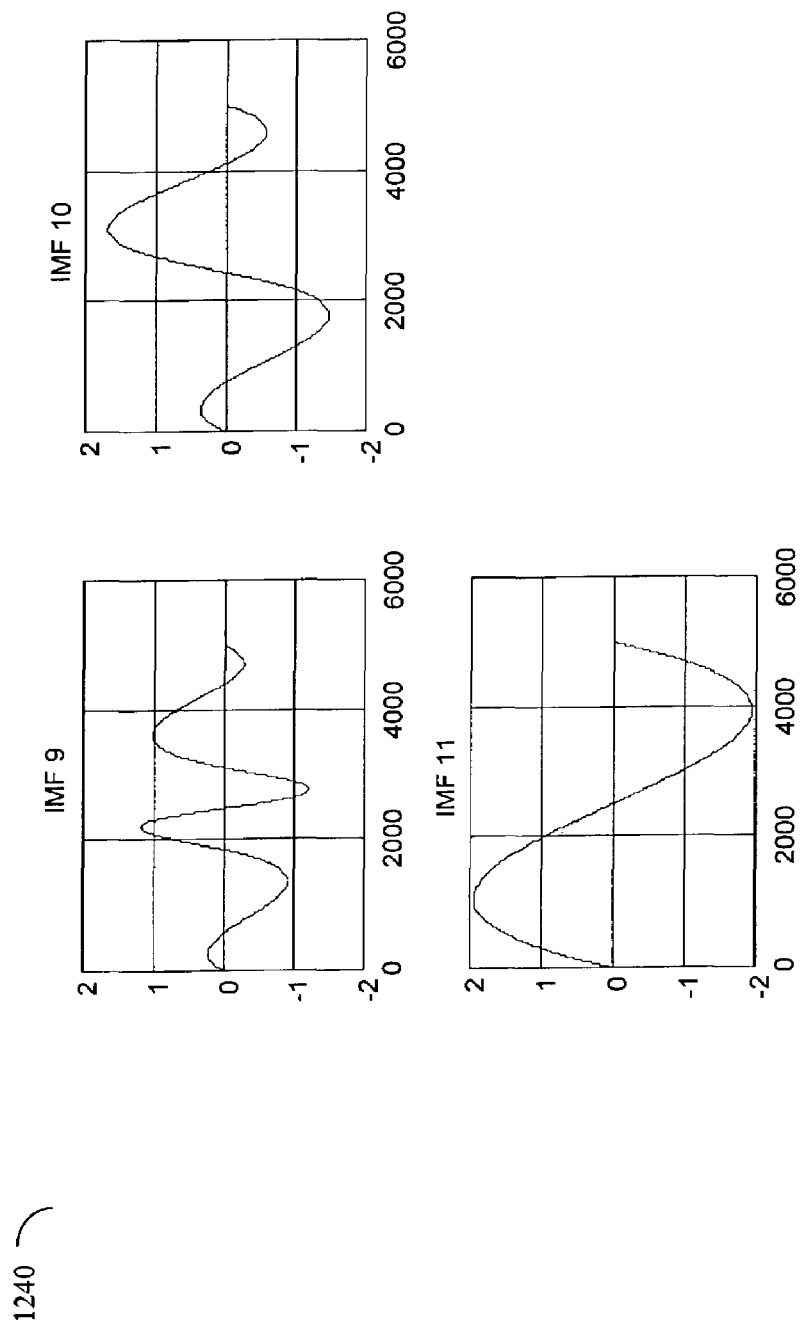

Referring now to FIG. 26C, shown is a flowchart 1174 summarizing steps of one embodiment of the HHT TFDR technique as described herein. At step 1166, the stimulus signal is generated, and the reflected voltage signals are obtained and then may be compensated. The processing of generating the stimulus signal and compensation is similar to that as described in connection with step 1166 as included in flowchart 1165. At step 1175a, the reflective voltage signals are decomposed using EMD into one or more IMFs. At step 1175b, the HT is applied to each IMF producing a time-frequency-energy distribution representing the instantaneous Hilbert spectrum energy. At step 1175c, the HHT of the wire under test is compared to the known event data. At step 1175d, a determination is made as to whether the comparison indicates an event condition. If so, control proceeds to step 1175f to output event details. Otherwise, control proceeds to step 1175e where other processing steps are performed. It should be noted that the known event data and comparison techniques that may be utilized in flowchart 1174, such as in steps 1175c, 1175d, 1175e, and 1175f, are similar to those as described in connection with flowchart 1165.

The foregoing HHT TFDR technique, as well as the wavelet technique, may use one or both of synthesized data and empirical data when determining baseline data sets associated with healthy wire conditions and other events.

What will now be described are the resulting data sets determined using the HHT technique, the classical Fourier analysis and the wavelet analysis technique also described herein. The Fourier analysis is performed by computing the FFT spectrum energy as follows:

$$S_F(f) = 20 \log(\|\Im(X(t))\|^2) \quad \text{EQUATION WV12}$$

where $\Im(X(t))$ is the Fourier transform of the signal X(t).

Figure 28A:
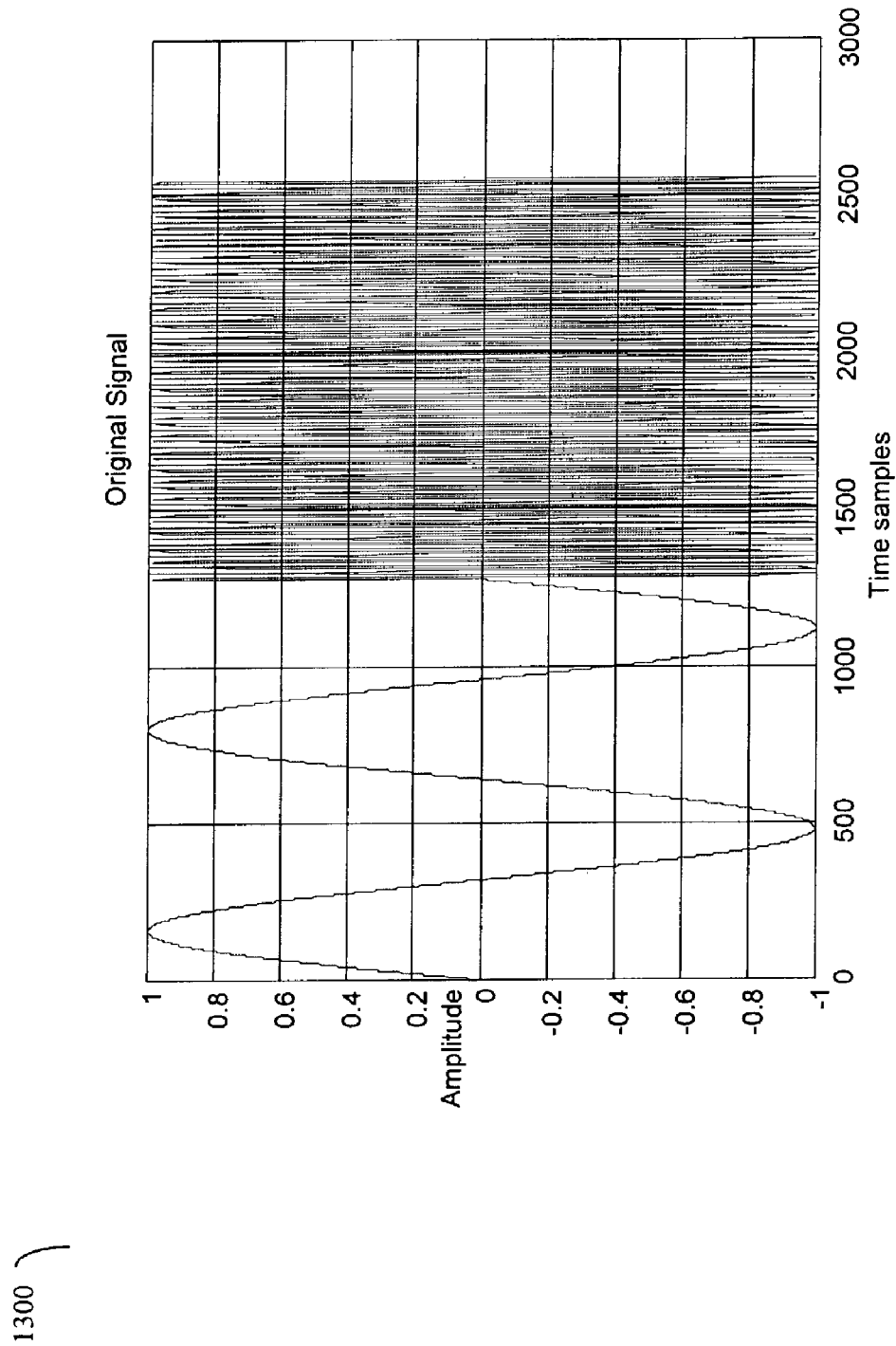
FIG. 28A is a graphical illustration of a measured reflected signal.

The wavelet-based energy spectrum is given by:

$$S_w(s,t) = 20 \log(\|W(X(t))\|^2) \quad \text{EQUATION WV13}$$

where W(X(t)) is the (Haar) wavelet transform (WT) and s is the scale variable that is inversely proportional to the frequency. As an example of the different baseline data sets and how the foregoing FFT, wavelet and HHT techniques may be used to each graphically characterize an event, consider the test signal illustrated in the graph 1300 of FIG. 28A. The graph 1300 illustrates a sine wave with a frequency switch at the middle of the time span.

Figure 28B:
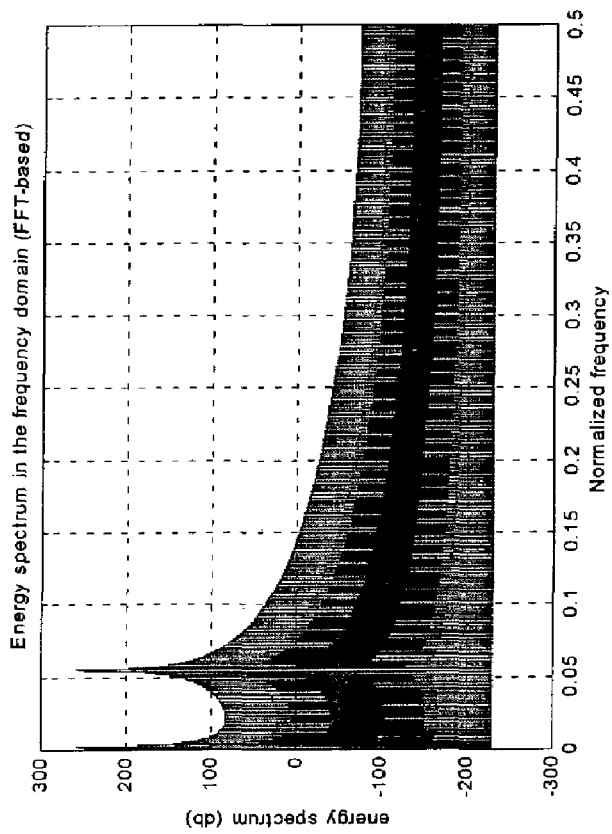
FIG. 28B is a graphical illustration of the Fourier-based spectrum using the signal from FIG. 28A.

Referring now to FIG. 28B, shown is an illustration 1320 of the Fourier based energy spectrum using the signal of 1300. The illustration 1320 shows the existence of the two harmonics that form the signal. However, the Fourier-based spectrum provides no indication at what time does the switch on frequency happened.

Figure 28C:
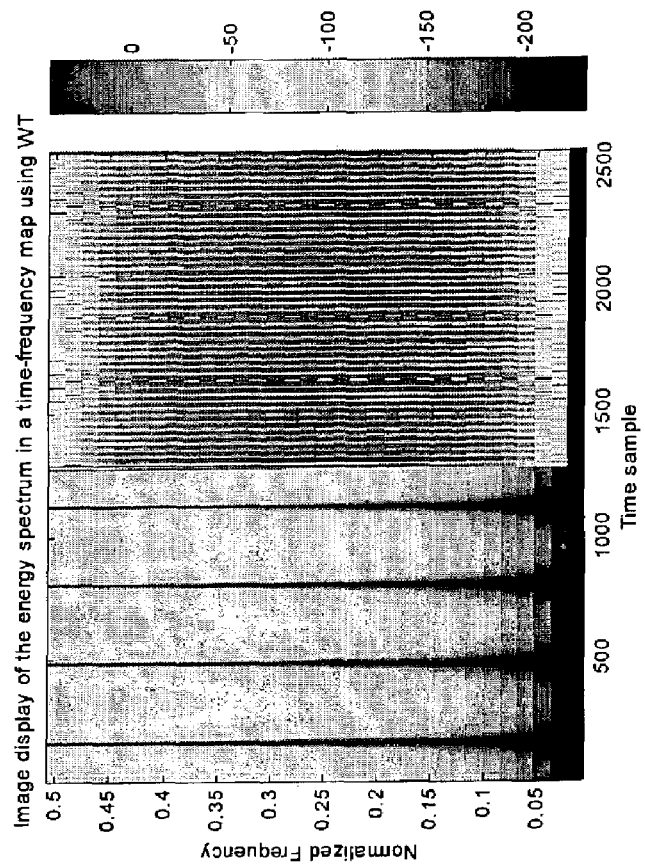
FIG. 28C is a graphical illustration of the wavelet transform using the signal from FIG. 28A.

Referring now to FIG. 28C, shown is a graphical illustration 1340 of the wavelet transform of the signal 1300. The illustration 1340 does show the time of the frequency switch, however it does not clearly identify the frequency. In fact, referring to 1340, the frequency signature is spread over the frequency axis.

Figure 28D:
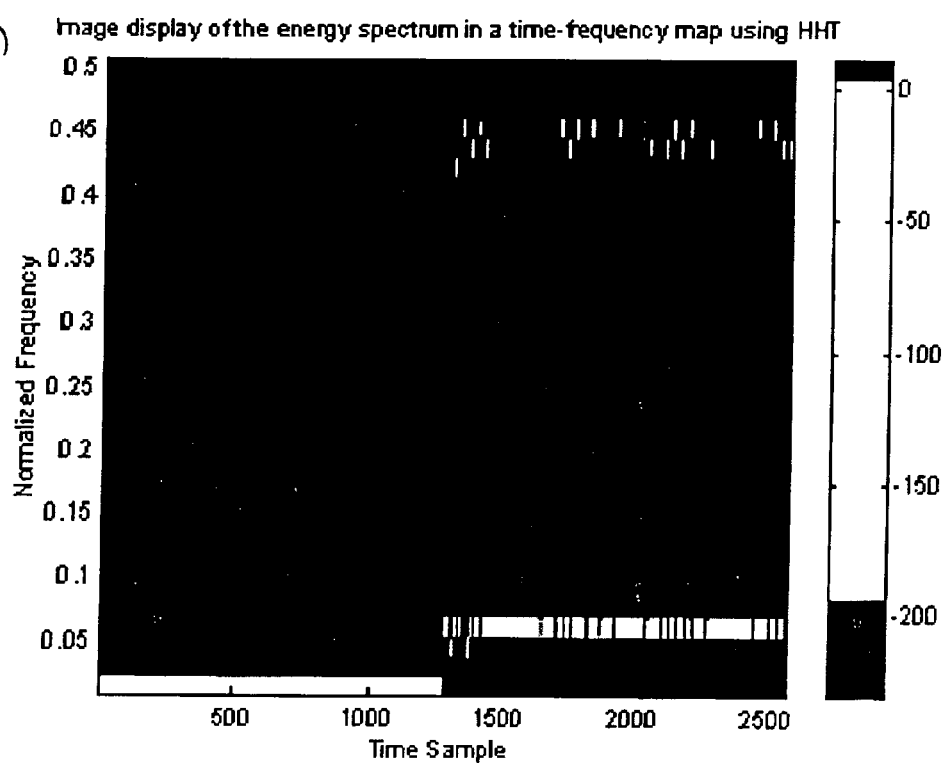
FIG. 28D is a graphical illustration of the Hilbert-Huang Transform using the signal from FIG. 28A.

Referring now to FIG. 28D, shown is a graphical illustration 1360 of the HHT providing sharp localization of the spectrum in both time and frequency. It should also be noted that the HHT may be displayed as 3-D mesh where the energy is presented versus time and frequency. As illustrated herein, in some applications, the HHT technique may provide better results and be preferred over the wavelet technique. Additionally, more that one technique may be used in connection with identifying particular types of events.

It should be noted that an embodiment may prefer to use the HHT technique and/or the wavelet technique, as well as other TFDR techniques in accordance with the type of signals being analyzed. For example, if the signal under analysis may be characterized as non-linear and non-stationary, use of the HHT technique may be preferred over the wavelet techniques described herein.

Using the TFDR techniques, such as the wavelet and HHT techniques described herein, event features, such as those related the fault size and location, may be extracted. The output of TFDR processing for a wire under test may be compared to baseline data, such as may be stored in the library 112 of FIG. 2, to perform event identification and classification.

In connection with the HHT technique, various intrinsic mode functions are generated and have their Hilbert transform computed. One embodiment may use software packages, such as the HHT Toolbox from Princeton Satellite Systems to implement the techniques described herein. Other embodiments may use other combinations of hardware and/ or software.

While the invention has been disclosed in connection with various embodiments, modifications thereon will be readily apparent to those skilled in the art. Accordingly, the spirit and scope of the invention is set forth in the following claims.

What is claimed is:

1. A method of determining an event on a wire comprising:
receiving a signal on the wire;
performing compensation processing of said signal producing a compensated signal, wherein said compensation processing includes performing attenuation compensation in accordance with a multivariate function that depends simultaneously on frequency and a length of a conductor on which said signal propagates;
performing event identification processing of said compensated signal to identify at least one event; and
classifying said at least one event using a library of circuit models, wherein, if said at least one event indicates a fault condition, said classifying includes classifying a type of fault corresponding to said at least one event, wherein said classifying includes comparing information about said compensated signal to at least one set of data representing a first type of wire defect, said at least one set of data being generated using a cable model simulating said first type of wire defect, wherein if said at least one event indicates a fault condition, providing a result regarding said fault condition including at least one of providing said result to a user display, providing said result to storage, and providing an indicator that a fault has been detected.

2. The method of claim 1, further comprising:
compensating said signal to remove unwanted reflective components due to inverse scattering producing a first adjusted signal; and
performing said attenuation compensation on said first adjusted signal.

3. The method of claim 2, further comprising:
associating event data with at least one predetermined event prior to said classifying, wherein said classifying uses said event data.

4. The method of claim 3, wherein said at least one predetermined event includes at least one of: a connector, a cut, a nick, a crimp, damage to wire insulation due to age, damage to wire insulation due to coupling of the wire with another element.

5. The method of claim 4, further comprising:
determining said event data by empirical analysis.

6. The method of claim 4, further comprising:
storing said event data in a library.

7. The method of claim 3, wherein said at least one predetermined event includes at least one of an open or a short.

8. The method of claim 2, wherein said attenuation compensation is a function of frequency and an amount of time said signal has traveled in said wire.

9. The method of claim 2, wherein said attenuation compensation is a function of frequency.

10. The method of claim 2, wherein said attenuation compensation is a function of time.

11. The method of claim 1, wherein said signal is a reflective signal and the method further comprising:
analyzing said reflective signal in accordance with at least one joint time-frequency domain reflectometry technique.

12. The method of claim 11, further comprising:
sending a signal on the wire wherein said signal is one of: an impulse signal and a predetermined wavelet.

13. The method of claim 12, further comprising:
determining at least one characteristic of said reflective signal in accordance with a predetermined wavelet; and
using said at least one characteristic in said event identification and said classifying.

14. The method of claim 1, further comprising:
determining a first derivative of said signal; and
identifying at least one peak of said first derivative exceeding a predetermined threshold as an event.

15. The method of claim 1, wherein said cable model is a circuit model of a cable.

16. The method of claim 1, further including:
processing said compensated signal using a cable model which is empirically determined using one or more measurements associated with a non-damaged cable.

17. A device that determines an event on a wire comprising:
a receiver that receives a signal on the wire; and
a processor that performs compensation processing of the signal producing a compensated signal, performs event identification processing of the compensated signal to identify at least one event, and that classifies said at least one event using a library of circuit models, wherein, if said at least one event indicates a fault condition, classifying of said at least one event includes classifying a type of fault corresponding to said at least one event, said classifying includes comparing information about said compensated signal to at least one set of data representing a first type of wire defect, said at least one set of data being generated using a cable model simulating said first type of wire defect, wherein if said at least one event indicates a fault condition, said processor provides a result regarding said fault condition including at least one of providing said result to a user display, providing said result to storage, and providing an indicator that a fault has been detected, wherein said compensation processing includes performing attenuation compensation in accordance with a multivariate function that depends simultaneously on frequency and a length of a conductor on which said signal propagates.

18. The device of claim 17, wherein said processor compensates said signal to remove unwanted reflective components due to inverse scattering producing a first adjusted signal and performs said attenuation compensation on said first adjusted signal.

19. The device of claim 18, further comprising:
a data storage element containing event data, wherein said processor associates said event data with at least one predetermined event prior to said classifying, wherein said classifying uses said event data.

20. The device of claim 19, wherein said at least one predetermined event includes at least one of: a connector, a cut, a nick, a crimp, damage to wire insulation due to age, damage to wire insulation due to coupling of the wire with another element.

21. The device of claim 20, wherein said processor determines said event data by empirical analysis.

22. The device of claim 19, wherein said at least one predetermined event includes at least one of an open or a short.

23. The device of claim 18, wherein said attenuation compensation is a function of frequency and an amount of time said signal has traveled in said wire.

24. The device of claim 18, wherein said attenuation compensation is a function of frequency.

25. The device of claim 17, wherein said signal is a reflective signal and said processor analyzes said reflective signal in accordance with at least one joint time-frequency domain reflectometry technique.

26. The device of claim 25, further comprising:
a signal generator that generates at least one of: an impulse signal and a predetermined wavelet.

27. The device of claim 26, wherein the processor determines at least one characteristic of said reflective signal in accordance with a predetermined wavelet and wherein said at least one characteristic is used in said event identification and said classifying.

28. The device of claim 17, wherein said processor determines a first derivative of said signal and identifies at least one peak of said first derivative exceeding a predetermined threshold as an event.

29. The device of claim 17, wherein said cable model is a circuit model of a cable.

30. The device of claim 17, wherein said processor processes said compensated signal using a cable model which is empirically determined using one or more measurements associated with a non-damaged cable.

31. A computer readable medium comprising code stored thereon that determines an event on a wire, the computer readable medium comprising:
executable code that receives a signal on the wire;
executable code that performs compensation processing of the signal producing a compensated signal, wherein said executable code that performs compensation processing includes executable code that performs attenuation compensation in accordance with a multivariate function that depends simultaneously on frequency and a length of a conductor on which said signal propagates;

executable code that performs event identification processing of the compensated signal to identify at least one event; and executable code that classifies said at least one event using a library of circuit models, wherein, if said at least one event indicates a fault condition, said executable code that classifies includes code that classifies a type of fault corresponding to said at least one event, wherein said executable code that classifies includes code that compares information about said compensated signal to at least one set of data representing a first type of wire defect, said at least one set of data being generated using a cable model simulating said first type of wire defect, wherein if said at least one event indicates a fault condition, providing a result regarding said fault condition including at least one of providing said result to a user display, providing said result to storage, and providing an indicator that a fault has been detected.

32. The computer readable medium of claim 31, further comprising:

executable code that compensates said signal to remove unwanted reflective components due to inverse scattering producing a first adjusted signal; and said executable code that performs attenuation compensation performs attenuation compensation on said first adjusted signal.

33. The computer readable medium of claim 32, further comprising:

executable code that associates event data with at least one predetermined event prior to classifying, wherein classifying uses said event data.

34. The computer readable medium of claim 33, wherein said at least one predetermined event includes at least one of: a connector, a cut, a nick, a crimp, damage to wire insulation due to age, damage to wire insulation due to coupling of the wire with another element.

35. The computer readable medium of claim 34, further comprising:

executable code that determines said event data by empirical analysis.

36. The computer readable medium of claim 34, further comprising:

executable code stores said event data in a library.

37. The computer readable medium of claim 33, wherein said at least one predetermined event includes at least one of an open or a short.

38. The computer readable medium of claim 31, wherein said signal is a reflective signal and computer program product is further comprising:

executable code that analyzes said reflective signal in accordance with at least one joint time-frequency domain reflectometry technique.

39. The computer readable medium of claim 38, further comprising:

executable code that sends a signal on the wire wherein said signal is one of: an impulse signal and a predetermined wavelet.

40. The computer readable medium of claim 39, further comprising:

executable code that determines at least one characteristic of said reflective signal in accordance with a predetermined wavelet; and executable code that uses said at least one characteristic in said event identification and said classifying.

41. The computer readable medium of claim 32, wherein said attenuation compensation is a function of frequency and an amount of time said signal has traveled in said wire.

42. The computer readable medium of claim 32, wherein said attenuation compensation is a function of frequency.

43. The computer readable medium of claim 32, further comprising:

executable code that determines a first derivative of said signal; and executable code that identifies at least one peak of said first derivative exceeding a predetermined threshold as an event.

44. The computer readable medium of claim 32, wherein said attenuation compensation is a function of time.

45. The computer readable medium of claim 31, wherein said cable model is a circuit model of a cable.

46. The computer readable medium of claim 28, further comprising executable code that processes said compensated signal using a cable model which is empirically determined using one or more measurements associated with a non-damaged cable.

47. A method for detecting an event on a wire comprising:

determining a plurality of polynomials, each of said polynomials fitting a portion of data points representing a received waveform, wherein said each polynomial is a localized curve fitting of said portion of data points that approximates values of the data points in the portion;

determining a first derivative for each of said plurality of polynomials;

evaluating said first derivative of each of said plurality of polynomials at data points representing said received waveform;

detecting an event using said first derivative of each of said plurality of polynomials; and providing a result regarding said event, said providing including at least one of providing said result to a user display, providing said result to storage, and providing an indicator regarding said result.

48. The method of claim 47, further comprising:
determining an event detection threshold.

49. The method of claim 48, further comprising:
determining at least one peak using said first derivatives that exceeds said event detection threshold;
storing data corresponding to said at least one peak; and
classifying said data as one of a plurality of events.

50. The method of claim 47, further comprising:
compensating said received waveform prior to said determining a plurality of polynomials.

51. The method of claim 47, wherein the event is one of: a connector, a cut, a nick, a crimp, damage to wire insulation due to age, damage to wire insulation due to coupling of the wire with another element.

52. The method of claim 47, further comprising:
storing data of said waveform in accordance with said event detected.

53. The method of claim 47, further comprising:
classifying said event.

54. The method of claim 47, wherein the event includes at least one of an open or a short.

55. A computer readable medium comprising code stored thereon for detecting an event on a wire, the computer readable medium comprising:

executable code that determines a plurality of polynomials, each of said polynomials fitting a portion of data points representing a received waveform, wherein said each polynomial is a localized curve fitting of said portion of data points that approximates values of the data points in the portion;

executable code that determines a first derivative for each of said plurality of polynomials;

executable code that evaluates said first derivative of each of said plurality of polynomials at data points representing said received waveform;

executable code that detects an event using said first derivative of each of said plurality of polynomials; and executable code that provides a result regarding said event including at least one of providing said result to a user display, providing said result to storage, and providing an indicator that a fault has been detected.

56. The computer readable medium of claim 55, further comprising:

executable code that determines an event detection threshold.

57. The computer readable medium of claim 56, further comprising:

executable code that determines at least one peak using said first derivatives evaluated that exceed said event detection threshold;

executable code that stores data corresponding to said at least one peak; and executable code that classifies said data as one of a plurality of events.

58. The computer readable medium of claim 55, further comprising:

executable code that compensates said received waveform prior to said determining a plurality of polynomials.

59. The computer readable medium of claim 55, wherein the event is one of: a connector, a cut, a nick, a crimp, damage to wire insulation due to age, damage to wire insulation due to coupling of the wire with another element.

60. The computer readable medium of claim 55, further comprising:

executable code that stores data of said waveform in accordance with said event detected.

61. The computer readable medium of claim 55, further comprising:

executable code that classifies said event.

62. The computer readable medium of claim 55, wherein the event includes at least one of an open or a short.

63. A method of processing a signal received on a wire comprising:

receiving said signal;

compensating said signal to remove unwanted reflections caused by a defect in said wire producing a compensated signal;

analyzing said compensated signal to determine information about said defect;

receiving a plurality of reflective voltages and a plurality of incident voltages, wherein at a measured voltage at a time is equal to a sum of a reflective voltage and an incident voltage at a the time; and adjusting each of said plurality of reflective voltages and said plurality of incident voltages determined at a point to remove unwanted reflections from the point to the end of the wire, wherein there are N incident voltages and N corresponding reflective voltages, and the method further comprising:

initializing a first row of an N×N matrix, D, with said N incident voltages;

initializing a first row of an N×N matrix, U, with said N reflective voltages;

determining reflection coefficients corresponding to said N incident and N reflective voltages;

determining transmission coefficients corresponding to said reflection coefficients;

for each element of row ii of matrix D, ii=2 to N, determining $D(ii,jj)=(D(i,j)-r(ii)*U(i,jj))/s(ii)$, where i=1 to N−1, j=i to N−1, jj=j+1, s(ii) is a transmission coefficient at time ii, r(ii) is a reflection coefficient at a time ii; and for each element of row ii of matrix U, determining $U(ii,jj)=(-r(ii)*D(i,j)+U(i,jj))/s(ii)$, wherein diagonals of matrix D, D[t,t], t=1 to N, are N adjusted incident voltages at each time t, Vinc,adj(t).

64. The method of claim 63, further comprising:

determining adjusted reflective voltages at each time t, Vrefl,adj (t), as:

$$V\text{refl,adj}(t)=(Z(t+1)-Z_0)/(Z_0+Z(t+1))*V\text{inc,adj}(t)+V\text{inc,adj}(t),$$

where $Z_0$ is a characteristic impedance of the wire, $Z(t+1)=Z(t)*(1+r(t))/(1-r(t))$.

65. The method of claim 64, further comprising:

performing error correction by assigning each of said reflection coefficients to zero if said each reflection coefficient is less than a predetermined threshold.

66. The method of claim 65, wherein said predetermined threshold is a value equal to a product of three times a standard deviation of a noise level.

67. A computer readable medium comprising code stored thereon that processes a signal received on a wire, the computer readable medium comprising:

executable code that receives said signal;

executable code that compensates said signal to remove unwanted reflections caused by a defect in said wire producing a compensated signal; and executable code that analyzes said compensated signal to determine information about said defect;

executable code that receives a plurality of reflective voltages and a plurality of incident voltages, wherein at a measured voltage at a time is equal to a sum of a reflective voltage and an incident voltage at a the time; and executable code that adjusts each of said plurality of reflective voltages and said plurality of incident voltages determined at a point to remove unwanted reflections from the point to the end of the wire, wherein there are N incident voltages and N corresponding reflective voltages, and the computer program product further comprising:

executable code that initializes a first row of an N×N matrix, D, with said N incident voltages;

executable code that initializes a first row of an N×N matrix, U, with said N reflective voltages;

executable code that determines reflection coefficients corresponding to said N incident and N reflective voltages;

executable code that determines transmission coefficients corresponding to said reflection coefficients;

executable code that, for each element of row ii of matrix D, ii=2 to N, determines $D(ii,jj)=(D(i,j)-r(ii)*U(i,jj))/s(ii)$, where i=1 to N−1, j=i to N−1, jj=j+1, s(ii) is a transmission coefficient at time ii, r(ii) is a reflection coefficient at a time ii; and executable code that, for each element of row ii of matrix U, determines $U(ii,jj)=(-r(ii)*D(i,j)+U(i,jj))/s(ii)$, wherein diagonals of matrix D, D[t,t], t=1 to N, are N adjusted incident voltages at each time t, Vinc,adj(t).

68. The computer readable medium of claim 67, further comprising:

executable code that determines adjusted reflective voltages at each time t, Vrefl,adj(t), as:

$$V\text{refl,adj}(t)=(Z(t+1)-Z_0)/(Z_0+Z(t+1))*V\text{inc,adj}(t)+V\text{inc,adj}(t),$$

where $Z_0$ is a characteristic impedance of the wire, $Z(t+1)=Z(t)*(1+r(t))/(1-r(t))$.

69. The computer readable medium of claim 68, further comprising:
   executable code that performs error correction by assigning each of said reflection coefficients to zero if said each reflection coefficient is less than a predetermined threshold.

70. The computer readable medium of claim 69, wherein said predetermined threshold is a value equal to a product of three times a standard deviation of a noise level.

71. A method of detecting events on a wire comprising:
   determining at least one set of reference data indicating a wire event;
   sending an impulse signal on the wire;
   obtaining a reflective return signal corresponding to said impulse signal;
   analyzing said reflective signal in accordance with at least one joint time-frequency domain reflectometry technique;
   determining at least one characteristic of said reflective signal in accordance with a predetermined wavelet;
   performing wavelet analysis using a continuous wavelet transform;
   determining ρ as a feature of said reflective signal wherein p is a differential wavelet energy ratio ρ proportional to the deviation of a signature energy with respect to a baseline of said wire in a healthy condition for a given time-frequency span; and
   providing a result regarding said reflective signal including at least one of providing said result to a user display, providing said result to storage, and providing an indicator of said result.

72. The method of claim 71, wherein ρ is represented as:

$$\rho = \sqrt{\frac{\sum_{k=1}^{N}\sum_{s=1}^{S}|C_{sk} - C_{sk}^{Baseline}|^2}{\sum_{k=1}^{N}\sum_{s=1}^{S}|C_{sk}^{Baseline}|^2}}$$

in which:
   $C_{sk}$ represents continuous wavelet coefficients of a signal under test collected over a time-span of N samples and a time-scale span of S scales, wherein said scales are parameters used in performing said wavelet analysis; and
   $C_{sk}^{Baseline}$ represents a set of wavelet coefficients of a baseline signal associated with a healthy signature.

73. The method of claim 72, further comprising:
   determining δ as a feature of said reflective signal, wherein δ is a local wavelet energy ratio of a signature of interest with respect to a baseline of a healthy signature, said local nature of said signatures relating to a partial derivative of signal energy with respect to a time-scale corresponding to an inverse frequency of said signal energy.

74. The method of claim 73, wherein δ is represented as:

$$\delta = \sqrt{\frac{\sum_{k=1}^{N}\sum_{s=1}^{S}\left|\frac{\partial C_{sk}}{\partial s} - \frac{\partial C_{sk}^{Baseline}}{\partial s}\right|^2}{\sum_{k=1}^{N}\sum_{s=1}^{S}\left|\frac{\partial C_{sk}^{Baseline}}{\partial s}\right|^2}}$$

in which ∂ represents a partial derivative.

75. The method of claim 71, wherein increasing values of ρ, are associated with increasing severity of wire events detected.

76. A method for creating a classification library for classifying defects in connection with cable analysis, comprising:
   generating a reflection waveform pattern of an event;
   processing said reflection waveform pattern to produce a classification reflection waveform pattern;
   storing said classification reflection waveform pattern in said classification library, said classification library including classification reflection waveform patterns corresponding to different types of possible fault conditions, wherein said classification library includes at least one set of data representing a first type of wire defect, said at least one set of data being generated using a cable model simulating said first type of wire defect.

77. The method of claim 76, wherein said event is selected from the group consisting of: a fault, a connector, and a termination.

78. The method of claim 76, wherein generating a reflection waveform pattern includes:
   creating a specified type of fault in a cable of a specified type;
   producing a voltage waveform signal in said cable;
   identifying a reflected voltage waveform signal portion for said specified type of fault; and
   converting said reflected voltage waveform signal portion into a reflection waveform pattern.

79. The method of claim 76, wherein said model is an analytical model, and generating a reflection waveform pattern includes:
   simulating said event utilizing said analytical model; and
   generating a reflection waveform pattern from said analytical model.

80. A computer readable medium comprising code stored thereon that creates a classification library for classifying defects in connection with cable analysis, the computer readable medium comprising:
   executable code that generates a reflection waveform pattern of an event;
   executable code that processes said reflection waveform pattern to produce a classification reflection waveform pattern; and
   executable code that stores said classification reflection waveform pattern in said classification library, said classification library including classification reflection waveform patterns corresponding to different types of possible fault conditions, wherein said classification library includes at least one set of data representing a first type of wire defect, said at least one set of data being generated using a cable model simulating said first type of wire defect.

81. The computer readable medium of claim 80, wherein said event is selected from the group consisting of: a fault, a connector, and a termination.

82. The computer readable medium of claim , wherein said executable code that generates a reflection waveform pattern of an event, includes:
   executable code that produces a voltage waveform signal in said cable;
   executable code that identifies a reflected voltage waveform signal portion for a specified type of fault;
   executable code that converts said reflected voltage waveform signal portion into a reflection waveform pattern.

83. The computer readable medium of claim 80, wherein said model is an analytical model and said executable code that generates a reflection waveform pattern of an event, includes:
   executable code that simulates said event utilizing said analytical model; and
   executable code that generates a reflection waveform pattern from said analytical model.

84. A method for creating a classification library for cable analysis, comprising:
   generating a reflection waveform pattern of an event, wherein generating a reflection waveform pattern includes:
      creating a specified type of fault in a cable of a specified type;
      producing a voltage waveform signal in said cable;
      identifying a reflected voltage waveform signal portion for said specified type of fault; and
      converting said reflected voltage waveform signal portion into a reflection waveform pattern;
   processing said reflection waveform pattern to produce a classification reflection waveform pattern;
   storing said classification reflection waveform pattern;
   providing a plurality of voltage waveform signals;
   calculating a mean value reflection waveform pattern from at least two normalized and corrected reflection waveform patterns;
   calculating a variance array that includes variance information of said least two normalized reflection waveform patterns compared with said mean value reflection waveform pattern; and
   storing said variance array so as to be accessible with said classification reflection waveform pattern.

85. The method of claim 84, further comprising:
   generating a covariance matrix using information in said variance array;
   storing said covariance matrix so as to be accessible with said classification reflection waveform pattern.

86. A computer readable medium comprising code stored thereon that creates a classification library for cable analysis, comprising:
   executable code that generates a reflection waveform pattern of an event, wherein said executable code that generates a reflection waveform pattern of an event, includes:
      executable code that produces a voltage waveform signal in said cable;
      executable code that identifies a reflected voltage waveform signal portion for a specified type of fault; and
      executable code that converts said reflected voltage waveform signal portion into a reflection waveform pattern;
   executable code that processes said reflection waveform pattern to produce a classification reflection waveform pattern;
   executable code that stores said classification reflection waveform pattern;
   executable code that calculates a mean value reflection waveform pattern from at least two normalized and corrected reflection waveform patterns;
   executable code that calculates a variance array that includes variance information of said least two normalized reflection waveform patterns compared with said mean value reflection waveform pattern; and
   executable code that stores said variance array so as to be accessible with said classification reflection waveform pattern.

87. The computer readable medium of claim 86, further comprising:
   executable code that generates a covariance matrix using information in said variance array; and
   executable code that stores said covariance matrix so as to be accessible with said classification reflection waveform pattern.

88. A method for detecting an event on a wire comprising:
   determining a plurality of polynomials, each of said polynomials fitting a portion of data points representing a received waveform;
   determining a first derivative for each of said plurality of polynomials;
   evaluating said first derivative of each of said plurality of polynomials at data points representing said received waveform; and
   detecting an event using said first derivative of each of said plurality of polynomials, wherein said portion of data points has N+M+1 data points, N representing a number of data points prior to a first one of said data points included in said portion, M representing a number of data points after said first one of said data points included in said portion, and the method further comprising:
   determining a first of said plurality of polynomials in accordance with said N+M+1 data points; and
   providing a result regarding said event including at least one of providing said result to a user display, providing said result to storage, and providing an indicator of said result.

89. The method of claim 88, further comprising:
   determining a first derivative of said first polynomial; and
   evaluating said first derivative at said first one of said data points included in said portion.

90. A computer readable medium comprising code stored thereon for detecting an event on a wire, the computer readable medium comprising:
   executable code that determines a plurality of polynomials, each of said polynomials fitting a portion of data points representing a received waveform;
   executable code that determines a first derivative for each of said plurality of polynomials;
   executable code that evaluates said first derivative of each of said plurality of polynomials at data points representing said received waveform; and
   executable code that detects an event using said first derivative of each of said plurality of polynomials, wherein said portion of data points has N+M+1 data points, N representing a number of data points prior to a first one of said data points included in said portion, M representing a number of data points after said first one of said data points included in said portion, and the computer readable medium further comprising:
   executable code that determines a first of said plurality of polynomials in accordance with said N+M+1 data points; and
   executable code that provides a result regarding said event including at least one of providing said result to a user display, providing said result to storage, and providing an indicator of said result.

91. The computer readable medium of claim 90, further comprising:
   executable code that determines a first derivative of said first polynomial; and
   executable code that evaluates said first derivative at said first one of said data points included in said portion.

92. A method of determining an event on a wire comprising:
- receiving a signal on the wire;
- performing compensation processing of said signal producing a compensated signal;
- performing event identification processing of said compensated signal to identify at least one event;
- classifying said at least one event;
- determining a plurality of polynomials, each of said polynomials locally fitted to a portion of data points defining a portion of said signal, each of said portion of data points being including a kernel point;
- determining a plurality of first derivatives of said plurality of polynomials;
- evaluating each of said plurality of first derivatives at a corresponding kernel point producing a plurality of evaluated first derivatives;
- determining said at least one event using said plurality of evaluated first derivatives; and
- providing a result regarding said at least one event including at least one of providing said result to a user display, providing said result to storage, and providing an indicator regarding said result.

93. A computer readable medium comprising code stored thereon that determines an event on a wire, the computer readable medium comprising:
- executable code that receives a signal on the wire;
- executable code that performs compensation processing of the signal producing a compensated signal;
- executable code that performs event identification processing of the compensated signal to identify at least one event;
- executable code that classifies said at least one event;
- executable code that determines a plurality of polynomials, each of said polynomials locally fitted to a portion of data points defining a portion of said signal, each of said portion of data points being including a kernel point;
- executable code that determines a plurality of first derivatives of said plurality of polynomials;
- executable code that evaluates each of said plurality of first derivatives at a corresponding kernel point producing a plurality of evaluated first derivatives;
- executable code that determines said at least one event using said plurality of evaluated first derivatives; and
- executable code that provides a result regarding said at least one event including at least one of providing said result to a user display, providing said result to storage, and providing an indicator of said result.

94. A device that determines an event on a wire comprising:
a receiver that receives a signal on the wire; and
a processor that performs compensation processing of the signal producing a compensated signal, performs event identification processing of the compensated signal to identify at least one event, and that classifies said at least one event, wherein said processor determines a plurality of polynomials, each of said polynomials locally fitted to a portion of data points defining a portion of said signal, each of said portion of data points being including a kernel point, said processor determines a plurality of first derivatives of said plurality of polynomials, said processor evaluates each of said plurality of first derivatives at a corresponding kernel point producing a plurality of evaluated first derivatives, and said processor determines said at least one event using said plurality of evaluated first derivatives, wherein said processor provides a result regarding said at least one event including at least one of providing said result to a user display, providing said result to storage, and providing an indicator of said result.

95. A method for creating a classification library for cable analysis, comprising:
- generating a reflection waveform pattern of an event;
- processing said reflection waveform pattern to produce a classification reflection waveform pattern; and
- storing said classification reflection waveform pattern, wherein processing said reflection waveform pattern includes normalizing and correcting said reflection waveform pattern to produce said classification reflection waveform pattern.

96. A method for creating a classification library for cable analysis, comprising:
- generating a reflection waveform pattern of an event, wherein generating a reflection waveform pattern includes:
  - simulating said event utilizing an analytical model; and
  - generating a reflection waveform pattern from said analytical model;
- processing said reflection waveform pattern to produce a classification reflection waveform pattern;
- storing said classification reflection waveform pattern;
- adjusting component values of said analytical model prior to resimulating said event utilizing an analytical model and regenerating a reflection waveform pattern from said analytical model;
- generating a variance array corresponding to the adjustment of said component values in said analytical model;
- storing said variance array so as to be accessible with said classification reflection waveform pattern.

97. A computer readable medium comprising code stored thereon that creates a classification library for cable analysis, the computer readable medium comprising:
- executable code that generates a reflection waveform pattern of an event;
- executable code that processes said reflection waveform pattern to produce a classification reflection waveform pattern; and
- executable code that stores said classification reflection waveform pattern, wherein said executable code that processes said reflection waveform pattern to produce a classification reflection waveform pattern includes executable code that normalizes and corrects said reflection waveform pattern to produce said classification reflection waveform pattern.

98. A computer readable medium that creates a classification library for cable analysis, comprising:
- executable code that generates a reflection waveform pattern of an event, wherein said executable code that generates a reflection waveform pattern of an event, includes:
  - executable code that simulates said event utilizing an analytical model; and
  - executable code that generates a reflection waveform pattern from said analytical model;
- executable code that processes said reflection waveform pattern to produce a classification reflection waveform pattern; and
- executable code that stores said classification reflection waveform pattern;
- executable code that adjusts component values of said analytical model;
- executable code that generates a variance array corresponding to the adjustment of said component values in said analytical model; and
- executable code that stores said variance array so as to be accessible with said classification reflection waveform pattern.

* * * * *

UNITED STATES PATENT AND TRADEMARK OFFICE
CERTIFICATE OF CORRECTION

PATENT NO. : 7,512,503 B2  
APPLICATION NO. : 10/435926  
DATED : March 31, 2009  
INVENTOR(S) : Eric Robert Bechhoefer and Mokhtar Sadok Page 1 of 1

It is certified that error appears in the above-identified patent and that said Letters Patent is hereby corrected as shown below:

Column 58, line 17, "claim 28" should read --claim 31--.

Column 62, line 58, Claim 82, "claim" should read --claim 80--.

Signed and Sealed this

Fourth Day of January, 2011

David J. Kappos
*Director of the United States Patent and Trademark Office*